US008956984B2

(12) United States Patent
Okuda

(10) Patent No.: US 8,956,984 B2
(45) Date of Patent: *Feb. 17, 2015

(54) METHOD OF MANUFACTURING SEMICONDUCTOR DEVICE, METHOD OF PROCESSING SUBSTRATE, SUBSTRATE PROCESSING APPARATUS, AND NON-TRANSITORY COMPUTER-READABLE RECORDING MEDIUM

(71) Applicant: Hitachi Kokusai Electric Inc., Tokyo (JP)

(72) Inventor: Kazuyuki Okuda, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/647,908

(22) Filed: Oct. 9, 2012

(65) Prior Publication Data

US 2013/0171838 A1   Jul. 4, 2013

(30) Foreign Application Priority Data

Oct. 7, 2011   (JP) ................................. 2011-223134
Aug. 20, 2012   (JP) ................................. 2012-181859

(51) Int. Cl.
*H01L 21/31*   (2006.01)
*H01L 21/469*   (2006.01)
(Continued)

(52) U.S. Cl.
CPC ...... *H01L 21/02107* (2013.01); *H01L 21/6715* (2013.01); *C23C 16/34* (2013.01); *C23C 16/345* (2013.01); *C23C 16/45542* (2013.01); *H01L 21/0217* (2013.01); *H01L 21/02274* (2013.01); *H01L 21/0228* (2013.01)

USPC ........................... 438/791; 438/792; 427/579

(58) Field of Classification Search
USPC .................. 438/791, 792; 427/255.5, 255.38, 427/255.394, 579
See application file for complete search history.

(56) References Cited

U.S. PATENT DOCUMENTS

2004/0082171 A1 * 4/2004 Shin et al. ..................... 438/689
2006/0216418 A1 * 9/2006 Matsuura .................. 427/248.1
(Continued)

FOREIGN PATENT DOCUMENTS

CN   101981225 A   2/2011
JP   A-2006-41337   2/2006
(Continued)

OTHER PUBLICATIONS

Oct. 28, 2013 Office Action issued in Korean Application No. 10-2012-0105745 (with translation).
(Continued)

*Primary Examiner* — Mary Wilczewski
*Assistant Examiner* — Erik T Peterson
(74) *Attorney, Agent, or Firm* — Oliff PLC

(57) ABSTRACT

Provided is a method of manufacturing a semiconductor device capable of forming a nitride layer having high resistance to hydrogen fluoride at low temperatures. The method includes forming a nitride film on a substrate by performing a cycle a predetermined number of times, the cycle including supplying a source gas to the substrate, supplying a plasma-excited hydrogen-containing gas to the substrate, supplying a plasma-excited or thermally excited nitriding gas to the substrate, and supplying at least one of a plasma-excited nitrogen gas and a plasma-excited rare gas to the substrate.

19 Claims, 30 Drawing Sheets

(51) Int. Cl.
*H05H 1/24* (2006.01)
*H01L 21/02* (2006.01)
*H01L 21/67* (2006.01)
*C23C 16/34* (2006.01)
*C23C 16/455* (2006.01)

(56) References Cited

U.S. PATENT DOCUMENTS

| | | |
|---|---|---|
| 2008/0274605 A1 | 11/2008 | Hoshi et al. |
| 2009/0159430 A1 | 6/2009 | Gonohe et al. |
| 2009/0170345 A1* | 7/2009 | Akae et al. ............. 438/786 |
| 2010/0186898 A1 | 7/2010 | Fukushima et al. |
| 2010/0233887 A1 | 9/2010 | Miya et al. |
| 2010/0300357 A1* | 12/2010 | Yamamoto et al. ....... 118/723 E |
| 2011/0129619 A1 | 6/2011 | Matsunaga et al. |
| 2012/0100722 A1* | 4/2012 | Asai et al. ............... 438/758 |
| 2012/0220137 A1* | 8/2012 | Ota et al. ................. 438/765 |

FOREIGN PATENT DOCUMENTS

| | | |
|---|---|---|
| JP | A-2006-241521 | 9/2006 |
| JP | A-2010-226084 | 10/2010 |
| JP | A-2011-9699 | 1/2011 |
| JP | A-2011-61037 | 3/2011 |
| KR | 10-2006-0103871 | 10/2006 |
| TW | 200414317 | 8/2004 |
| TW | 201120956 A1 | 6/2011 |
| WO | WO 2006/088062 A1 | 8/2006 |
| WO | WO 2009/149167 A2 | 12/2009 |

OTHER PUBLICATIONS

Jul. 4, 2014 Notification of First Office Action issued in Taiwanese Patent Application No. 101132696 (English translation only).

\* cited by examiner

FIG. 15A

SAMPLE 1 (EXAMPLE)

| DCS | PURGE | Ar* | NH₃* | PURGE |

SAMPLE 2 (EXAMPLE)

| DCS | PURGE | NH₃* | PURGE | Ar* |

SAMPLE 3 (COMPARATIVE EXAMPLE)

| DCS | PURGE | NH₃* | PURGE |

FIG. 16A

SAMPLE 4~7 (EXAMPLE)

| DCS | PURGE | Ar* | NH₃* | PURGE |

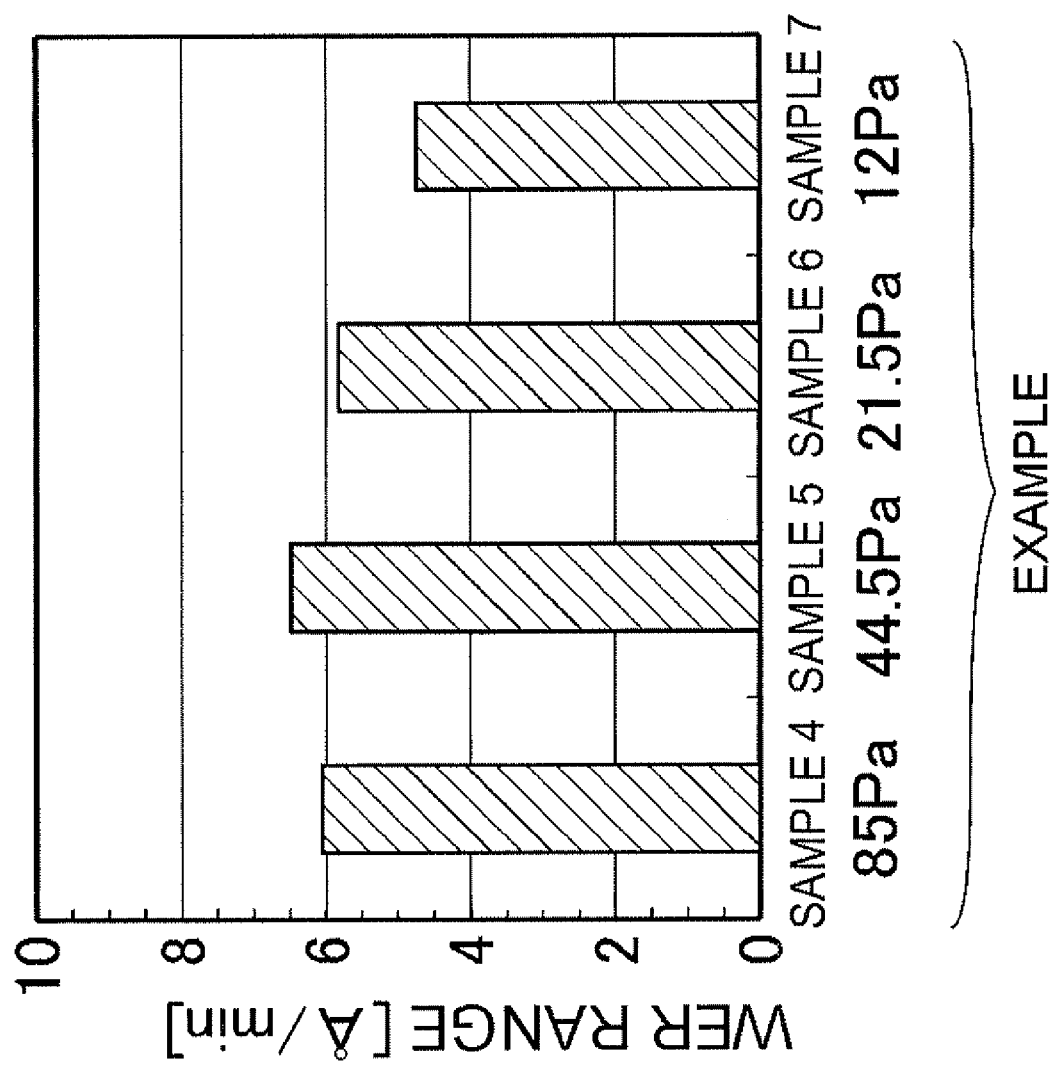

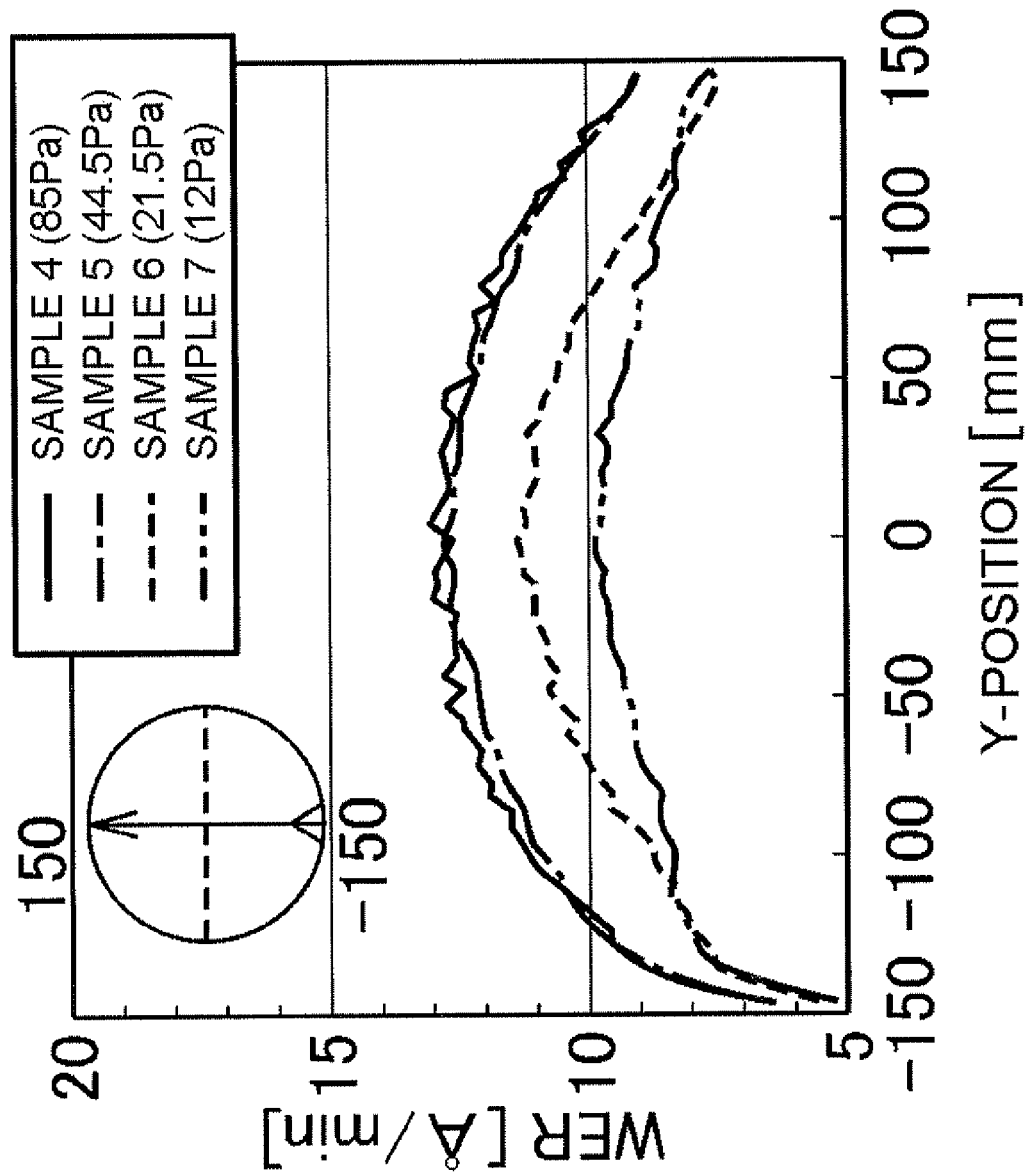

FIG. 18A

SAMPLE 1 (EXAMPLE)

| DCS | PURGE | Ar* | NH₃* | PURGE |
|---|---|---|---|---|

SAMPLE 2 (EXAMPLE)

| DCS | PURGE | Ar* | NH₃* | PURGE | Ar* |
|---|---|---|---|---|---|

SAMPLE 3 (EXAMPLE)

| DCS | PURGE | H₂* | NH₃* | PURGE | H₂* |
|---|---|---|---|---|---|

SAMPLE 4 (EXAMPLE)

| DCS | PURGE | N₂* | NH₃* | PURGE | N₂* |
|---|---|---|---|---|---|

SAMPLE 5 (EXAMPLE)

| DCS | PURGE | H₂* | NH₃* | PURGE | N₂* |
|---|---|---|---|---|---|

SAMPLE 6 (EXAMPLE)

| DCS | PURGE | NH₃* | PURGE |
|---|---|---|---|

FIG. 21A

SAMPLE 1 (EXAMPLE)

| DCS | 4 | H2* | NH3* | 4 | N2* |

SAMPLE 2 (EXAMPLE)

| DCS | 2 | H2* | NH3* | 2 | N2* |

SAMPLE 3 (EXAMPLE)

| DCS | 4 | H2* | NH3* | 2 | N2* |

SAMPLE 4 (EXAMPLE)

| DCS | 2 | H2* | NH3* | 4 | N2* |

SAMPLE 5 (EXAMPLE)

| DCS | 4 | H2* | NH3* | N2* |

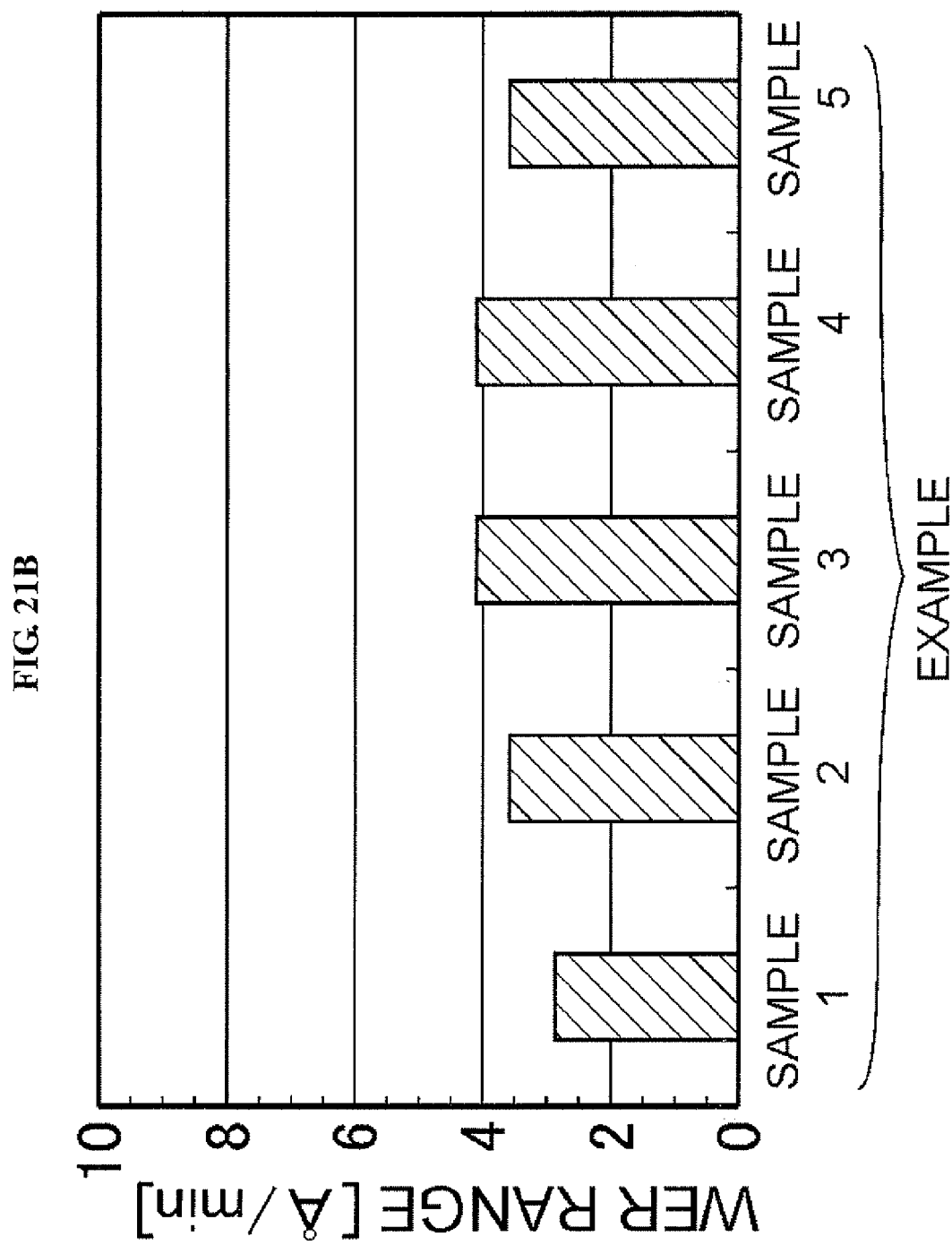

METHOD OF MANUFACTURING SEMICONDUCTOR DEVICE, METHOD OF PROCESSING SUBSTRATE, SUBSTRATE PROCESSING APPARATUS, AND NON-TRANSITORY COMPUTER-READABLE RECORDING MEDIUM

CROSS-REFERENCE TO RELATED PATENT APPLICATION

This U.S. non-provisional patent application claims priority under 35 U.S.C. §119 of Japanese Patent Application No. 2011-223134, filed on Oct. 7, 2011, and Japanese Patent Application No. 2012-181859, filed on Aug. 20, 2012, in the Japanese Patent Office, the entire contents of which are hereby incorporated by reference.

BACKGROUND OF THE INVENTION

1. Field of the Invention

The present invention relates to a method of manufacturing a semiconductor device, which includes a process of forming a thin film on a substrate, a method of processing a substrate, a substrate processing apparatus that may be used in the process of forming the thin film, and a non-transitory computer-readable recording medium.

2. Description of the Related Art

A silicon nitride (SiN) film may be formed on a substrate, as one process of a method of manufacturing a semiconductor device, e.g., a large-scale integrated circuit (LSI), static random access memory (SRAM), dynamic random access memory (DRAM), etc. The silicon nitride (SiN) film may be formed by alternately and repeatedly performing a process of supplying, for example, a silicon-containing gas to a substrate in a process chamber and a process of supplying a plasma-excited nitrogen-containing gas to the substrate in the process chamber. The silicon nitride (SiN) film may be used, for example, as an etching stopper layer when a silicon oxide (SiO) film is etched using a solution containing hydrogen fluoride, during a process of manufacturing a semiconductor device.

SUMMARY OF THE INVENTION

Recently, there is a growing need to lower a film-forming temperature of a silicon nitride (SiN) film when a semiconductor device is manufactured. However, when the film-forming temperature of the silicon nitride (SiN) film is low, the quality of the silicon nitride (SiN) film may be degraded, thereby increasing an etching rate with respect to a solution containing hydrogen fluoride.

The present invention is directed to provide a method of manufacturing a semiconductor device capable of forming a nitride film resistant to hydrogen fluoride at low temperatures, a method of processing a substrate, a substrate processing apparatus, and a non-transitory computer-readable recording medium.

According to one aspect of the present invention, there is provided method of manufacturing a semiconductor device, the method including forming a nitride film on a substrate by performing a cycle a predetermined number of times, the cycle including:

(a) supplying a source gas to the substrate;
(b) supplying a plasma-excited hydrogen-containing gas to the substrate;
(c) supplying a plasma-excited or thermally excited nitriding gas to the substrate; and
(d) supplying at least one of a plasma-excited nitrogen gas and a plasma-excited rare gas to the substrate.

According to another aspect of the present invention, there is provided a method of processing a substrate including forming a nitride film on a substrate by performing a cycle a predetermined number of times, the cycle including:

(a) supplying a source gas to the substrate;
(b) supplying a plasma-excited hydrogen-containing gas to the substrate;
(c) supplying a plasma-excited or thermally excited nitriding gas to the substrate; and
(d) supplying at least one of a plasma-excited nitrogen gas and a plasma-excited rare gas to the substrate.

According to still another aspect of the present invention, there is provided a substrate processing apparatus, including:

a process chamber configured to accommodate a substrate;
a first gas supply system configured to supply a source gas to the substrate in the process chamber;
a second gas supply system configured to supply a nitriding gas to the substrate in the process chamber;
a third gas supply system configured to supply a hydrogen-containing gas to the substrate in the process chamber;
a fourth gas supply system configured to supply at least one of nitrogen gas and a rare gas to the substrate in the process chamber;
an excitation unit configured to plasma-excite or thermally excite a gas; and
a control unit configured to control the first through fourth gas supply systems and the excitation unit so as to form a nitride film on the substrate by performing a cycle a predetermined number of times, the cycle including:

(a) supplying the source gas to the substrate in the process chamber;
(b) supplying the plasma-excited hydrogen-containing gas to the substrate in the process chamber;
(c) supplying the plasma-excited or thermally excited nitriding gas to the substrate in the process chamber; and
(d) supplying at least one of the plasma-excited nitrogen gas and the plasma-excited rare gas to the substrate in the process chamber.

According to yet another aspect of the present invention, there is provided a non-transitory computer-readable recording medium storing a program that causes a computer to perform a process of forming a nitride film on a substrate by performing a cycle a predetermined number of times, the cycle including:

(a) supplying a source gas to the substrate in a process chamber;
(b) supplying a plasma-excited hydrogen-containing gas to the substrate in the process chamber;
(c) supplying a plasma-excited or thermally excited nitriding gas to the substrate in the process chamber; and
(d) supplying at least one of a plasma-excited nitrogen gas and a plasma-excited rare gas to the substrate in the process chamber.

BRIEF DESCRIPTION OF THE DRAWINGS

FIG. 15A is a diagram comparing sequences of supplying a gas during forming of a silicon nitride (SiN) film according to Example 1 of the present invention and a Comparative Example.

FIG. 16A illustrates a sequence of supplying a gas during forming of each of the SiN films according to Example 1 of the present invention.

FIG. 17A is a graph illustrating a result of measuring a range of the WERs of the SiN films in a plane of a wafer according to Example 1 of the present invention.

FIG. 17B is a graph illustrating a result of measuring a distribution of the WERs of the SiN films in the plane of the wafer according to Example 1 of the present invention.

FIG. 18A is a diagram illustrating a sequence of supplying a gas during forming of each of SiN films according to Example 2 of the present invention and a Comparative Example.

FIG. 21A illustrates a sequence of supplying a gas during forming of each of SiN films according to Example 3 of the present invention.

FIG. 21B is a graph illustrating a result of measuring a range of the WERs of the SiN films in the plane of the wafer according to Example 3 of the present invention.

DETAILED DESCRIPTION OF THE PREFERRED EMBODIMENTS

Figure 23:
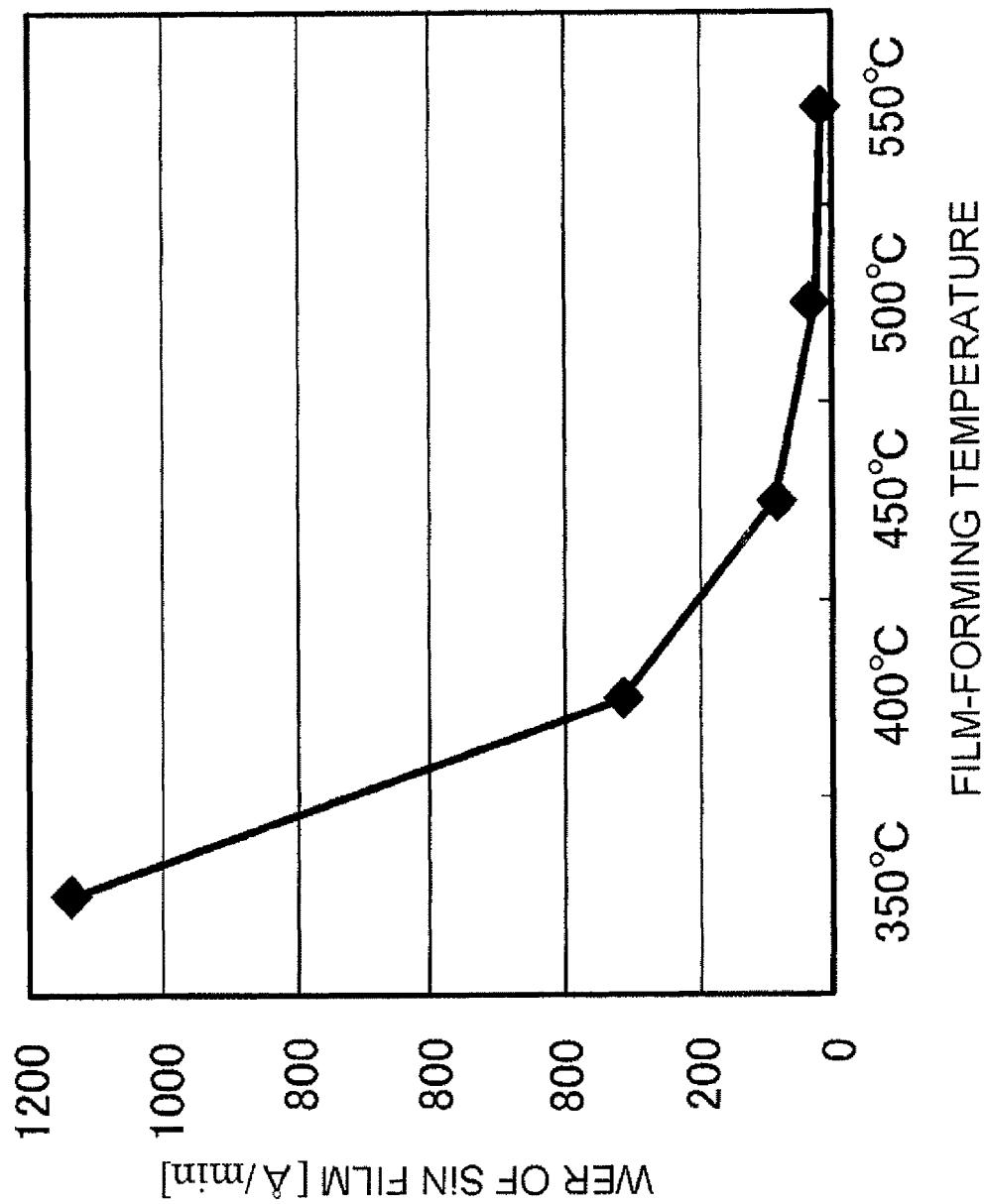
FIG. 23 is a graph illustrating the relationship between the WER of a SiN film and a film-forming temperature.

As described above, when a film-forming temperature of a silicon nitride (SiN) film is low, the quality of the silicon nitride (SiN) film may be degraded, thereby increasing an etching rate with respect to a solution containing hydrogen fluoride. FIG. 23 is a graph illustrating the relationship between the wet-etching rate (WER) of a silicon nitride (SiN) film and a film-forming temperature. In FIG. 23, a horizontal axis denotes a film-forming temperature when the silicon nitride (SiN) film was formed, and a vertical axis denotes a WER (Å/min) when the silicon nitride (SiN) film was etched using a solution containing hydrogen fluoride. Referring to FIG. 23, the lower the film-forming temperature is, the higher the WER of the silicon nitride (SiN) film is.

Much research has been conducted on a method of forming a nitride film at low temperatures by, among others, the inventor of the present invention. As a result, it was concluded that a nitride film highly resistant to hydrogen fluoride may be formed at low temperatures by plasma-exciting and supplying a modifying gas including at least one element among hydrogen, nitrogen, and argon to a substrate in a process chamber either before a nitrogen-containing gas is supplied and after a source gas is supplied or before the source gas is supplied and after the nitrogen-containing gas is supplied, when the nitride film is formed on the substrate by alternately and repeatedly performing a process of supplying the source gas to the substrate accommodated in the process chamber and a process of supplying a plasma-excited nitrogen-containing gas to the substrate in the process chamber.

The process of plasma-exciting and supplying the modifying gas may be performed only before the nitrogen-containing gas is supplied and after the source gas is supplied, may be performed only before the source gas is supplied and after the nitrogen-containing gas is supplied, and may be performed both before the nitrogen-containing gas is supplied and after the source gas is supplied, and before the source gas is supplied and after the nitrogen-containing gas is supplied.

The present invention has been derived based on the results of the research conducted by the inventors. Hereinafter, an embodiment of the present invention will be described with reference to the accompanying drawings.

<First Embodiment of the Present Invention>

(1) Configuration of Substrate Processing Apparatus

Figure 1:
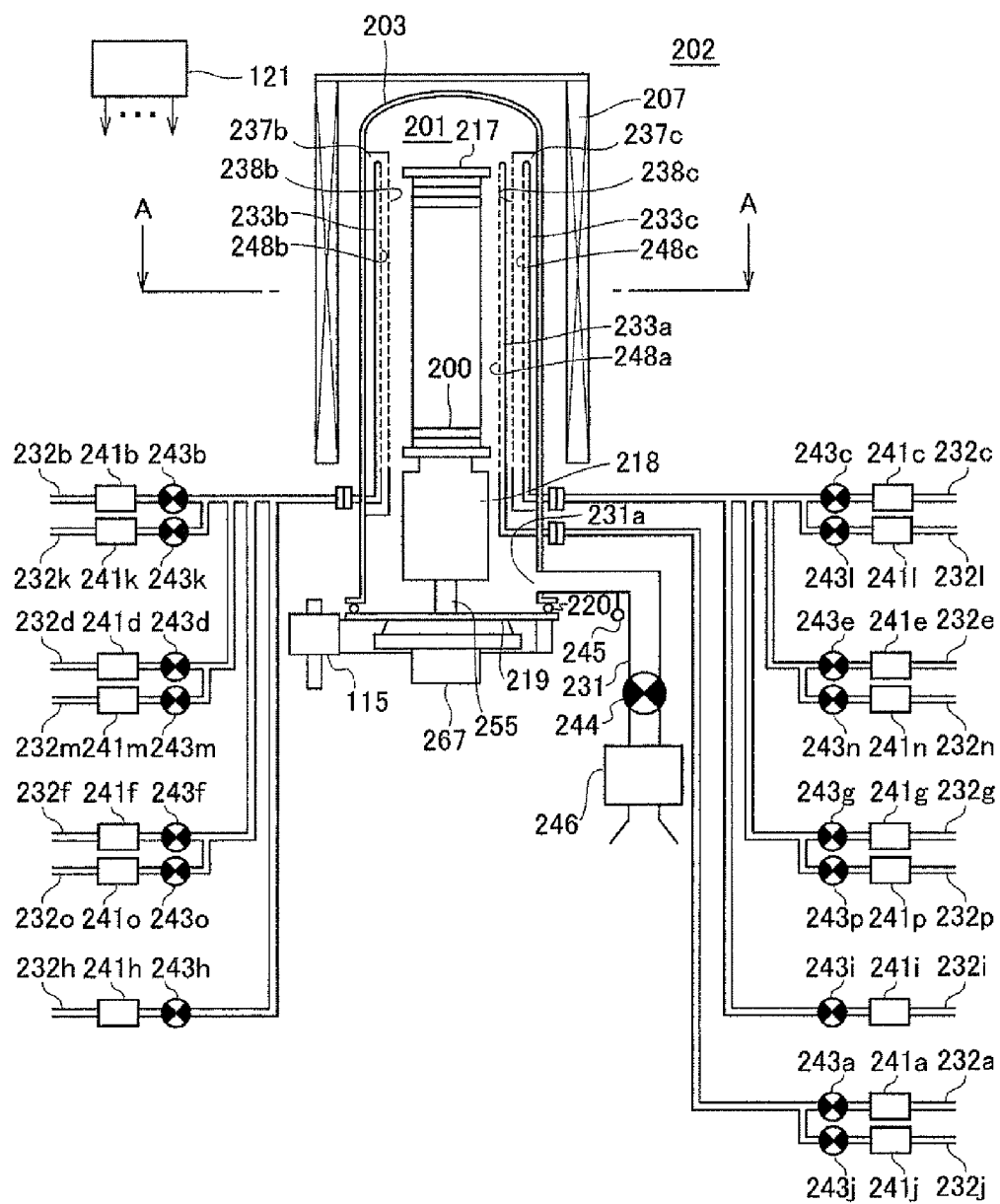
FIG. 1 is a schematic configuration diagram of a vertical process furnace of a substrate processing apparatus according to an embodiment of the present invention, in which a vertical cross-sectional view of a portion of the vertical process furnace is provided.
Figure 2:
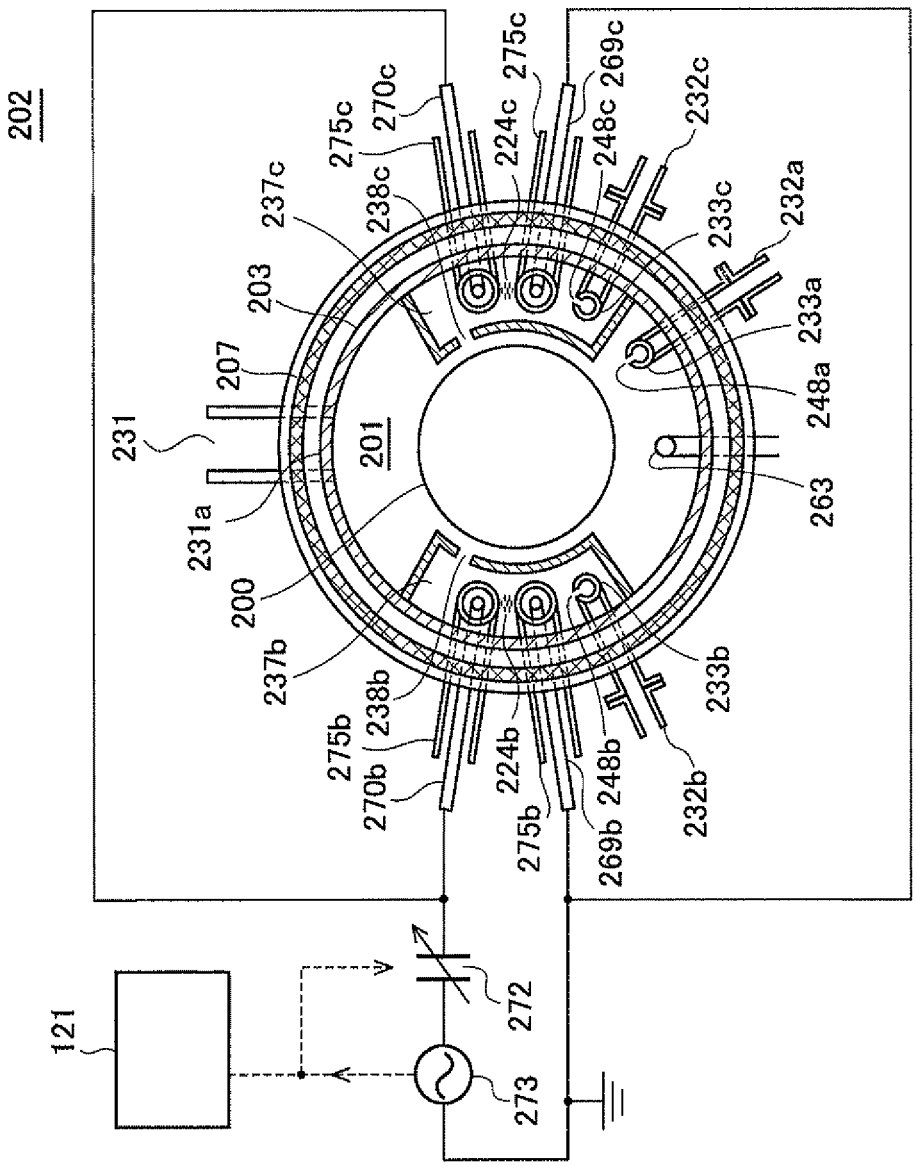
FIG. 2 is a schematic configuration diagram of the vertical process furnace of the substrate processing apparatus according to an embodiment of the present invention, in which a cross-sectional view taken along line A-A in the portion of the process furnace of FIG. 1 is provided.

FIG. 1 is a schematic configuration diagram of a vertical process furnace 202 of a substrate processing apparatus according to an embodiment of the present invention, in which a vertical cross-sectional view of a portion of the vertical process furnace 202 is provided. FIG. 2 is a schematic configuration diagram of the vertical process furnace 202 of the substrate processing apparatus according to an embodiment of the present invention, in which a cross-sectional view taken along line A-A in the portion of the process furnace 202 of FIG. 1 is provided. However, the present invention is not limited to the substrate processing apparatus according to the present embodiment and may also be applied to a substrate processing apparatus including a single-wafer type, a hot-wall type, or a cold-wall type process furnace.

As illustrated in FIG. 1, the process furnace 202 includes a heater 207 serving as a heating unit (heating mechanism). The heater 207 has a cylindrical shape, and is vertically installed by being supported by a heater base (not shown) serving as a retaining plate. Also, the heater 207 acts as an activating mechanism that activates a gas with heat, as will be described below.

In the heater 207, a reaction pipe 203 forming a reaction container (process container) in a concentric shape with respect to the heater 207 is provided. The reaction pipe 203 is formed of a heat-resistant material, e.g., quartz ($SiO_2$) or silicon carbide (SiC), and has a cylindrical shape, an upper end of which is closed and a lower end of which is open. A process chamber 201 is formed in a hollow tubular portion of the reaction pipe 203, and is configured such that wafers 200 may be accommodated as substrates in a horizontal posture to be arranged in multiple stages in a vertical direction by means of a boat 217 which will be described below.

A first nozzle 233a serving as a first gas introduction port, a second nozzle 233b serving as a second gas introduction port, and a third nozzle 233c serving as a third gas introduction port are installed in the process chamber 201 to pass through lower sidewalls of the reaction pipe 203. A first gas supply pipe 232a is connected to the first nozzle 233a. A second gas supply pipe 232b, a fourth gas supply pipe 232d, a sixth gas supply pipe 232f, and an eighth gas supply pipe 232h are connected to the second nozzle 233b. A third gas supply pipe 232c, a fifth gas supply pipe 232e, a seventh gas supply pipe 232g, and a ninth gas supply pipe 232i are connected to the third nozzle 233c. As described above, the three nozzles 233a, 233b, and 233e and the nine gas supply pipes 232a, 232b, 232c, 232d, 232e, 232f, 232g, 232h, and 232i are installed in the reaction pipe 203 so that a plurality of types of gases (five types of gases in the present embodiment) may be supplied into the process chamber 201.

Also, a manifold formed of metal may be installed below the reaction pipe 203 to support the reaction pipe 203, and the first to third nozzles 233a through 233c may be installed to pass through sidewalls of the manifold. In this case, an exhaust pipe 231 which will be described below may be further installed in the manifold. Alternatively, the exhaust pipe 231 may be installed below the reaction pipe 203 rather than in the manifold. As described above, a furnace port portion of the process furnace 202 may be formed of metal and nozzles may be installed at the furnace port portion formed of metal.

A mass flow controller (MFC) 241a which is a flow rate control device (flow rate control unit) and a valve 243a which is a switch valve are sequentially installed at the first gas supply pipe 232a in an upstream direction. Also, a first inert gas supply pipe 232j is connected to the first gas supply pipe 232a at a downstream side of the valve 243a. An MFC 241j which is a flow rate control device (flow rate control unit) and a valve 243j which is a switch valve are sequentially installed at the first inert gas supply pipe 232j in an upstream direction. Also, the first nozzle 233a is connected to a front end of the first gas supply pipe 232a. The first nozzle 233a is installed in an arc-shaped space between inner walls of the reaction pipe 203 and the wafers 200 to move upward from lower inner walls of the reaction pipe 203 in a direction in which the wafers 200 are stacked. In other words, the first nozzle 233a is installed along a wafer arrangement region in which the wafers 200 are arranged, in a region that horizontally surrounds the wafer arrangement region at sides of the wafer arrangement region. The first nozzle 233a is configured as an L-shaped long nozzle, and includes a horizontal portion passing through lower sidewalls of the reaction pipe 203 and a vertical portion vertically moving at least from one end of the wafer arrangement region toward the other end thereof. A plurality of gas supply holes 248a are formed in a side surface of the first nozzle 233a to supply a gas. The gas supply holes 248a may be opened toward a center of the reaction pipe 203 to supply a gas toward the wafers 200. The gas supply holes 248a are formed from a lower portion of the reaction pipe 203 to an upper portion thereof, and the gas supply holes 248a each have the same opening area and are also provided at the same opening pitch.

An MFC 241b which is a flow rate control device (flow rate control unit) and a valve 243b which is a switch valve are sequentially installed at the second gas supply pipe 232b in an upstream direction. A second inert gas supply pipe 232k is connected to the second gas supply pipe 232b at a downstream side of the valve 243b. An MFC 241k which is a flow rate control device (flow rate control unit) and a valve 243k which is a switch valve are sequentially installed at the second inert gas supply pipe 233k in an upstream direction. Also, the second nozzle 233b is connected to a front end of the second gas supply pipe 232b. The second nozzle 233b is installed in a buffer chamber 237b which is a gas dispersion space.

The buffer chamber 237b is installed in the arc-shaped space between the inner walls of the reaction pipe 203 and the wafers 200 and at a portion covering from the lower inner walls of the reaction pipe 203 to upper inner walls thereof, in the direction in which the wafers 200 are stacked. In other words, the buffer chamber 237b is installed along the wafer arrangement region in which the wafers 200 are arranged, in the region that horizontally surrounds the wafer arrangement region at the sides of the wafer arrangement region. A plurality of gas supply holes 238b are formed at an end portion of a wall of the buffer chamber 237b adjacent to the wafers 200 so as to supply a gas. The gas supply holes 238b may be opened toward the center of the reaction pipe 203 to supply a gas toward the wafers 200. The gas supply holes 238b are formed from the lower portion of the reaction pipe 203 to the upper portion thereof, and each have the same opening area and are also provided at the same opening pitch.

The second nozzle 233b is installed at another end portion of the buffer chamber 237b opposite to the end portion in which the gas supply holes 238b are formed, so as to move upward from the lower inner walls of the reaction pipe 203 in the direction in which the wafers 200 are stacked. In other words, the second nozzle 233b is installed along the wafer arrangement region in which the wafers 200 are arranged, in the region that horizontally surrounds the wafer arrangement region at the sides of the wafer arrangement region. The second nozzle 233b is configured as an L-shaped long nozzle, and includes a horizontal portion passing through the lower sidewalls of the reaction pipe 203 and a vertical portion vertically moving at least from one end of the wafer arrangement region toward the other end thereof. A plurality of gas supply holes 248b are formed in a side surface of the second nozzle 233b to supply a gas. The gas supply holes 248b open toward the center of the buffer chamber 237b. The gas supply holes 248b are formed from the lower portion of the reaction pipe 203 to the upper portion thereof, similar to the gas supply holes 238b in the buffer chamber 237b. The gas supply holes 248b may be formed to each have the same opening area at the same opening pitch from an upstream side (lower portion thereof) to a downstream side (upper portion thereof) when a difference between pressures in the buffer chamber 237b and the process chamber 201 is small. However, the opening areas of the gas supply holes 248b may increase or the opening pitch between the gas supply holes 248b may decrease from the upstream side (lower portion) thereof to the downstream side (upper portion) thereof when the difference between the pressures in the buffer chamber 237b and the process chamber 201 is large.

In the present embodiment, gases, the flow velocities of which are different and the flow rates of which are substantially the same, are ejected through each of the gas supply holes 248b by adjusting the opening areas or the opening pitch of the gas supply holes 248b of the second nozzle 233b from the upstream side to the downstream side as described above. Then, the gases ejected through the gas supply holes 248b are introduced into the buffer chamber 237b, and then the different flow velocities of the gases are equalized in the buffer chamber 237b. In other words, the speeds of particles of the gases ejected through the gas supply holes 248b of the second nozzle 233b into the buffer chamber 237b are reduced in the buffer chamber 237b, and the gases are then ejected into the process chamber 201 through the gas supply holes 238b of the buffer chamber 237b. Thus, when the gases ejected into the buffer chamber 237b through the gas supply holes 248b of the second nozzle 233b are ejected into the process chamber 201 through the gas supply holes 238b of the buffer chamber 237b, the gases each have a uniform flow rate and flow velocity.

An MFC 241c which is a flow rate control device (flow rate control unit) and a valve 243c which is a switch valve are sequentially installed at the third gas supply pipe 232c in an upstream direction. A third inert gas supply pipe 232l is connected to the third gas supply pipe 232c at a downstream side of the valve 243c. An MFC 241l which is a flow rate control device (flow rate control unit) and a valve 243l which is a switch valve are sequentially installed at the third inert gas supply pipe 232l in an upstream direction. The third nozzle 233c is connected to a front end of the third gas supply pipe 232c. The third nozzle 233c is installed in a buffer chamber 237c which is a gas dispersion space The buffer chamber 237c is installed in the arc-shaped space between the inner walls of the reaction pipe 203 and the wafers 200 and at the portion covering from the lower inner walls of the reaction pipe 203 to the upper inner walls thereof, in the direction in which the wafers 200 are stacked. In other words, the buffer chamber 237c is installed along the wafer arrangement region in which the wafers 200 are arranged, in the region that horizontally surrounds the wafer arrangement region at the sides of the wafer arrangement region. A plurality of gas supply holes 238c are formed at an end portion of a wall of the buffer chamber 237c adjacent to the wafers 200 so as to supply a gas. The gas supply holes 238c open toward the center of the reaction pipe 203 to supply a gas toward the wafers 200. The gas supply holes 238c are formed from the lower portion of the reaction pipe 203 to the upper portion thereof, and each have the same opening area and are also provided at the same opening pitch.

The third nozzle 233c is installed at another end portion of the buffer chamber 237c opposite to an end portion of the buffer chamber 237c in which the gas supply holes 238c are formed so as to move upward from the lower inner walls of the reaction pipe 203, in the direction in which the wafers 200 are stacked. That is, the third nozzle 233c is installed along the wafer arrangement region in which the wafers 200 are arranged, in the region that horizontally surrounds the wafer arrangement region at sides of the wafer arrangement region. The third nozzle 233c is configured as an L-shaped long nozzle, and includes a horizontal portion passing through the lower sidewalls of the reaction pipe 203, and a vertical portion vertically moving at least from one end of the wafer arrangement region toward another end thereof. A plurality of gas supply holes 248c are formed in a side surface of the first nozzle 233a to supply a gas. The gas supply holes 248c open toward the center of the buffer chamber 237. The gas supply holes 248c are formed from the lower portion of the reaction pipe 203 to the upper portion thereof, similar to the gas supply holes 238c of the buffer chamber 237. The gas supply holes 248c may be formed to each have the same opening area at the same opening pitch from an upstream side (lower portion thereof) to a downstream side (upper portion thereof) when a difference between pressures in the buffer chamber 237 and the process chamber 201 is small. However, the opening areas of the gas supply holes 248c may increase or the opening pitch between the gas supply holes 248c may decrease from the upstream side (lower portion) thereof to the downstream side (upper portion) thereof when the difference between the pressures in the buffer chamber 237 and the process chamber 201 is large.

In the present embodiment, gases, the flow velocities of which are different and the flow rates of which are substantially the same, are ejected through each of the gas supply holes 248c by adjusting the opening areas or the opening pitch of the gas supply holes 248c of the third nozzle 233c from the upstream side to the downstream side as described above. Then, the gases ejected through the gas supply holes 248c are introduced into the buffer chamber 237c, and then the different flow velocities of the gases are equalized in the buffer chamber 237c. In other words, the speeds of particles of the gases ejected through the gas supply holes 248c of the third nozzle 233c into the buffer chamber 237c are reduced in the buffer chamber 237c, and the gases are then ejected into the process chamber 201 through the gas supply holes 238c of the buffer chamber 237. Thus, when the gases ejected into the buffer chamber 237c through the gas supply holes 248c of the third nozzle 233c are ejected into the process chamber 201 through the gas supply holes 238c of the buffer chamber 237c, the gases each have the same flow rate and flow velocity.

An MFC 241d which is a flow rate control device (flow rate control unit) and a valve 243d which is a switch valve are sequentially installed at the fourth gas supply pipe 232d in an upstream direction. A fourth inert gas supply pipe 232m is connected to the fourth gas supply pipe 232d at a downstream side of the valve 243d. An MFC 241m which is a flow rate control device (flow rate control unit) and a valve 243m which is a switch valve are sequentially installed at the fourth inert gas supply pipe 232m in an upstream direction. A front end of the fourth gas supply pipe 232d is connected to the second gas supply pipe 232b at a downstream side of the valve 243b.

An MFC 241e which is a flow rate control device (flow rate control unit) and a valve 243e which is a switch valve are sequentially installed at the fifth gas supply pipe 232e in an upstream direction. A fifth inert gas supply pipe 232n is connected to the fifth gas supply pipe 232e at a downstream side of the valve 243e. An MFC 241n which is a flow rate control device (flow rate control unit) and a valve 243n which is a switch valve are sequentially installed at the fifth inert gas supply pipe 232n in an upstream direction. A front end of the fifth gas supply pipe 232e is connected to the third gas supply pipe 232c at a downstream side of the valve 243c.

An MFC 241f which is a flow rate control device (flow rate control unit) and a valve 243f which is a switch valve are sequentially installed at the sixth gas supply pipe 232f in an upstream direction. A sixth inert gas supply pipe 232o is connected to the sixth gas supply pipe 232f at a downstream side of the valve 243f. An MFC 241o which is a flow rate control device (flow rate control unit) and a valve 243o which is a switch valve are sequentially installed at the sixth inert gas supply pipe 232o in an upstream direction. A front end of the sixth gas supply pipe 232f is connected to the second gas supply pipe 232b at a downstream side of the valve 243b.

An MFC 241g which is a flow rate control device (flow rate control unit) and a valve 243g which is a switch valve are sequentially installed at the seventh gas supply pipe 232g in an upstream direction. A seventh inert gas supply pipe 232p is connected to the seventh gas supply pipe 232g at a downstream side of the valve 243g. An MFC 241p which is a flow rate control device (flow rate control unit) and a valve 243p which is a switch valve are sequentially installed at the seventh inert gas supply pipe 232p in an upstream direction. A front end of the seventh gas supply pipe 232g is connected to the third gas supply pipe 232c at a downstream side of the valve 243c.

An MFC 241h which is a flow rate control device (flow rate control unit) and a valve 243h which is a switch valve are sequentially installed at the eighth gas supply pipe 232h in an upstream direction. A front end of the eighth gas supply pipe 232h is connected to the second gas supply pipe 232b at a downstream side of the valve 243b.

An MFC 241i which is a flow rate control device (flow rate control unit) and a valve 243i which is a switch valve are sequentially installed at the ninth gas supply pipe 232i in an upstream direction. A front end of the ninth gas supply pipe 232i is connected to the third gas supply pipe 232c at a downstream side of the valve 243c.

As described above, in a method of supplying a gas according to the present embodiment, a main flow of a gas within the reaction pipe 203 is controlled to be parallel to, i.e., to be horizontal with respect to, a surface of each of the wafers 200 by carrying the gas via the nozzles 233a, 233b, and 233c and the buffer chambers 237b and 237c in the vertically long arc-shaped space, defined by the inner walls of the reaction pipe 203 and ends of a plurality of stacked wafers 200, and then first ejecting the gas into the reaction pipe 203 near the wafers 200 through the gas supply holes 248a, 248b, 248c, 283b and 238c which are formed in the nozzles 233a, 233b and 233c, respectively, and the buffer chambers 237b and 237c. Owing to the above configuration, the gas may be equally supplied to the wafers 200, thereby uniformizing the thickness of a thin film to be formed on each of the wafers 200. Also, a residual gas remaining after a reaction flows toward the exhaust pipe 231, i.e., in the direction of the exhaust pipe 231 which will be described below, but a flowing direction of the residual gas may be appropriately defined by a location of the exhaust port and is not limited to the vertical direction.

The two buffer chambers 237b and 237c are disposed to face each other via the center of the wafers 200, i.e., the center of the reaction pipe 203. Specifically, as illustrated in FIG. 2, the two buffer chambers 237b and 237c are disposed to be linearly symmetrical with respect to a straight line connecting the center of the wafers 200 and the center of the exhaust port 231a (which will be described below) installed at a sidewall of the reaction pipe 203, as seen from a plan view. Also, the two buffer chambers 237b and 237c are disposed such that straight lines connecting the gas supply holes 238b of the buffer chamber 237b, the gas supply holes 238c of the buffer chamber 237c, and the center of the exhaust port 231a may form an isosceles triangle. Accordingly, the flow of a gas to the wafers 200 from the two buffer chambers 237b and 237c may be equalized. That is, the flow of the gas to the wafers 20 from the two buffer chambers 237b and 237c may be linearly symmetrical with respect to the straight line connecting the center of the wafers 200 and the center of the exhaust port 231a.

Through the first gas supply pipe 232a, for example, dichlorosilane ($SiH_2Cl_2$, abbreviated to 'DCS') gas is supplied as a source gas containing a specific element, e.g., silicon (Si) (a silicon-containing gas), into the process chamber 201 via the MFC 241a, the valve 243a, and the first nozzle 233a. At the same time, through the first inert gas supply pipe 232j, an inert gas may be supplied into the first gas supply pipe 232a via the MFC 241j and the valve 243j.

Through the second gas supply pipe 232b, for example, ammonia ($NH_3$) gas is supplied as a gas containing nitrogen (a nitrogen-containing gas), i.e., a nitriding gas, into the process chamber 201 via the MFC 241b, the valve 243b, the second nozzle 233b, and the buffer chamber 237b. At the same time, through the second inert gas supply pipe 232k, an inert gas may be supplied into the second gas supply pipe 232b via the MFC 241k and the valve 243k.

Through the third gas supply pipe 232c, for example, ammonia ($NH_3$) gas is supplied as a gas containing nitrogen (a nitrogen-containing gas), i.e., a nitriding gas, into the process chamber 201 via the MFC 241c, the valve 243c, the third nozzle 233c, and the buffer chamber 237c. At the same time, an inert gas may be supplied into the third gas supply pipe 232c through the third inert gas supply pipe 232l via the MFC 241l and the valve 243l.

Through the fourth gas supply pipe 232d, for example, hydrogen ($H_2$) gas is supplied as a gas containing hydrogen which is a modifying gas (a hydrogen-containing gas), i.e., a reducing gas, into the process chamber 201 via the MFC 241d, the valve 243d, the second gas supply pipe 232b, the second nozzle 233b, and the buffer chamber 237b. At the same time, an inert gas may be supplied into the fourth gas supply pipe 232d through the fourth inert gas supply pipe 232m via the MFC 241m and the valve 243m.

Through the fifth gas supply pipe 232e, for example, hydrogen ($H_2$) gas is supplied as a gas containing hydrogen which is a modifying gas (a hydrogen-containing gas), i.e., a reducing gas, into the process chamber 201 via the MFC 241e, the valve 243e, the third gas supply pipe 232c, the third nozzle 233c, and the buffer chamber 237c. At the same time, an inert gas may be supplied into the fifth gas supply pipe 232e through the fifth inert gas supply pipe 232n via the MFC 241n and the valve 243n.

Through the sixth gas supply pipe 232f, for example, argon (Ar) gas is supplied as a rare gas which is a modifying gas into the process chamber 201 via the MFC 241f, the valve 243f, the second gas supply pipe 232b, the second nozzle 233b, and the buffer chamber 237b. At the same time, an inert gas may be supplied into the sixth gas supply pipe 232f through the sixth inert gas supply pipe 232o via the MFC 241o and the valve 243o.

Through the seventh gas supply pipe 232e, for example, argon (Ar) gas is supplied as a rare gas which is a modifying gas into the process chamber 201 via the MFC 241g, the valve 243g, the third gas supply pipe 232c, the third nozzle 233c, and the buffer chamber 237e. At the same time, an inert gas may be supplied into the seventh gas supply pipe 232 through the seventh inert gas supply pipe 232p via the MFC 241p and the valve 243p.

Through the eighth gas supply pipe 232h, for example, nitrogen ($N_2$) is supplied as a modifying gas into the process chamber 201 via the MFC 241h, the valve 243h, the second gas supply pipe 232b, the second nozzle 233b, and the buffer chamber 237b.

Through the ninth gas supply pipe 232i, for example, nitrogen ($N_2$) gas is supplied as a modifying gas into the process chamber 201 via the MFC 241i, the valve 243i, the third gas supply pipe 232c, the third nozzle 233c, and the buffer chamber 237c.

When a gas is supplied via the first gas supply pipe 232a as described above, a first gas supply system (source gas supply system) which supplies a source gas (DCS gas) to the wafers 200 in the process chamber 201, i.e., a silicon-containing gas supply system (DCS gas supply system), mainly includes the first gas supply pipe 232a, the MFC 241a, and the valve 243a. The first nozzle 233a may be further included in the first gas supply system. A first inert gas supply system mainly includes the first inert gas supply pipe 232j, the MFC 241j, and the valve 243j. The first inert gas supply system may also act as a purge gas supply system.

When a gas is supplied via the second gas supply pipe 232b and the third gas supply pipe 232c as described above, a second gas supply system (nitriding gas supply system) which supplies a nitriding gas ($NH_3$ gas) to the wafers 200 in the process chamber 201, i.e., a nitrogen-containing gas supply system (an $NH_3$ gas supply system), mainly includes the second gas supply pipe 232b, the third gas supply pipe 232c, the MFCs 241b and 241c, and the valves 243b and 243c. The second nozzle 233b, the third nozzle 233c, and the buffer chambers 237b and 237c may further be included in the second gas supply system. A second inert gas supply system mainly includes the second inert gas supply pipe 232k, the third inert gas supply pipe 232l, the MFCs 241k and 241l, and the valves 243k and 243l. The second inert gas supply system also acts as a purge gas supply system.

When a gas is supplied via the fourth gas supply pipe 232d and the fifth gas supply pipe 232e as described above, a third gas supply system (reducing gas supply system) which supplies a hydrogen-containing gas ($H_2$ gas) to the wafers 200 in the process chamber 201, i.e., a hydrogen-containing gas supply system (a $H_2$ gas supply system), mainly includes the fourth gas supply pipe 232d, the fifth gas supply pipe 232e, the MFCs 241d and 241e, and the valves 243d and 243e. A downstream side of a portion of the second gas supply pipe 232b connected to the fourth gas supply pipe 232d, and a downstream side of a portion of the third gas supply pipe 232c connected to the fifth gas supply pipe 232e, the second nozzle 233b, the third nozzle 233c, and the buffer chambers 237b and 237c may be further included in the third gas supply system. A third inert gas supply system mainly includes the fourth inert gas supply pipe 232m, the fifth inert gas supply pipe 232n, the MFCs 241m and 241n, and the valves 243m and 243n. The third inert gas supply system may also act as a purge gas supply system.

When a gas is supplied via the sixth gas supply pipe 232f and the seventh gas supply pipe 232g as described above, a rare gas supply system (Ar gas supply system) which supplies a rare gas (Ar gas) to the wafers 200 in the process chamber 201 mainly includes the sixth gas supply pipe 232f, the seventh gas supply pipe 232g, the MFCs 241f and 241g, and the valves 243f and 243g. A downstream side of a portion of the second gas supply pipe 232b connected to the sixth gas supply pipe 232f, and a downstream side of a portion of the third gas supply pipe 232c connected to the seventh gas supply pipe 232g, the second nozzle 233b, the third nozzle 233c, and the buffer chambers 237b and 237c may further be included in the rare gas supply system. A fourth inert gas supply system mainly includes the sixth inert gas supply pipe 232o, the seventh inert gas supply pipe 232p, the MFCs 241o and 241p, and the valves 243o and 243p. The fourth inert gas supply system may also act as a purge gas supply system.

When a gas is supplied via the eighth gas supply pipe 232h and the ninth gas supply pipe 232i as described above, a nitrogen gas supply system ($N_2$ gas supply system) which supplies nitrogen gas ($N_2$ gas) to the wafers 200 in the process chamber 201 mainly includes the eighth gas supply pipe 232h, the ninth gas supply pipe 232i, the MFCs 241h and 241i, and the valves 243h and 243i. A downstream side of a portion of the second gas supply pipe 232b connected to the eighth gas supply pipe 232h, and a downstream side of a portion of the third gas supply pipe 232c connected to the ninth gas supply pipe 232i, the second nozzle 233b, the third nozzle 233c, and the buffer chambers 237b and 237c may further be included in the nitrogen gas supply system.

A fourth gas supply system which supplies at least one of nitrogen gas ($N_2$ gas) and a rare gas (Ar gas) to the wafers 200 in the process chamber 201 mainly includes the rare gas supply system and the nitrogen gas supply system described above. The fourth gas supply system may also act as a purge gas supply system.

Since, in the present embodiment, a reducing gas ($H_2$ gas), nitrogen gas ($N_2$ gas), and a rare gas (Ar gas) are used as modifying gases, each of the third gas supply system (reducing gas supply system) and the fourth gas supply system (nitrogen gas supply system and rare gas supply system) may also be referred to as a modifying gas supply system. Since a nitriding gas ($NH_3$) acts as a reactive gas, the second gas supply system (nitriding gas supply system) may also be referred to as a reactive gas supply system.

As illustrated in FIG. 2, in the buffer chamber 237b, a first rod-shaped electrode 269b serving as a first electrode and a second rod-shaped electrode 270b serving as a second electrode, both of which are slender and long electrodes, are provided from the lower portion of the reaction pipe 203 to the upper portion thereof, in the direction in which the wafers 200 are stacked. The first rod-shaped electrode 269b and the second rod-shaped electrode 270b are disposed in parallel with the second nozzle 233b. Each of the first rod-shaped electrode 269b and the second rod-shaped electrode 270b is covered with an electrode protection pipe 275b which is configured to protect these electrodes from an upper portion to a lower portion thereof. One of the first rod-shaped electrode 269b and the second rod-shaped electrode 270b is connected to a high-frequency power source 273 via an impedance matching unit 272, and the other electrode is connected to a ground that has a reference electric potential. Plasma is generated in a plasma generating region 224b between the first and second rod-shaped electrodes 269b and 270b by supplying high-frequency power between the first and second rod-shaped electrodes 269b and 270b from the high-frequency power source 273 via the impedance matching unit 272.

Similarly, in the buffer chamber 237c, a first rod-shaped electrode 269c serving as a first electrode and a second rod-shaped electrode 270c serving as a second electrode, both of which are slender and long electrodes, are provided from the lower portion of the reaction pipe 203 to the upper portion thereof, in the direction in which the wafers 200 are stacked. The first rod-shaped electrode 269c and the second rod-shaped electrode 270c are disposed in parallel with the third nozzle 233c. Each of the first rod-shaped electrode 269b and the second rod-shaped electrode 270b is covered with an electrode protection pipe 275c which is configured to protect these electrodes from an upper portion to a lower portion thereof. One of the first rod-shaped electrode 269c and the second rod-shaped electrode 270c is connected to the high-frequency power source 273 via the impedance matching unit 272, and the other electrode is connected to the ground that has the reference electric potential. Plasma is generated in a plasma generating region 224c between the first and second rod-shaped electrodes 269c and 270c by supplying high-frequency power between the first and second rod-shaped electrodes 269c and 270c from the high-frequency power source 273 via the impedance matching unit 272.

A first plasma source is mainly configured as a plasma generator (plasma generation unit) by the first rod-shaped electrode 269b, the second rod-shaped electrode 270b, and the electrode protection pipe 275b. The impedance matching unit 272 and the high-frequency power source 273 may further be included in the first plasma source. A second plasma source is mainly configured as a plasma generator (plasma generation unit) by the first rod-shaped electrode 269c, the second rod-shaped electrode 270c, and the electrode protection pipe 275c. The impedance matching unit 272 and the high-frequency power source 273 may be further included in the second plasma source. Each of the first and second plasma sources may also act as an activating mechanism that activates a gas to a plasma state, as will be described below. As described above, in the substrate processing apparatus according to the present embodiment, a plurality of excitation units (two excitation units in the present embodiment) are installed. The plurality of the excitation units are disposed in a distributed fashion, similar to the buffer chambers 237b and 237c.

The electrode protection pipe 275b is configured such that the first and second rod-shaped electrodes 269b and 270b may be inserted into the buffer chamber 237b in a state in which the first and second rod-shaped electrodes 269b and 270b are isolated from an atmosphere in the buffer chamber 237b. The electrode protection pipe 275c is configured such that the first and second rod-shaped electrodes 269c and 270c may be inserted into the buffer chamber 237c in a state in which the first and second rod-shaped electrodes 269c and 270c are isolated from an atmosphere in the buffer chamber 237c. Here, if the concentration of oxygen in the electrode protection pipes 275b and 275c is substantially the same as that of oxygen in the external air (the atmosphere), the first and second rod-shaped electrodes 269b and 270b inserted into the electrode protection pipe 275b and the first and second rod-shaped electrodes 269c and 270c inserted into the electrode protection pipe 275c are oxidized by heat from the heater 207. Thus, the concentrations of the oxygen in the electrode protection pipes 275b and 275c are reduced by filling the insides of the electrode protection pipes 275b and 275c with an inert gas, e.g., nitrogen gas, or by purging the insides of the electrode protection pipes 275b and 275c with an inert gas, e.g., nitrogen gas, through an inert gas purging mechanism, thereby preventing oxidation of the first rod-shaped electrodes 269b and 269c or the second rod-shaped electrodes 270b and 270c.

The exhaust port 231a described above is installed at the reaction pipe 203. The exhaust pipe 231 that exhausts the atmosphere in the process chamber 201 is connected to the exhaust port 231a. A vacuum pump 246 which is a vacuum exhaust device is connected to the exhaust pipe 231 via a pressure sensor 245 which is a pressure detector (pressure detection unit) that detects pressure in the process chamber 201 and an auto pressure controller (APC) valve 244 which is a pressure adjustor (pressure adjustment unit). The APC valve 244 is configured to perform or suspend vacuum-exhaust in the process chamber 201 by opening/closing the APC valve 244 while the vacuum pump 246 is operated, and to adjust pressure in the process chamber 201 by controlling the degree of opening the APC valve 244 while the vacuum pump 246 is operated. An exhaust system mainly includes the exhaust pipe 231, the APC valve 244, and the pressure sensor 245. The vacuum pump 246 may be further included in the exhaust system. The exhaust system is configured to perform vacuum-exhaust such that the pressure in the process chamber 210 may be equal to a predetermined pressure (degree of vacuum) by adjusting the degree of opening the APC valve 244 based on pressure information detected by the pressure sensor 245 while the vacuum pump 246 is operated.

Below the reaction pipe 203, a seal cap 219 is installed as a furnace port lid that may air-tightly close a lower end aperture of the reaction pipe 203. The seal cap 219 is configured to contact a lower end of the reaction pipe 203 in a vertical direction from a lower portion thereof. The seal cap 219 is formed of a metal, such as stainless steel, and has a disk shape. An O-ring 220 is installed as a seal member that contacts the lower end of the reaction pipe 203 on an upper surface of the seal cap 219. A rotating mechanism 267 that rotates the boat 217 as a substrate retainer is installed at a side of the seal cap 219 opposite to the process chamber 201. A rotation shaft 255 of the rotating mechanism 267 is connected to the boat 217 while passing through the seal cap 219. The rotating mechanism 267 is configured to rotate the wafers 200 by rotating the boat 217. The seal cap 219 is configured to be vertically moved upward/downward by a boat elevator 115 that is a lifting mechanism vertically installed outside the reaction pipe 203. The boat elevator 115 is configured to load the boat 217 into or unload the boat 217 from the process chamber 201 by moving the seal cap 219 upward/downward. That is, the boat elevator 115 is configured as a transfer device (transfer mechanism) that transfers the boat 217, i.e., the wafers 200, inside or outside the process chamber 201.

The boat 217 serving as a substrate support is formed of a heat-resistant material, e.g., quartz or silicon carbide, and is configured to support the plurality of wafers 200 in multiple states in a state in which the wafers 200 are concentrically arranged in a horizontal posture. Below the boat 217, an insulating member 218 is formed of a heat-resistant material, e.g., quartz or silicon carbide, to prevent heat generated from the heater 207 from being transferred to the seal cap 219. Also, the insulating member 218 may include a plurality of insulating plates formed of a heat-resistant material, e.g., quartz or silicon carbide, and an insulating plate holder that supports the plurality of insulating plates in a multi-layered structure in a horizontal posture.

in the reaction pipe 203, a temperature sensor 263 is installed as a temperature detector. The temperature sensor 263 is configured to control an amount of current to be supplied to the heater 207 based on temperature information detected by the temperature sensor 263, so that the temperature in the process chamber 201 may have a desired temperature distribution. The temperature sensor 263 has an L-shape similar to the first nozzle 233a, and is installed along an inner wall of the reaction pipe 203.

Figure 4:
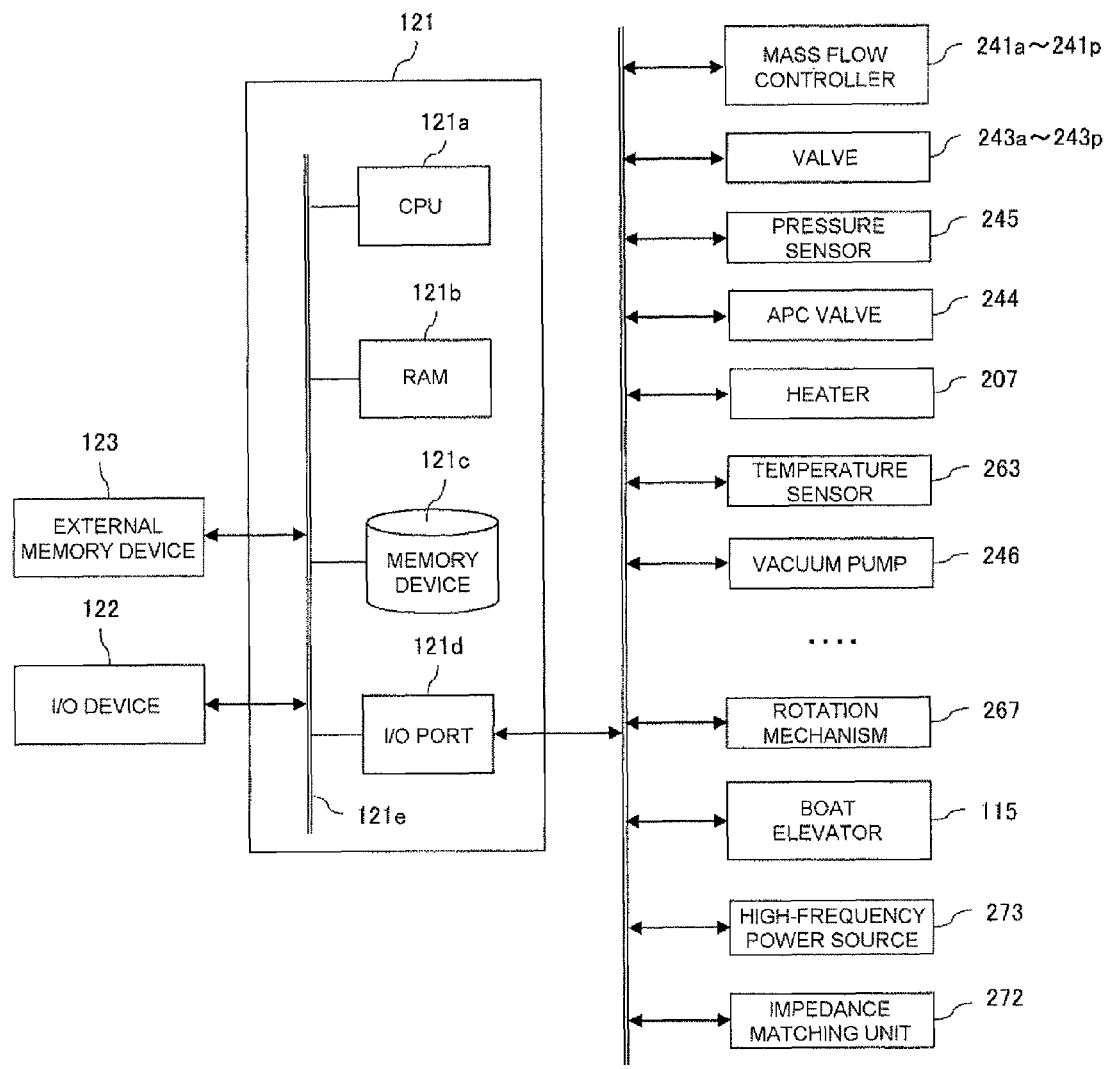
FIG. 4 is a schematic configuration diagram of a controller included in a substrate processing apparatus according to an embodiment of the present invention.

As illustrated in FIG. 4, a controller 121 which is a control unit (control member) is configured as a computer including a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a via an internal bus 212e. An I/O device 122 configured, for example, as a touch panel is connected to the controller 121.

The memory device 121c is configured, for example, as a flash memory, a hard disk drive (HDD), or the like. In the memory device 121c, a control program for controlling an operation of the substrate processing apparatus or a process recipe instructing an order or conditions of processing a substrate which will be described below are stored to be readable. The program recipe is a combination of processes designed to obtain a desired result when operations of a substrate processing process, which will be described below, are performed by the controller 121, and acts as a program. Hereinafter, such a process recipe and a control program will be referred to together simply as a 'program.' Also, when the term 'program' is used in the present disclosure, it should be understood as including only program recipe groups, only control program groups, or both program recipe groups and control program groups. The RAM 221b is configured as a work area for temporarily storing a program or data read by the CPU 221a.

The I/O port 121d is connected to the MFCs 241a, 241b, 241c, 241d, 241e, 241f, 241g, 241h, 241i, 241j, 241k, 241l, 241m, 241n, 241o, and 241p, the valves 243a, 243b, 243c, 243d, 243e, 243f, 243g, 243h, 243i, 243j, 243k, 243l, 243m, 243n, 243o, and 243p, the pressure sensor 245, the APC valve 244, the vacuum pump 246, the heater 207, the temperature sensor 263, the rotating mechanism 267, the boat elevator 115, the high-frequency power source 273, the impedance matching unit 272, and the like.

The CPU 221a is configured to read the process recipe from the memory device 121c according to a manipulation command received via the I/O device 122, and read and execute the control program from the memory device 121c. Also, according to the read program recipe, the CPU 121a controls flow rates of various gases via the MFCs 241a, 241b, 241c, 241d, 241e, 241f, 241g, 241h, 241i, 241j, 241k, 241l, 241m, 241n, 241o, and 241p; controls opening/closing of the valves 243a, 243b, 243c, 243d, 243e, 243f, 243g, 243h, 243i, 243j, 243k, 243l, 243m, 243n, 243o, and 243p; controls opening/closing of the APC valve 244; controls the degree of pressure using the APC valve 244, based on the pressure sensor 245; controls temperature using the heater 207, based on the temperature sensor 263; controls driving/suspending of the vacuum pump 246; controls rotation and rotation speed of the boat 217 using the rotating mechanism 267; controls upward/downward movement of the boat 217 using the boat elevator 115; controls supply of power from the high-frequency power source 273; and controls an impedance by the impedance matching unit 272.

The controller 121 is not limited to a personal computer, and may be configured as a general-purpose computer. For example, the controller 121 according to the present embodiment may be configured by preparing an external memory device 123 storing such programs, e.g., a magnetic disk (a magnetic tape, a flexible disk, a hard disk, etc.), an optical disc (a compact disc (CD), a digital versatile disc (DVD), etc.), a magneto-optical disc (MO), or a semiconductor memory (a universal serial bus (USB) memory, a memory card, etc.), and then installing the programs in a general-purpose computer using the external storage device 123. Also, a method of supplying a program to a computer is not limited to using the external memory device 123. For example, a communication unit, e.g., the Internet or an exclusive line, may be used to supply a program to a computer without using the external memory device 123. The memory device 121c or the external memory device 123 may be configured as a non-transitory computer-readable recording medium. Hereinafter, the storage device 121c and the external storage device 123 may also be referred to together simply as a 'recording medium.' Also, when the term 'recording medium' is used in the present disclosure, it may be understood as a case in which only groups of the memory devices 121c are included, a case in which only groups of the external memory devices 123 are included, or a case in which both groups of the memory devices 121c and groups of the external memory devices 123 are used.

(2) Substrate Processing Process

Next, a method of forming a nitride film as an insulating film on a substrate according to the present embodiment, which is one process of a manufacturing process of a semiconductor apparatus (device), using the process furnace 202 of the substrate processing apparatus as described above will be described. In the following description, operations of the elements of the substrate processing apparatus are controlled by the controller 121.

In the present embodiment, the nitride film is formed on the substrate by performing a cycle a predetermined number of times, the cycle including supplying a source gas to the substrate, supplying a plasma-excited hydrogen-containing gas to the substrate, supplying a plasma-excited or thermally excited nitriding gas (nitrogen-containing gas) to the substrate, and supplying a plasma-excited hydrogen-containing gas to the substrate. A film-forming sequence according to the present embodiment will now be described in detail.

Figure 5:
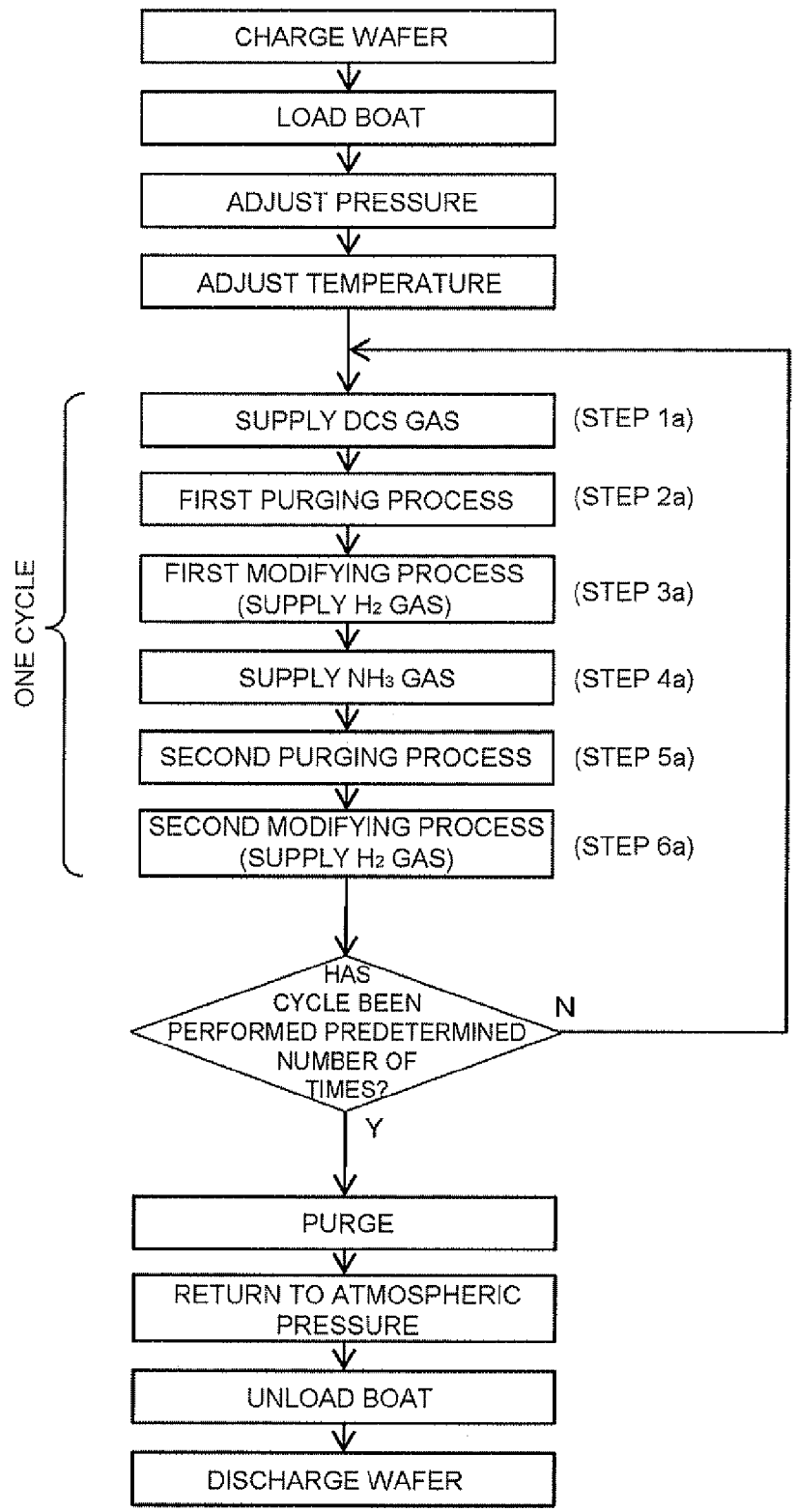
FIG. 5 is a flowchart illustrating a method of forming a film according to a first embodiment of the present invention.
Figure 10:
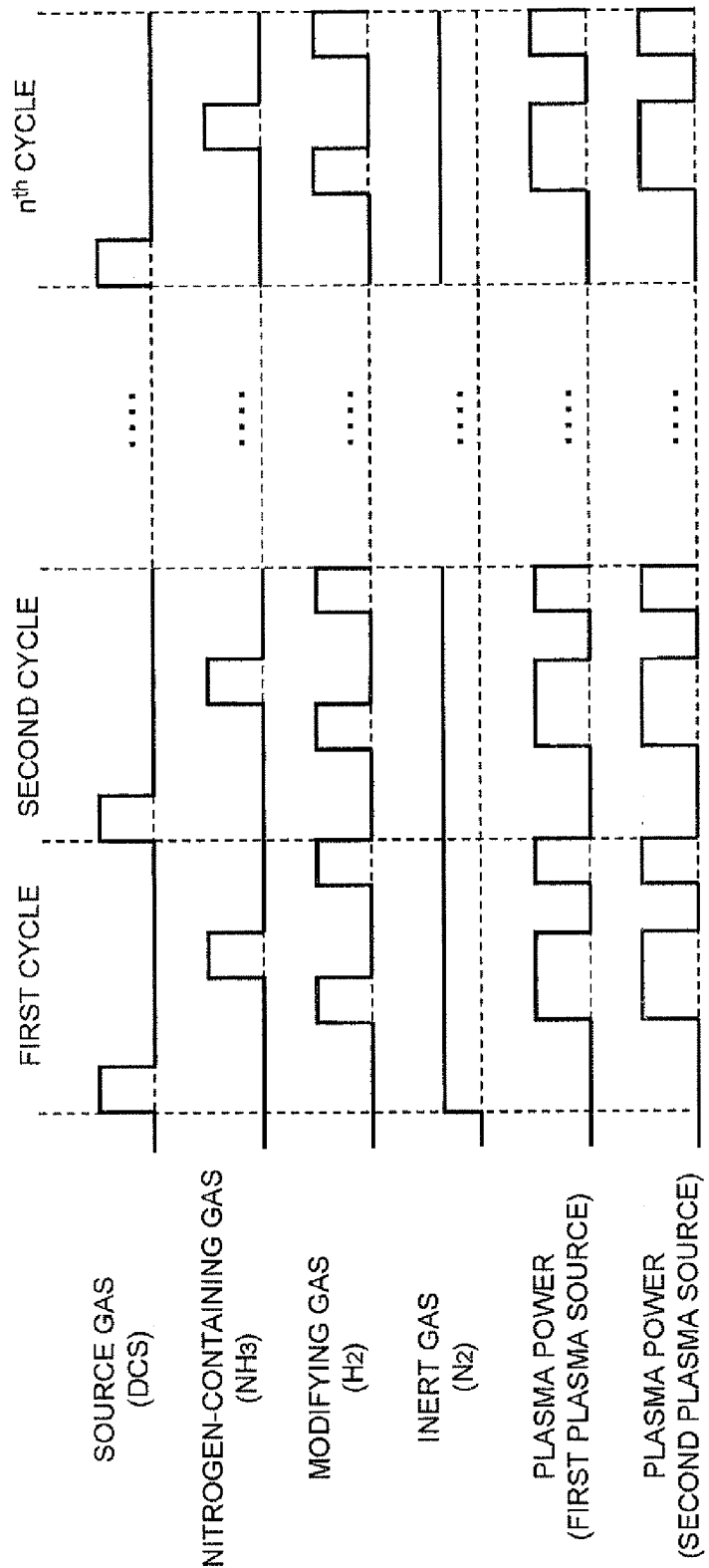
FIG. 10 is a diagram illustrating timing of supplying a gas and plasma power according to the first embodiment of the present invention.

FIG. 5 is a flowchart illustrating a method of forming a film according to the first embodiment of the present invention. FIG. 10 is a diagram illustrating timing of supplying a gas and plasma power in a film-forming sequence according to the first embodiment of the present invention. In the film-forming sequence according to the present embodiment, a silicon nitride ($Si_3N_4$) film (hereinafter referred to simply as SiN film') is formed as an insulating film on a wafer 200 using a DCS gas as a source gas and $NH_3$ gas as a nitrogen-containing gas, and alternately and repeatedly performing a process of supplying the DCS gas to the wafer 200 in the process chamber 201 (DCS gas supply process) and a process of supplying plasma-excited $NH_3$ gas to the wafer 200 in the process chamber 201 ($NH_3$ gas supply process). In this case, the inside of the process chamber 201 is purged using $N_2$ gas as a purge gas (first purging process) after the DCS gas is supplied into the process chamber 201, and the inside of the process chamber 201 is purged with $N_2$ gas (second purging process) after $NH_3$ gas is supplied into the process chamber 201.

In this case, a process of plasma-exciting and supplying $H_2$ gas to the wafer 200 in the process chamber 201 is performed both after the DCS gas is supplied using $H_2$ gas as a modifying gas and before $NH_3$ gas is supplied, and after $NH_3$ gas is supplied and before DCS gas is supplied (first and second modifying processes).

In other words, in the film-forming sequence according to the present embodiment, a SiN film is formed on the wafer 200 by performing one cycle a predetermined number of times, the cycle including supplying DCS gas to the wafer 200 in the process chamber 201 (DCS gas supply process), purging the process chamber 201 (first purging process), supplying plasma-excited $H_2$ gas to the wafer 200 in the process chamber 201 (first modifying process), supplying plasma-excited $NH_3$ gas to the wafer 200 in the process chamber 201 ($NH_3$ gas supply process), purging the process chamber 201

(second purging process), and supplying plasma-excited $H_2$ gas to the wafer 200 in the process chamber 201 (second modifying process). The film-forming sequence according to the present embodiment will now be described in greater detail.

When the term 'wafer' is used in the present disclosure, it should be understood as either the wafer itself, or a stacked structure (assembly) including a wafer and a layer/film formed on the wafer (i.e., the wafer having the layer/film formed a surface thereof may also be referred to as the 'wafer'). Also, when the expression 'surface of the wafer' is used in the present disclosure, it should be understood as either a surface (exposed surface) of the wafer itself or a surface of a layer/film formed on the wafer, i.e., an uppermost surface of the wafer as a stacked structure.

Thus, in the present disclosure, the expression 'specific gas is supplied to a wafer' should be understood to mean that the specific gas is directly supplied to a surface (exposed surface) of the wafer or that the specific gas is supplied to a surface of a layer/film on the wafer, i.e., the uppermost surface of the wafer including a stacked structure. Also, in the present disclosure, the expression 'a layer (or film) is formed on the wafer' should be understood to mean that the layer (or film) is directly formed on a surface (exposed surface) of the wafer itself or that the layer (or film) is formed on a layer/film on the wafer, i.e., on the uppermost surface of the wafer including the stacked structure.

Also, in the present disclosure, the term 'substrate' has the same meaning as the term 'wafer.' Thus, the term 'wafer' in the above-described description may be interchangeable with the term 'substrate.'

(Wafer Charging and Boat Loading)

When a plurality of wafers 200 are placed in the boat 217 (wafer charging), the boat 217 supporting the plurality of wafers 200 is lifted by the boat elevator 115 to be loaded into the process chamber 201 (boat loading), as illustrated in FIG. 1. In this state, the lower end of the reaction pipe 203 is air-tightly closed by the seal cap 219 via the O-ring 220.

(Pressure & Temperature Control)

The inside of the process chamber 201 is vacuum-exhausted to have a desired pressure (degree of vacuum) by the vacuum pump 246. In this case, the pressure in the process chamber 201 is measured by the pressure sensor 245, and the APC valve 244 is feedback-controlled based on information regarding the measured pressure (pressure control). The vacuum pump 246 is kept operated at least until processing of the wafers 200 is completed. Also, the inside of the process chamber 201 is heated to a desired temperature by the heater 207. In this case, an amount of current supplied to the heater 207 is feedback-controlled based on temperature information detected by the temperature sensor 263, so that the inside of the process chamber 201 may have a desired temperature distribution (temperature control). The heating of the inside of the process chamber 201 by the heater 207 is continuously performed at least until the processing of the wafers 200 is completed. Then, rotation of the boat 217 and the wafers 200 begins by the rotating mechanism 267 (wafer rotation). Also, the rotation of the boat 217 and the wafers 200 by the rotating mechanism 267 is continuously performed at least until the processing of the wafers 200 is completed. Thereafter, six steps described below are sequentially performed.

[Step 1a]

DCS gas is supplied to the first gas supply pipe 232a and $N_2$ gas is supplied to the first inert gas supply pipe 232j by opening the valve 243a of the first gas supply pipe 232a and the valve 243j of the first inert gas supply pipe 232j. The DCS gas flows through the first gas supply pipe 232a and the flow rate of the DCS gas is then adjusted by the MFC 241a. The $N_2$ gas flows through the first inert gas supply pipe 232j and the flow rate of the $N_2$ gas is then adjusted by the MFC 241j. The DCS gas having the adjusted flow rate is mixed with the $N_2$ gas having the adjusted flow rate in the first gas supply pipe 232a, and the mixed gas of the DCS gas and the $N_2$ gas is supplied into the heated and reduced-pressure process chamber 201 via the gas supply holes 248a of the first nozzle 233a and exhausted via the exhaust pipe 231. In this case, the DCS gas is supplied to the wafer 200 (DCS gas supply process).

In this case, in order to prevent the DCS gas from being supplied into the buffer chambers 237b and 237c, the second nozzle 233b, or the third nozzle 233c, $N_2$ gas is supplied into the second inert gas supply pipe 232k, the third inert gas supply pipe 232l, the fourth inert gas supply pipe 232m, the fifth inert gas supply pipe 232n, the sixth inert gas supply pipe 232o, the seventh inert gas supply pipe 232p, the eighth gas supply pipe 232h, and the ninth gas supply pipe 232i by opening the valves 243k, 243l, 243m, 243n, 243o, 243p, 243h, and 243i. The $N_2$ gas is supplied into the process chamber 201 via the second gas supply pipe 232b, the third gas supply pipe 232c, the fourth gas supply pipe 232d, the fifth gas supply pipe 232e, the sixth gas supply pipe 232f, the seventh gas supply pipe 232g, the eighth gas supply pipe 232h, the ninth gas supply pipe 232i, the second nozzle 233b, the third nozzle 233c, and the buffer chambers 237b and 237c, and is exhausted via the exhaust pipe 231.

In this case, the pressure in the process chamber 201 is maintained constant to be less than atmospheric pressure, e.g., to fall within a range from 10 to 1,000 Pa, by appropriately controlling the APC valve 244. The flow rate of the DCS gas is controlled by the MFC 241a, for example, to fall within a range of 100 to 2,000 seem (0.01 to 2 slm). The flow rate of the $N_2$ gas is controlled by each of the MFCs 241j, 241k, 241l, 241m, 241n, 241o, 241p, 241h, and 241i, for example, to fall within a range of 100 to 2,000 sccm (0.1 to 2 slm). A time period in which the DCS gas is supplied to the wafer 200, i.e., a gas supply time (irradiation time), is set to range, for example, from 1 to 120 seconds. The temperature of the heater 207 is set to generate a CVD reaction in the process chamber 201 under the pressure described above. That is, the temperature of the heater 207 is set in such a manner that the wafer 200 may have a temperature ranging from, for example, 300 to 650° C., preferably 300 to 600° C., and more preferably, 300 to 550° C.

If the temperature of the wafer 200 is less than 300° C., then it is difficult for the DCS gas to be decomposed on or adsorbed onto the wafer 200, thereby reducing a film-forming speed. Also, if the temperature of the wafer 200 is less than 300° C., then even when the DCS gas is decomposed on or adsorbed onto the wafer 200, the amount of decomposition or the amount of adsorption may vary according to a region in a plane of the wafer 200 or the position of the wafer 200. Thus, the DCS gas is not evenly decomposed or adsorbed in the plane of the wafer 200 or between adjacent wafers 200. Accordingly, the temperature of the wafer 200 may be set to be equal to or greater than 300° C.

If the temperature of the wafer 200 is greater than 600° C., a vapor-phase reaction may prevail. In particular, if the temperature of the wafer 200 is greater than 650° C., film thickness uniformity is likely to be degraded, thereby preventing the film thickness uniformity from being controlled. Thus, the film thickness uniformity may be controlled not to be degraded and the vapor-phase reaction may be prevented from prevailing by controlling the temperature of the wafer 200 to be 600° C. or less. In particular, when the temperature of the wafer 200 is controlled to be 550° C. or less, a surface reaction may prevail and the film thickness uniformity may thus be easily secured and controlled.

As described above, the temperature of the wafer 200 may be set to 300 to 650° C., preferably to 300 to 600° C., and more preferably, to 300 to 550° C.

Under the conditions described above, i.e., conditions of causing a CVD reaction, the DCS gas is supplied into the process chamber 201 to form a silicon-containing layer on the wafer 200 (an underlying film formed on the wafer 200) to a thickness of less than one atomic layer to several atomic layers. The silicon-containing layer may include at least one of an adsorption layer of DCS gas and a silicon (Si) layer. However, the silicon-containing layer may preferably include silicon (Si) and chlorine (Cl).

Here, the silicon layer generally refers to all layers including continuous layers formed of silicon (Si), discontinuous layers formed of silicon (Si), or a silicon thin film formed by overlapping the continuous layers and the discontinuous layers. The continuous layers formed of silicon (Si) may also be referred to together as a silicon thin film. Also, silicon (Si) used to form the silicon layer should be understood as including silicon (Si) from which a bond with chlorine (Cl) or hydrogen (H) is not completely separated.

Examples of the adsorption layer of DCS gas include not only continuous chemical adsorption layers including gas molecules of DCS gas but also discontinuous chemical adsorption layers including gas molecules of DCS gas. That is, the adsorption layer of DCS gas includes a chemical adsorption layer formed of DCS molecules to a thickness of one or less than one molecular layer. Also, examples of DCS ($SiH_2Cl_2$) molecules of the adsorption layer of DCS gas may include molecules, e.g., $SiH_xCl_y$ mocules, in which a bond between silicon (Si) and chlorine (Cl) or between silicon (Si) and hydrogen (H) is partially separated. That is, examples of the adsorption layer of DCS gas include continuous or discontinuous chemical adsorption layers including $SiH_2Cl_2$ molecules and/or $SiH_xCl_y$ molecules. Also, a layer having a thickness of less than one atomic layer means a discontinuously formed atomic layer, and a layer having a thickness of one atomic layer means a continuously formed atomic layer. A layer having a thickness of less than one molecular layer means a discontinuously formed molecular layer, and a layer having a thickness of one molecular layer means a continuously formed molecular layer.

Silicon (Si) is deposited on the wafer 200 to form a silicon layer on the wafer 200 under conditions in which DCS gas is self-decomposed (pyrolyzed), i.e., conditions causing a pyrolysis reaction of the DCS gas. The DCS gas is adsorbed onto the wafer 200 to form an adsorption layer of DCS gas on the wafer 200 under conditions in which DCS gas is not self-decomposed (pyrolyzed), i.e., conditions that do not cause a pyrolysis reaction of the DCS gas. A film-forming rate may be higher when the silicon layer is formed on the wafer 200 than when the adsorption layer of DCS gas is formed on the wafer 200.

If the thickness of the silicon-containing layer formed on the wafer 200 exceeds a thickness of several atomic layers, then a desorption action of chlorine (Cl) does not have an effect on the entire silicon-containing layer in Step 3a which will be described below, a nitriding action or a desorption action of chlorine (Cl) does not have an effect on the entire silicon-containing layer in Step 4a which will be described below, and a desorption action of chlorine (Cl) does not have an effect on the entire silicon-containing layer in Step 6a which will be described below. The silicon-containing layer that may be formed on the wafer 200 may have a minimum thickness of less than one atomic layer. Thus, the silicon-containing layer may be set to have a thickness of less than one atomic layer to several atomic layers. Also, by controlling the silicon-containing layer to have a thickness not more than one atomic layer, i.e., a thickness of less than one atomic layer or of one atomic layer, the nitriding action or the desorption action of chlorine (Cl) in Steps 3a, 4a, and 6a (which will be described below) may be relatively increased, and a time required for the nitriding action or the desorption action of chlorine (Cl) in Steps 3a, 4a, and 6a may thus be reduced. Also, a time required to form the silicon-containing layer in Step 1a may be reduced. Accordingly, a process time required to perform each cycle may be reduced, and a process time required to perform a total of cycles may thus be reduced. That is, a film-forming rate may be increased. Also, film thickness uniformity may be controlled to be increased by controlling the silicon-containing layer to have a thickness of one atomic layer or less.

In addition to dichlorosilane ($SiH_2Cl_2$, abbreviated to DCS), a chlorosilane-based material, e.g., monochlorosilane ($SiH_3Cl$, abbreviated to MCS), hexachlorodisilane ($Si_2Cl_6$, abbreviated to HCD), tetrachlorosilane, i.e., silicon tetrachloride ($SiCl_4$, abbreviated to STC), trichlorosilane ($SiHCl_3$, abbreviated to TCS); an inorganic material, e.g., trisilane ($Si_3H_8$, abbreviated to TS), disilane ($Si_2H_6$, abbreviated to DS), monosilane ($SiH_4$, abbreviated to MS); or an organic material, such as an aminosilane-based material, e.g., tetrakisdimethylaminosilane ($Si[N(CH_3)_2]_4$, abbreviated to 4DMAS), trisdimethylaminosilane ($Si[N(CH_3)_2]_3H$, abbreviated to 3DMAS), bisdiethylaminosilane ($Si[N(C_2H_5)_2]_2H_2$, abbreviated to 2DEAS), or bistertiarybutylaminosilane ($SiH_2[NH(C_4H_9)]_2$, abbreviated to BTBAS), may be used as a source containing silicon, i.e., a silane-based material. However, when a chlorosilane-based material including chlorine (Cl) is used, a material having a composition formula having a small number of chlorine (Cl) atoms is preferably used. For example, DCS or MCS may be used. In addition to $N_2$ gas, a rare gas, e.g., Ar gas, He gas, Ne gas, or Xe gas, may be used as the inert gas.

[Step 2a]

After the silicon-containing layer is formed on the wafer 200, the valve 243a of the first gas supply pipe 232a is closed to suspend supplying of the DCS gas. In this case, the inside of the process chamber 201 is exhausted via the vacuum pump 246 while the APC valve 244 of the exhaust pipe 231 is open, so as to exclude an unreacted or residual DCS gas remaining in the process chamber 201 after the silicon-containing layer is formed, from the process chamber 201. The $N_2$ gas is continuously supplied as an inert gas into the process chamber 201 while the valves 243j, 243k, 243l, 243m, 243n, 243o, 243p, 243h, and 243i are open. The $N_2$ gas acts as a purge gas to guarantee the excluding of the unreacted or residual DCS gas remaining in the process chamber 201 after the silicon-containing layer is formed, from the process chamber 201 (first purging process).

Alternatively, the residual gas may not be completely excluded from the process chamber 201 and the inside of the process chamber 201 may not be completely purged. When the amount of the residual gas remaining in the process chamber 201 is small, Step 3a performed thereafter may not be negatively influenced by the residual gas. In this case, the flow rate of the $N_2$ gas supplied into the process chamber 201 need not be high. For example, the inside of the process chamber 201 may be purged by supplying an amount of $N_2$ gas that corresponds to the capacity of the reaction pipe 203 (or the process chamber 201) without causing negative influence in Step 3a. As described above, the inside of the process chamber 201 may not be completely purged to reduce a purging time, thereby improving the throughput. Also, unnecessary consumption of the $N_2$ gas may be suppressed.

In this case, the temperature of the heater 207 is set such that the temperature of the wafer 200 may fall within a range of 300 to 650° C., preferably, a range of 300 to 600° C., and more preferably, a range of 300 to 550° C., similar to the temperature of the wafer 200 when the DCS gas is supplied thereto. The supply flow rate of the $N_2$ gas supplied as a purge gas via each inert gas supply system may range, for example, from 100 to 2,000 sccm (0.1 to 2 slm). Alternatively, a rare gas, e.g., Ar gas, He gas, Ne gas, or Xe gas, may be used as the purge gas, instead of $N_2$ gas.

[Step 3a]

After the residual gas is removed from the process chamber 201, $H_2$ gas is simultaneously excited into a plasma state by the two plasma generation units (excitation units) and the results of plasma-exciting $H_2$ gas are then simultaneously supplied into the process chamber 201 from the two plasma generation units (excitation units), thereby modifying the silicon-containing layer (first modifying process)

Specifically, $H_2$ gas is supplied into the fourth gas supply pipe 232d by opening the valve 243d of the fourth gas supply pipe 232d. The $H_2$ gas flows through the fourth gas supply pipe 232d and the flow rate of the $H_2$ gas is then adjusted by the MFC 241d. The $H_2$ gas having the adjusted flow rate passes through the second gas supply pipe 232b and is then supplied into the buffer chamber 237b via the gas supply holes 248b of the second nozzle 233b. In this case, the $H_2$ gas supplied into the buffer chamber 237b is excited to a plasma state by supplying high-frequency power between the first rod-shaped electrode 269b and the second rod-shaped electrode 270b from the high-frequency power source 273 via the impedance matching unit 272, is supplied as an excited species, i.e., an active species of hydrogen ($H_2$*) into the process chamber 201 via the gas supply holes 238b, and is exhausted via the exhaust pipe 231. In this case, the plasma-excited $H_2$ gas is supplied to the wafer 200. At the same time, $N_2$ gas is supplied into the fourth inert gas supply pipe 232m by opening the valve 243m. The $N_2$ gas is supplied into the process chamber 201 together with the $H_2$ gas, and is exhausted via the exhaust pipe 231.

Also, at the same time, $H_2$ gas is supplied into the fifth gas supply pipe 232e by opening the valve 243e of the fifth gas supply pipe 232e. The $H_2$ gas flows through the fifth gas supply pipe 232e and the flow rate of $H_2$ gas is adjusted by the MFC 241e. The $H_2$ gas having the adjusted flow rate passes through the third gas supply pipe 232c, and is then supplied into the buffer chamber 237c via the gas supply holes 248c of the third nozzle 233c. In this case, the $H_2$ gas supplied into the buffer chamber 237c is excited to a plasma state by supplying high-frequency power between the first rod-shaped electrode 269c and the second rod-shaped electrode 270c from the high-frequency power source 273 via the impedance matching unit 272, is supplied as an excited species ($H_2$*) into the process chamber 201 via the gas supply holes 238c, and is exhausted via the exhaust pipe 231. In this case, the plasma-excited $H_2$ gas is supplied to the wafer 200. At the same time, $N_2$ gas is supplied into the fifth inert gas supply pipe 232n by opening the valve 243n. The $N_2$ gas is supplied into the process chamber 201 together with the $H_2$ gas, and is exhausted via the exhaust pipe 231.

In this case, in order to prevent the $H_2$ gas from being supplied to the first nozzle 233a, an upstream side of the second gas supply pipe 232b, an upstream side of the third gas supply pipe 232c, the sixth gas supply pipe 232f, the seventh gas supply pipe 232g, the eighth gas supply pipe 232h, and the ninth gas supply pipe 232i, $N_2$ gas is supplied into the first inert gas supply pipe 232j, the second inert gas supply pipe 232k, the third inert gas supply pipe 232l, the sixth inert gas supply pipe 232o, the seventh inert gas supply pipe 232p, the eighth gas supply pipe 232h, and the ninth gas supply pipe 232i by opening the valves 243j, 243k, 243l, 243o, 243p, 243h, and 243i. The $N_2$ gas is supplied into the process chamber 201 via the first gas supply pipe 232a, the second gas supply pipe 232b, the third gas supply pipe 232c, the sixth gas supply pipe 232f, the seventh gas supply pipe 232g, the eighth gas supply pipe 232h, the ninth gas supply pipe 232i, the first nozzle 233a, the second nozzle 233b, the third nozzle 233c, and the buffer chambers 237b and 237c, and is exhausted via the exhaust pipe 231.

When the $H_2$ gas is plasma-excited and is supplied as an excited species, the pressure in the process chamber 201 is set, e.g., to fall within a range from 10 to 1,000 Pa, by appropriately controlling the APC valve 244. The supply flow rate of the $H_2$ gas is adjusted by each of the MFCs 241d and 241e to range, for example, from 100 to 10,000 sccm (0.1 to 10 slm). The supply flow rate of the $N_2$ gas is adjusted by each of the MFCs 241m, 241n, 241j, 241k, 241l, 241o, 241p, 241h and 241i to range, for example, from 100 to 2,000 sccm (0.1 to 2 slm). A time period in which the excited species obtained by plasma-exciting the $H_2$ gas are supplied to the wafer 200, i.e., a gas supply time (irradiation time), is set to range, for example, from 1 to 120 seconds. When the throughput is considered, the temperature of the heater 207 may be preferably set to be the same as when the DCS gas is supplied in step 1a, that is, the temperature in the process chamber 201 in Steps 1a through 3a may be preferably maintained to be the same as when the DCS gas is supplied in step 1a. In this case, the temperature of the heater 207 may be preferably set so that the temperature of the wafer 200, i.e., the temperature in the process chamber 201, in Steps 1a through 3a may be maintained constant to fall within a range of 300 to 650° C., preferably, a range of 300 to 600° C., and more preferably, 300 to 550° C. Also, the temperature of the heater 207 may be more preferably set so that the temperature in the process chamber 201 may be maintained constant as described above from Step 1a through Step 6a (which will be described below). The high-frequency power supplied between the first and second rod-shaped electrode 269b and 270b and between the first and second rod-shaped electrode 269c and 270c from the high-frequency power source 273 is set to, for example, fall within a range of 50 to 1,000 W.

The excited species of hydrogen ($H_2$) supplied into the process chamber 201 by exciting $H_2$ gas to a plasma state under the conditions described above reacts with at least a portion of the silicon-containing layer formed on the wafer 200 in Step 1a. Thus, impurities contained in the silicon-containing layer, e.g., hydrogen (H) or chlorine (Cl), may be efficiently desorbed from the silicon-containing layer, thereby forming the silicon-containing layer having a very low concentration of impurities. Also, by efficiently desorbing chlorine (Cl) from the silicon-containing layer, the efficiency of a nitriding process in Step 4a which will be described below may be improved. In other words, the efficiency of the nitriding process in Step 4a may be improved by efficiently desorbing chlorine (Cl), which is a factor degrading the performance of the nitriding process, from the silicon-containing layer. A process of modifying the silicon-containing layer is performed as described above. Also, the impurities, e.g., hydrogen (H) or chlorine (Cl), desorbed from the silicon-containing layer are exhausted outside the process chamber 201 via the exhaust pipe 231.

In Step 3a, by using the plurality of plasma generation units (excitation units), the supply rate of the excited species to the wafer 200 may be increased while reducing plasma outputs of respective plasma generation units (excitation units) by reducing the amounts of high-frequency power to be supplied to the plasma generation units (excitation units). Thus, the supply rate of the excited species to the wafer 200 may be increased while suppressing plasma damage to the wafer 200 or the silicon-containing layer.

Accordingly, the supply rate of the excited species to the wafer 200 may be increased while suppressing plasma damage to the wafer 200 or the silicon-containing layer, the efficiency of removing impurities may be increased, and the concentration of impurities in the silicon-containing layer may be lowered. As a result, a process time may be reduced. Also, the concentration of impurities in a plane of the wafer 200 may be uniformly lowered. In other words, the excited species may be more evenly supplied to all regions in the plane of the wafer 200. For example, the difference between the concentration of impurities near the circumference of the wafer 200 and the concentration of impurities at the center of the wafer 200 may be controlled not to be large.

[Step 4a]

After the silicon-containing layer is modified, $NH_3$ gas is simultaneously excited to a plasma state by the two plasma generation units (excitation units) and the results of plasma-exciting the $NH_3$ gas are simultaneously supplied into the process chamber 201 from the two plasma generation units (excitation units), thereby nitriding the modified silicon-containing layer ($NH_3$ gas supply process).

Specifically, $NH_3$ is supplied into the second gas supply pipe 232b by opening the valve 243b of the second gas supply pipe 232b. The $NH_3$ gas flows through the second gas supply pipe 232b and the flow rate of the $NH_3$ gas is adjusted by the MFC 241b. The $NH_3$ gas having the adjusted flow rate is supplied into the buffer chamber 237b via the gas supply holes 248b of the second nozzle 233b. In this case, the $NH_3$ gas supplied into the buffer chamber 237b is excited to a plasma state by supplying high-frequency power between the first rod-shaped electrode 269b and the second rod-shaped electrode 270b from the high-frequency power source 273 via the impedance matching unit 272, is supplied as an excited species ($NH_3$*) into the process chamber 201 via the gas supply holes 238b, and is exhausted via the exhaust pipe 231. In this case, the plasma-excited $NH_3$ gas is supplied to the wafer 200. At the same time, $N_2$ gas is supplied into the second inert gas supply pipe 232k by opening the valve 243k. The $N_2$ gas is supplied into the process chamber 201 together with the $NH_3$ gas, and is exhausted via the exhaust pipe 231.

Also, at the same time, $NH_3$ gas is supplied into the third gas supply pipe 232c by opening the valve 243c of the third gas supply pipe 232c. The $NH_3$ gas flows through the third gas supply pipe 232c and the flow rate of the $NH_3$ gas is adjusted by the MFC 241c. The $NH_3$ gas having the adjusted flow rate is supplied into the buffer chamber 237c via the gas supply holes 248c of the third nozzle 233c. In this case, the $NH_3$ gas supplied into the buffer chamber 237c is excited to a plasma state by supplying high-frequency power between the first rod-shaped electrode 269c and the second rod-shaped electrode 270c from the high-frequency power source 273 via the impedance matching unit 272, is supplied as an excited species ($NH_3$*) into the process chamber 201 via the gas supply holes 238c, and is exhausted via the exhaust pipe 231. In this case, the plasma-excited $NH_3$ gas is supplied to the wafer 200. At the same time, $N_2$ gas is supplied into the third inert gas supply pipe 232l by opening the valve 243l. The $N_2$ gas is supplied into the process chamber 201 together with the $NH_3$ gas, and is exhausted via the exhaust pipe 231.

In this case, in order to prevent the $NH_3$ gas from being supplied to the first nozzle 233a, the fourth gas supply pipe 232d, the fifth gas supply pipe 232e, the sixth gas supply pipe 232f, the seventh gas supply pipe 232g, the eighth gas supply pipe 232h, and the ninth gas supply pipe 232i, $N_2$ gas is supplied into the first inert gas supply pipe 232j, the fourth inert gas supply pipe 232m, the fifth inert gas supply pipe 232n, the sixth inert gas supply pipe 232o, the seventh inert gas supply pipe 232p, the eighth gas supply pipe 232h, and the ninth gas supply pipe 232i by opening the valves 243j, 243m, 243n, 243o, 243p, 243h, and 243i. The $N_2$ gas is supplied into the process chamber 201 via the first gas supply pipe 232a, the fourth gas supply pipe 232d, the fifth gas supply pipe 232e, the sixth gas supply pipe 232f, the seventh gas supply pipe 232g, the eighth gas supply pipe 232h, the ninth gas supply pipe 232i, the first nozzle 233a, the second nozzle 233b, the third nozzle 233c, and the buffer chambers 237b and 237c, and is exhausted via the exhaust pipe 231.

When the $NH_3$ gas is plasma-excited and is supplied as an excited species, the pressure in the process chamber 201 is set, e.g., to fall within a range of 10 to 1,000 Pa, by appropriately controlling the APC valve 244. The supply flow rate of the $NH_3$ gas is adjusted by each of the MFCs 241b and 241c to range, for example, from 1,000 to 10,000 sccm (1 to 10 slm). The supply flow rate of the $N_2$ gas is adjusted by each of the MFCs 241k, 241l, 241j, 241m, 241n, 241o, 241p, 241h, and 241i to range, for example, from 100 to 2,000 sccm (0.1 to 2 slm). A time period in which the excited species obtained by plasma-exciting the $NH_3$ gas is supplied to the wafer 200, i.e., a gas supply time (irradiation time), is set to range, for example, from 1 to 120 seconds. When the throughput is considered, the temperature of the heater 207 may be a temperature at which the silicon-containing layer is nitrided, and may be preferably set to be the same as when the DCS gas is supplied in step 1a, that is, the temperature in the process chamber 201 in Steps 1a through 4a may be preferably maintained to be the same, In this case, the temperature of the heater 207 may be preferably set so that the temperature of the wafer 200, i.e., the temperature in the process chamber 201, in Steps 1a through 4a may be maintained constant to fall within a range of 300 to 650° C., preferably, a range of 300 to 600° C., and more preferably, 300 to 550° C. Also, the temperature of the heater 207 may be more preferably set so that the temperature in the process chamber 201 may be maintained to be the same from Step 1a through Step 6a (which will be described below), as described above. The high-frequency power supplied between the first and second rod-shaped electrode 269b and 270b and between the first and second rod-shaped electrode 269c and 270c from the high-frequency power source 273 is set, for example, to fall within a range of 50 to 1,000 W. In this case, the $NH_3$ gas may be thermally excited, i.e., activated by heat, and may then be supplied. However, when the thermally activated $NH_3$ gas is supplied under a reduced-pressure atmosphere, the pressure in the process chamber 201 should be relatively high, for example, to fall within a range of 10 to 3,000 Pa, and the temperature of the wafer 200 should be 550° C. or higher so as to obtain a sufficient nitriding power. In this case, when $NH_3$ gas is plasma-excited and then supplied, a sufficient nitriding power may be obtained even when the temperature in the process chamber 201 is, for example, 300° C. or higher. Also, when the $NH_3$ gas is plasma-excited and is then supplied, a sufficient nitriding power may be obtained even when the temperature in the process chamber 201 is set to room temperature. However, when the temperature in the process chamber 201 is less than 150° C., reacted by-products, such as ammonium chloride ($NH_4Cl$), are adhered into the process chamber 201 or onto the wafer 200. Thus, the temperature in the process chamber 201 is preferably 150° C. or higher, and is set to be 300° C. or higher in the present embodiment.

The excited species ($NH_3^*$) supplied into the process chamber 201 by exciting $NH_3$ gas to a plasma state under the conditions described above reacts with at least a portion of the silicon-containing layer that is formed on the wafer 200 in Step 1a and from which impurities are removed in Step 3a. Thus, the silicon-containing layer is nitrided to be changed (modified) into a silicon nitride ($Si_3N_4$) layer (hereinafter referred to simply as 'SiN layer').

In Step 4a, by using a plurality of plasma generation units (excitation units), the supply rate of the excited species to the wafer 200 may be increased while reducing plasma outputs of the respective plasma generation units (excitation units) by reducing the amounts of high-frequency power supplied to each of the plasma generation units (excitation units). Thus, the supply rate of the excited species to the wafer 200 may be increased while suppressing plasma damage to the wafer 200 or the silicon-containing layer.

Accordingly, the supply rate of the excited species to the wafer 200 may be increased while suppressing plasma damage to the wafer 200 or the silicon-containing layer, and the nitriding power may be increased to promote the nitriding of the silicon-containing layer. In other words, the efficiency of nitriding may be increased. Also, the nitriding of the silicon-containing layer may saturate to be rapidly changed to a self-limiting state (nitrided state), thereby reducing a nitriding time. As a result, a process time may be reduced, and uniformity of the result of nitriding the silicon-containing layer in a plane of the wafer 200 may be improved. That is, the excited species may be uniformly supplied to all regions in the plane of the wafer 200. For example, the difference between the degrees of nitriding performed near the circumference of the wafer 200 and at the center of the wafer 200 may be controlled not to be large.

Also, the plurality of plasma generation units may be used to increase the supply rate of the excited species to the wafer 200 while suppressing plasma damage to the wafer 200 or the silicon-containing layer, and chlorine (Cl) may be more effectively desorbed from the silicon-containing layer having a low concentration of chlorine (Cl), which is formed in Step 1a and from which impurities are removed in Step 3a. Therefore, a SiN layer having very low concentration of chlorine (Cl) may be formed. Also, the efficiency of nitriding the silicon-containing layer may be greatly improved by effectively desorbing chlorine (Cl) from the silicon-containing layer. That is, the efficiency of the nitriding may be greatly improved by effectively desorbing chlorine (Cl), which is a factor degrading the performance of the nitriding process, from the silicon-containing layer. The chlorine (Cl) desorbed from the silicon-containing layer is exhausted from the process chamber 201 via the exhaust pipe 231.

Diazene ($N_2H_2$) gas, hydrazine ($N_2H_4$) gas, $N_3H_8$ gas, or the like may be used as a nitrogen-containing gas, instead of $NH_3$ gas. Otherwise, an amine-based gas, such as ethylamine or methylamine, may be used as the nitrogen-containing gas, instead of $NH_3$ gas.

[Step 5a]

After the silicon-containing layer is changed into the SiN layer, the supply of the $NH_3$ gas is suspended by closing the valve 243b of the second gas supply pipe 232b and the valve 243c of the third gas supply pipe 232c. In this case, the inside of the process chamber 201 is vacuum-exhausted by the vacuum pump 246 while the APC valve 244 of the exhaust pipe 231 is open, so as to exclude unreacted or residual $NH_3$ gas remaining in the process chamber 201 after the SiN layer is formed, from the process chamber 201. The $N_2$ gas is continuously supplied as an inert gas into the process chamber 201 while the valves 243k, 243l, 243j, 243m, 243n, 243o, 243p, 243h, and 243i are open. The $N_2$ gas acts as a purge gas to guarantee the exclusion of the unreacted or residual $NH_3$ gas remaining in the process chamber 201 after the SiN layer is formed, from the process chamber 201 (second purging process).

Alternatively, the residual gas may not be completely excluded from the process chamber 201 and the inside of the process chamber 201 may not be completely purged. When the amount of the residual gas remaining in the process chamber 201 is small, Step 6a performed thereafter may not be negatively influenced by the residual gas. In this case, the flow rate of the $N_2$ gas supplied into the process chamber 201 need not be high. For example, the inside of the process chamber 201 may be purged by supplying an amount of $N_2$ gas that corresponds to the capacity of the reaction pipe 203 (or the process chamber 201) without causing negative influence in Step 6a. As described above, the inside of the process chamber 201 may not be completely purged to reduce a purging time, thereby improving the throughput. Also, unnecessary consumption of the $N_2$ gas may be suppressed.

In this case, the temperature of the heater 207 is set such that the temperature of the wafer 200 may fall within a range of 300 to 650° C., preferably, a range of 300 to 600° C., and more preferably, a range of 300 to 550° C., similar to the temperature of the wafer 200 when the $NH_3$ gas is supplied thereto. The supply flow rate of the $N_2$ gas supplied as a purge gas via each inert gas supply system may range, for example, from 100 to 2,000 sccm (0.1 to 2 slm). Alternatively, a rare gas, e.g., Ar gas, He gas, Ne gas, or Xe gas, may be used as the purge gas, instead of $N_2$ gas.

[Step 6a]

After the residual gas is removed from the process chamber 201, $H_2$ gas is simultaneously excited to a plasma state by the two plasma generation units (excitation units) according to the same order and conditions as in Step 3a (first modifying process) described above, and the plasma-excited $H_2$ gas is simultaneously supplied into the process chamber 201 from the two plasma generation units (excitation units), thereby modifying the SiN layer (second modifying process).

The excited species of hydrogen ($H_2$) supplied into the process chamber 201 by exciting $H_2$ gas to a plasma state react with at least a portion of the SiN layer formed on the wafer 200 in Step 4a. Thus, impurities contained in the SiN layer, e.g., hydrogen (H) or chlorine (Cl), may be efficiently desorbed from the SiN layer. That is, hydrogen or chlorine may be more efficiently desorbed from the SiN layer having a low concentration of hydrogen/chlorine, which is formed by desorbing impurities therefrom in Steps 3a and 4a. Thus, the SiN layer having a very low concentration of impurities may be formed. Accordingly, the SiN layer is modified as described above. The impurities, e.g., hydrogen or chlorine, which are desorbed from the SiN layer are exhausted from the process chamber 201 via the exhaust pipe 231.

In Step 6a, by using a plurality of plasma generation units (excitation units), the supply rate of the excited species to the wafer 200 may be increased while reducing plasma outputs of respective plasma generation units (excitation units) by reducing the amounts of high-frequency power supplied to each of the plasma generation units (excitation units). Thus, the supply rate of the excited species to the wafer 200 may be increased while suppressing plasma damage to the wafer 200 or the SiN layer.

Accordingly, the supply rate of the excited species to the wafer 200 may be increased while suppressing plasma damage to the wafer 200 or the SiN layer, the efficiency of removing impurities may be increased, and the concentration of impurities in the SiN layer may be lowered. As a result, a process time may be reduced. Also, the concentration of impurities in a plane of the wafer 200 may be uniformly lowered. In other words, the excited species may be more evenly supplied to all regions in the plane of the wafer 200. For example, the difference between the concentration of impurities near the circumference of the wafer 200 and the concentration of impurities at the center of the wafer 200 may be controlled not to be large.

A silicon nitride ($Si_3N_4$) film (hereinafter referred to simply as 'SiN film') may be formed on the wafer 200 to a desired thickness by performing one cycle including Steps 1a through 6a described above a predetermined number of times, and preferably, several times.

Here, the expression 'when the cycle described above is repeatedly performed, a specific gas is supplied to the wafer 200 in each step after the cycle is performed at least twice' means 'a specific gas is supplied to a layer formed on the wafer 200, i.e., on the uppermost surface of the wafer 200 as a stacked structure.' The expression 'a specific layer is formed on the wafer 200' means 'a specific layer is formed on a layer formed on the wafer 200, i.e., on the uppermost surface of the wafer 200 as a stacked structure. This also applies to the other embodiments which will be described below.

(Purging and Atmosphere Pressure Recovery)

After the SiN film is formed to a desired thickness, $N_2$ gas is supplied as an inert gas from each inert gas supply system into the process chamber 201 by opening the valves 243j, 243k, 243l, 243m, 243n, 243o, 243p, 243h, and 243i, and is exhausted via the exhaust pipe 231. The $N_2$ gas acts as a purge gas to purge the inside of the process chamber 201 with an inert gas, and the residual gas remaining in the process chamber 201 is thus removed (purged) from the process chamber 201. Thereafter, an atmosphere in the process chamber 201 is replaced with the inert gas, and the pressure in the process chamber 201 is returned to a normal pressure (atmosphere pressure recovery).

(Boat Unloading and Wafer Discharging)

Then, when the seal cap 219 is moved downward by the boat elevator 115, the lower end of the reaction pipe 203 is opened, and at the same time, the processed wafer 200 retained by the boat 217 is unloaded outside the reaction pipe 203 from the lower end of the reaction pipe 203 (boat unloading). Then, the processed wafer 200 is discharged by the boat 217 (wafer discharging).

(3) Effects of the Present Embodiment

According to the present embodiment, at least one of the following effects can be achieved.

(a) In Step 4a according to the present embodiment, a silicon-containing layer may be efficiently nitrided at a low temperature by supplying an excited species, which is obtained by plasma-exciting $NH_3$ gas, to the silicon-containing layer, thereby forming a SiN film at a low temperature. Also, impurities, such as hydrogen or chlorine, contained in the silicon-containing layer may be efficiently desorbed from the silicon-containing layer. As a result, a SiN film having a low concentration of impurities, i.e., having a high film density, may be formed, and the resistance of the SiN film to hydrogen fluoride may be improved. Also, the insulating properties of the SiN film may be improved.

(b) In Step 3a according to the present embodiment, impurities, such as hydrogen or chlorine, contained in a silicon-containing layer may be efficiently desorbed from the silicon-containing layer by supplying an excited species obtained by plasma-exciting $H_2$ gas to the silicon-containing layer. As a result, a SiN film having a lower concentration of impurities, i.e., having higher film density, may be formed at a low temperature, and the resistance of the SiN film to hydrogen fluoride may be greatly improved. Also, the insulating properties of the SiN film may be greatly improved.

(c) In Step 6a according to the present embodiment, impurities, such as hydrogen or chlorine, contained in a SiN layer may be efficiently desorbed from the SiN layer by supplying an excited species, which is obtained by plasma-exciting $H_2$ gas, to the SiN layer. As a result, a SiN film having a lower concentration of impurities, i.e., having higher film density, may be formed at a low temperature, and the resistance of the SiN film to hydrogen fluoride may be greatly improved. Also, the insulating properties of the SiN film may be greatly improved.

(d) In Steps 3a and 4a according to the present embodiment, the efficiency of the nitriding process performed in Step 4a may be improved by efficiently desorbing chlorine from the silicon-containing layer or the SiN layer. In other words, the efficiency of the nitriding process performed in Step 4a may be improved by efficiently desorbing chlorine, which is a factor degrading the performance of the nitriding process, from the silicon-containing layer or the SiN layer. Accordingly, a time needed to form the SiN film can be reduced, thereby increasing the yield.

(e) In Steps 3a, 4a, and 6a according to the present embodiment, by using a plurality of plasma generation units, the supply rate of an excited species to the wafer 200 may be increased while reducing plasma outputs of the respective plasma generation units (excitation units) by reducing the amounts of high-frequency power supplied to each of the plasma generation units (excitation units). Thus, the supply rate of an excited species to the wafer 200 may be increased while suppressing plasma damage to the wafer 200, the silicon-containing layer, or the SiN layer.

Thus, in Step 4a, nitriding power may be increased, and nitriding of the silicon-containing layer may be promoted. That is, the efficiency of the nitriding may be increased. Also, the nitriding of the silicon-containing layer may saturate to be rapidly changed to a self-limiting state (nitrided state), thereby reducing a nitriding time. As a result, a process time may be reduced. Also, uniformity of the result of nitriding the silicon-containing layer in a plane of the wafer 200 may be improved. That is, the excited species may be uniformly supplied to all regions in the plane of the wafer 200 using the plasma generation units. For example, the difference between the degrees of nitriding performed near the circumference of the wafer 200 and at the center of the wafer 200 may be controlled not to be large. Also, in Step 4a, chlorine may be further efficiently desorbed from the silicon-containing layer having a low concentration of chlorine, which is formed in Step 1a and from which impurities are removed in Step 3a. Thus, a SiN layer having very a low concentration of chlorine may be formed. Also, the efficiency of nitriding the silicon-containing layer may be greatly improved by efficiently desorbing chlorine therefrom. That is, the efficiency of nitriding the silicon-containing layer may be greatly improved by efficiently desorbing chlorine, which is a factor degrading the nitriding, from the silicon-containing layer.

Also, in Steps 3a and 6a, the efficiency of removing impurities from the silicon-containing layer or the SiN layer may be greatly improved, and the concentration of impurities in the SiN film may be greatly lowered. Also, the concentration of impurities in the SiN film in a plane of the wafer 200 may be improved. That is, an excited species may be greatly uniformly supplied to all regions in the plane of the wafer 200 using the plasma generation units. For example, the difference between the concentrations of impurities in the SiN film near the circumference of the wafer 200 and at the center of the wafer 200 may be controlled not to be large.

If only one plasma generation unit is used, a plasma output of the plasma generation unit should be increased to increase the supply rate of excited species to the wafer 200. However, since in this case, a range of plasmification becomes too large, even the wafer 200 may thus be exposed to plasma. Furthermore, serious damage (plasma damage) may be caused to the wafer 200 or the SiN film formed on the wafer 200. Also, sputtering may occur on the wafer 200 or the periphery of the wafer 200 due to plasma, thereby causing particles to be generated or degrading the quality of the SiN film. Also, the quality of the SiN film formed on the wafer 200 may be remarkably different near the circumference of the wafer 200 exposed to plasma than at the center of the wafer 200 that is not exposed to plasma.

To solve this problem, when a plurality of plasma generation units are used as in the present embodiment, the supply rate of an excited species to the wafer 200 may be increased while reducing plasma outputs of the respective plasma generation units.

(f) In the present embodiment, the same effect as when a number of times of rotating the wafer 200 (rotation speed thereof) is increased during forming of a film may be achieved using the plasma generation units, and thickness uniformity of the SiN film in a plane of the wafer 200 may be improved. In other words, in the film-forming sequence according to the current embodiment, DCS gas, $NH_3$ gas, or $H_2$ gas is intermittently supplied while rotating the wafer 200. However, in this sequence, a certain relationship is present between the number of times of rotating the wafer 200 and the thickness uniformity of the SiN film in a plane of the wafer 200. Specifically, when the number of times of rotating the wafer 200 (rotation speed thereof) is greater, more regions of the wafer 200 are covered when a gas is supplied once, thereby improving the thickness uniformity of the SiN film in the plane of the wafer 200. However, the upper limit of the number of times of rotating the wafer 200 is limited due to a vibration-preventing effect of the wafer 200. For example, there is a case in which the number of times of rotating the wafer 200 cannot be set to be greater than 3 rpm. To solve this problem, since in the present embodiment, two plasma generation units are used, the same effect as when the number of times of rotating the wafer 200 doubles may be achieved, and the thickness uniformity of the SiN film in the plane of the wafer 200 may be improved. This effect is particularly effective when the SiN film is formed as a thin film having a thickness of, for example, 50 Å or less.

(g) As described above, in the film-forming sequence according to the present embodiment, a SiN film having a very low concentration of impurities, such as hydrogen or chlorine, i.e., having very high film density may be formed at a low temperature, for example, 550° C. or less. Thus, the resistance of the SiN film to hydrogen fluoride, and the insulating properties and quality of the SiN film may be improved. Also, a time needed to nitride and process the silicon-containing layer may be reduced by increasing the efficiency of nitriding the silicon-containing layer while suppressing plasma damage to the wafer 200, the silicon-containing layer, or the SiN layer, thereby increasing the throughput. Also, the quality and thickness uniformity of the SiN film in a plane of the wafer 200 may be improved by removing impurities from the SiN film or uniformly improving the degree of nitriding the SiN film in the plane of the wafer 200. Also, a probability that sterically hindered dangling bonds will occur during forming of a film may be reduced. Furthermore, natural oxidation of the SiN film may be suppressed due to a low concentration of chlorine in the SiN film, during transfer of the wafer 200, e.g., boat unloading.

When a SiN film was formed according to the film-forming sequence according to the present embodiment, it was confirmed that the density of the SiN film were much higher than when a SiN film was formed by alternately supplying DCS gas and $NH_3$ gas according to a conventional method. Thus, the density of the SiN film in a plane of the wafer 200 was very uniformly reduced. Also, when a SiN film was formed according to the film-forming sequence according to the present embodiment, it was confirmed that the concentration of impurities, such as chlorine, in the SiN film was far less than when a SiN film was formed by alternately supplying DCS gas and $NH_3$ gas according to a conventional method. Thus, the concentration of impurities in a plane of the wafer 200 was very uniformly reduced. Also, according to the film-forming sequence according to the present embodiment, an etching rate with respect to hydrogen fluoride was low even when a silicon source that did not contain chlorine atoms was used.

<Second Embodiment of the Present Invention>

Although in the first embodiment described above, a hydrogen-containing gas, e.g., $H_2$ gas, is used as a modifying gas during both the first and second modifying processes, the present invention is not limited thereto. For example, a hydrogen-containing gas, e.g., $H_2$ gas, may be used as a modifying gas in the first modifying process, and at least one of a rare gas, e.g., Ar gas or He gas, and $N_2$ gas may be used as a modifying gas in the second modifying process.

In the second embodiment of the present invention, a nitride film is formed on a substrate by performing one cycle a predetermined number of times, the cycle including supplying a source gas to a substrate, supplying a plasma-excited hydrogen-containing gas to the substrate, supplying a plasma-excited or thermally excited nitriding gas (nitrogen-containing gas) to the substrate, and supplying at least one of a plasma-excited nitrogen gas and a plasma-excited rare gas to the substrate.

Specifically, in a film-forming sequence according to the present embodiment, a SiN film is formed on the wafer 200 by performing one cycle a predetermined number of times, the cycle including supplying DCS gas to the wafer 200 in the process chamber 201 (DCS gas supply process), purging the process chamber 201 (first purging process), supplying plasma-excited $H_2$ gas to the wafer 200 in the process chamber 201 (first modifying process), supplying plasma-excited $NH_3$ gas to the wafer 200 in the process chamber 201 ($NH_3$ gas supply process), purging the process chamber 201 (second purging process), and supplying at least one of plasma-excited $N_2$ gas and plasma-excited Ar gas to the wafer 200 in the process chamber 201 (second modifying process). The film-forming sequence according to the present embodiment will now be described in greater detail.

Figure 6:
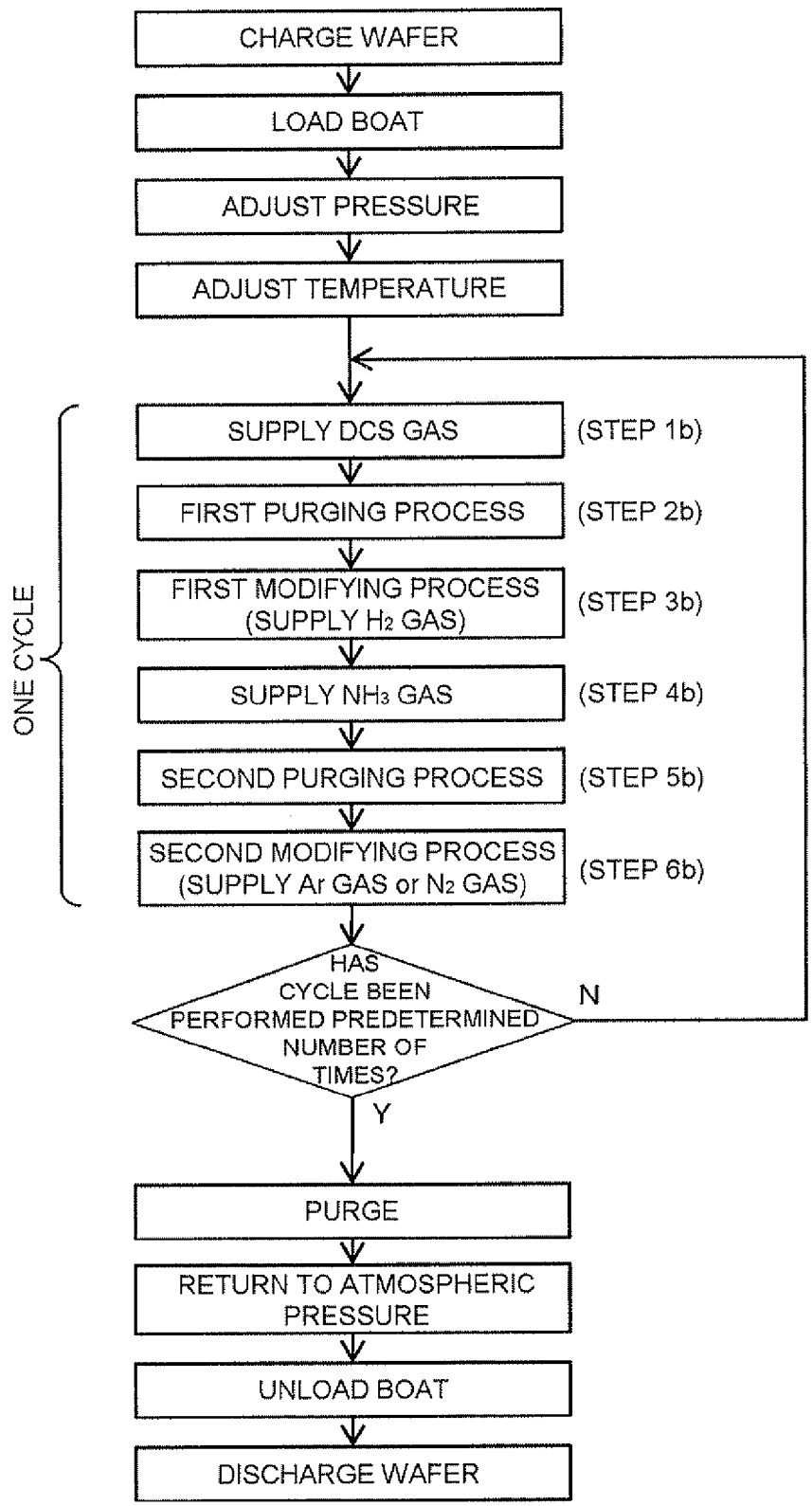
FIG. 6 is a flowchart illustrating a method of forming a film according to a second embodiment of the present invention.
Figure 11:
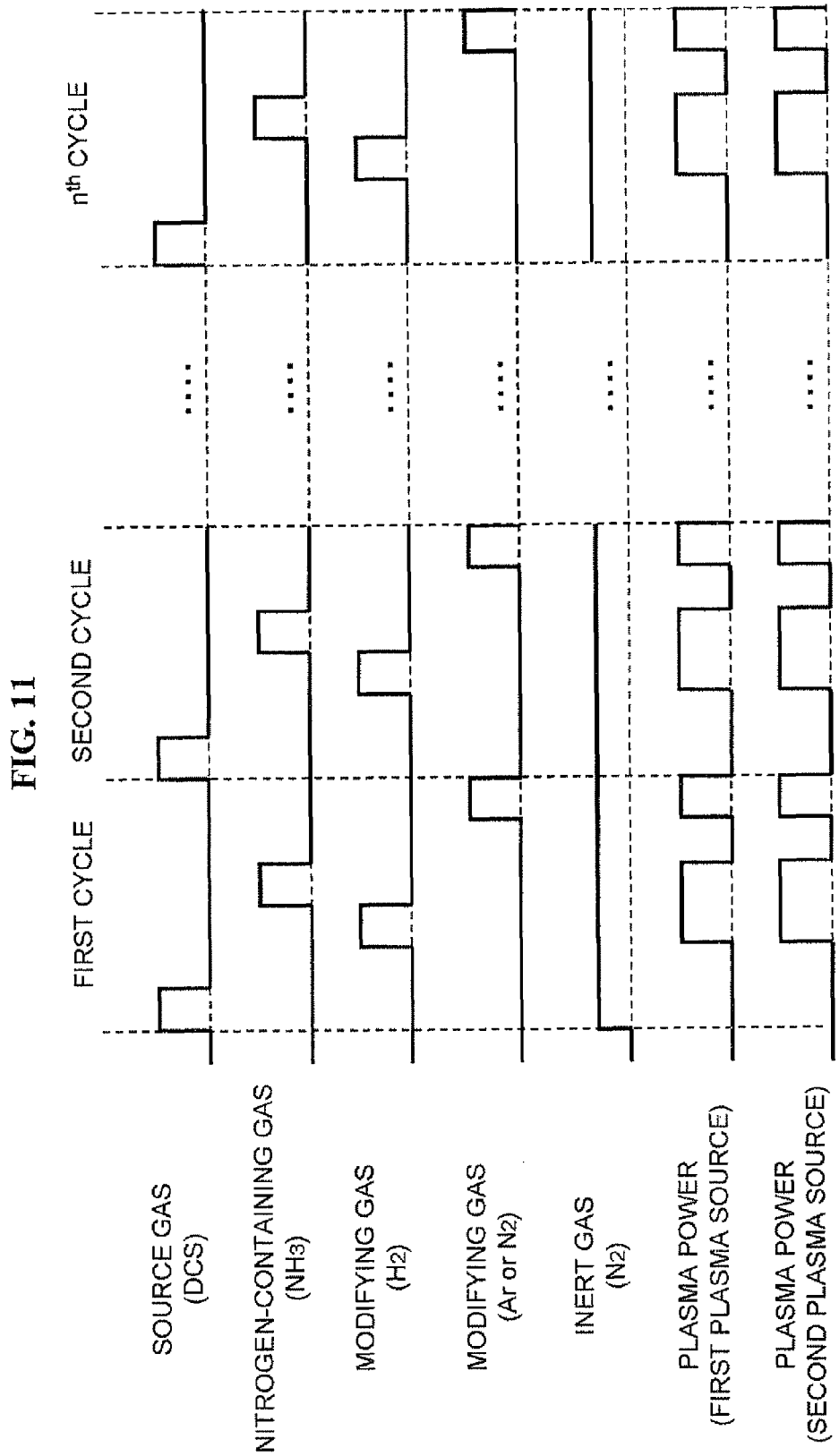
FIG. 11 is a diagram illustrating timing of supplying a gas and plasma power according to the second embodiment of the present invention.

FIG. 6 is a flowchart illustrating a method of forming a film according to the second embodiment of the present invention. FIG. 11 is a diagram illustrating timing of supplying a gas and plasma power according to the second embodiment of the present invention. FIGS. 6 and 11 illustrate cases in which $H_2$ gas is used as a modifying gas in a first modifying process, and Ar gas or $N_2$ gas is used as a modifying gas in a second modifying process. The film-forming sequence according to the present embodiment is the same as the film-forming sequence according to the first embodiment, except that Ar gas or $N_2$ gas is used as a modifying gas in the second modifying process. The second modifying process (Step 6b)

according to the present embodiment that is different from that in the first embodiment is described below.

(When Ar Gas is Used as a Modifying Gas)

In the second modifying process, if Ar gas is used as a modifying gas, then a SiN layer is performed on the wafer 200 by performing Steps 1b through 5b and residual gases remaining in the process chamber 201 are removed, similar to Steps 1a through 5a according to the first embodiment. Thereafter, the Ar gas is simultaneously excited to a plasma state by two plasma generation units (excitation units), and the plasma-excited Ar gas is simultaneously supplied into the process chamber 201 from the two plasma generation units (excitation units) to modify the SiN layer (second modifying process).

Specifically, Ar gas is supplied into the sixth gas supply, pipe 232f by opening the valve 243f of the sixth gas supply pipe 232f. The Ar gas flows through the sixth gas supply pipe 232f, and the flow rate of the Ar gas is adjusted by the MFC 241f. The Ar gas having the adjusted flow rate passes through the second gas supply pipe 232b, and is then supplied into the buffer chamber 237b via the gas supply holes 248b of the second nozzle 233b. In this case, the Ar gas supplied into the buffer chamber 237b is plasma-excited as an excited species (Ar*) by supplying high-frequency power between the first and second rod-shaped electrodes 269b and 270b from the high-frequency power source 273 via the impedance matching unit 272, and the excited species (Ar*) is supplied into the process chamber 201 via the gas supply holes 238b and exhausted via the exhaust pipe 231. In this case, the plasma-excited Ar gas is supplied to the wafer 200.

At the same time, Ar gas is supplied into the seventh gas supply pipe 232g by opening the valve 243g of the seventh gas supply pipe 232g. The Ar gas flows through the seventh gas supply pipe 232g, and the flow rate of the Ar gas is adjusted by the MFC 241g. The Ar gas having the adjusted flow rate passes through the third gas supply pipe 232c, and is then supplied into the buffer chamber 237c via the gas supply holes 248c of the third nozzle 233c. In this case, the Ar gas supplied into the buffer chamber 237c is plasma-excited as an excited species (Ar*) by supplying high-frequency power between the first and second rod-shaped electrodes 269c and 270c from the high-frequency power source 273 via the impedance matching unit 272, and the excited species (Ar*) is supplied into the process chamber 201 via the gas supply holes 238c and exhausted via the exhaust pipe 231. In this case, the plasma-excited Ar gas is supplied to the wafer 200.

In this case, in order to prevent the plasma-excited Ar gas from being supplied into the first nozzle 233a, $N_2$ gas is supplied into the first inert gas supply pipe 232j by opening the valve 243j. The $N_2$ gas is supplied into the process chamber 201 via the first gas supply pipe 232a and the first nozzle 233a, and is exhausted via the exhaust pipe 231.

In this case, when the excited species obtained by plasma-exciting the Ar gas is supplied, the pressure in the process chamber 201 is controlled, e.g., to fall within a range of 10 to 1,000 Pa, by appropriately controlling the APC valve 244, The supply flow rate of the Ar gas is controlled by each of the MFCs 241f and 241g, for example, to fall within a range of 100 to 10,000 sccm (0.1 to 10 slm). The supply flow rate of the $N_2$ gas is controlled by the MFC 241j, for example, to fall within a range of 100 to 2,000 sccm (0.1 to 2 slm), A time period in which the excited species obtained by plasma-exciting the Ar gas is supplied to the wafer 200, i.e., a gas supply time (irradiation time), is set to range, for example, from 1 to 120 seconds. When the throughput is considered, the temperature of the heater 207 is set to be the same as when the DCS gas is supplied in Step 1b, that is, the temperature of the wafer 200 (or the temperature in the process chamber 201) in Steps 1b through 6b may be maintained constant to fall within a range of 300 to 650° C., preferably, a range of 300 to 600° C., and more preferably, a range of 300 to 550° C., as in the first embodiment. The high-frequency power supplied from the high-frequency power source 273 between the first and second rod-shaped electrodes 269b and 270b and between the first and second rod-shaped electrodes 269c and 270c is set, for example, to fall within a range of 50 to 1,000 W.

Alternatively, a rare gas other than Ar gas, e.g., He gas, Ne gas, or Xe gas, may be used as the modifying gas. Among rare gases at least one of Ar gas and He gas is preferably used, and Ar gas is more preferably used.

(When $N_2$ Gas is Used as a Modifying Gas)

In the second modifying process, if $N_2$ gas is used as a modifying gas, then a SiN layer is formed on the wafer 200 by performing Steps 1b through 5b, similar to Steps 1a through 5a according to the first embodiment, and residual gases remaining in the process chamber 201 are removed. Thereafter, the $N_2$ gas is simultaneously excited to a plasma state by two plasma generation units (excitation units), and the plasma-excited $N_2$ gas is simultaneously supplied into the process chamber 201 from the two plasma generation units (excitation units) to modify the SiN layer (second modifying process).

Specifically, $N_2$ gas is supplied into the eighth gas supply pipe 232h by opening the valve 243h of the eighth gas supply pipe 232h. The $N_2$ gas flows through the eighth gas supply pipe, and the flow rate of the $N_2$ gas is adjusted by the MFC 241h. The $N_2$ gas having the adjusted flow rate flows through the second gas supply pipe 232b, and is then supplied into the buffer chamber 237b via the gas supply holes 248b of the second nozzle 233b. In this case, the $N_2$ gas supplied into the buffer chamber 237b is plasma-excited as an excited species ($N_2$*) by supplying high-frequency power between the first and second rod-shaped electrodes 269b and 270b from the high-frequency power source 273 via the impedance matching unit 272, and the excited species (Ar*) is supplied into the process chamber 201 via the gas supply holes 238b and exhausted via the exhaust pipe 231. In this case, the plasma-excited $N_2$ gas is supplied to the wafer 200.

At the same time, $N_2$ gas is supplied into the ninth gas supply pipe 232i by opening the valve 243i of the ninth gas supply pipe 232i. The $N_2$ gas flows through the ninth gas supply pipe 232i, and the flow rate of the $N_2$ gas is adjusted by the MFC 241g. The $N_2$ gas having the adjusted flow rate passes through the third gas supply pipe 232c, and is then supplied into the buffer chamber 237c via the gas supply holes 248c of the third nozzle 233c. In this case, the $N_2$ gas supplied into the buffer chamber 237c is plasma-excited by supplying high-frequency power between the first and second rod-shaped electrodes 269c and 270c from the high-frequency power source 273 via the impedance matching unit 272, and supplied as an excited species ($N_2$*) into the process chamber 201 via the gas supply holes 238c and then exhausted via the exhaust pipe 231. In this case, the plasma-excited $N_2$ gas is supplied to the wafer 200.

In this case, in order to prevent the plasma-excited $N_2$ gas from being supplied into the first nozzle 233a, $N_2$ gas is supplied into the first inert gas supply pipe 232j by opening the valve 243j. The $N_2$ gas is supplied into the process chamber 201 via the first gas supply pipe 232a and the first nozzle 233a, and is exhausted via the exhaust pipe 231.

When the excited species obtained by plasma-exciting the $N_2$ gas is supplied, the pressure in the process chamber 201 is controlled, e.g., to fall within a range of 10 to 1,000 Pa, by appropriately controlling the APC valve 244. The supply flow rate of the N₂ gas is controlled by each of the MFCs 241*h* and 241*i*, for example, to fall within a range of 100 to 10,000 sccm (0.1 to 10 slm). The supply flow rate of the N₂ gas is controlled by the MFC 241*j*, for example, to fall within a range of 100 to 2,000 sccm (0.1 to 2 slm). A time period in which the excited species obtained by plasma-exciting the N₂ gas is supplied to the wafer 200, i.e., a gas supply time (irradiation time), is set to range, for example, from 1 to 120 seconds. When the throughput is considered, the temperature of the heater 207 is set to be the same as when the DCS gas is supplied in Step 1*b*, that is, the temperature of the wafer 200 (or the temperature in the process chamber 201) in Steps 1*b* through 6*b* may be maintained constant to fall within a range of 300 to 650° C., preferably, a range of 300 to 600° C., and more preferably, a range of 300 to 550° C., as in the first embodiment. The high-frequency power supplied from the high-frequency power source 273 between the first and second rod-shaped electrodes 269*b* and 270*b* and between the first and second rod-shaped electrodes 269*c* and 270*c* is set, for example, to fall within a range of 50 to 1,000 W.

Impurities may be removed from the SiN layer by performing the second modifying process (Step 6*b*) described above using Ar gas or N₂ gas as a modifying gas. Thereafter, a SiN film may be formed on the wafer 200 to a desired thickness by repeatedly performing one cycle including Steps 1*b* through 6*b* a predetermined number of times, and preferably, several times.

According to the present embodiment, the same effects as in first embodiment may also be achieved.

Thickness uniformity of the SiN film in a plane of the wafer 200 may be more improved when Ar gas or N₂ gas is used as a modifying gas than when H₂ gas is used as a modifying gas. This seems to be because excited species obtained by plasma-exciting Ar gas or N₂ gas are heavier than those obtained by plasma-exciting H₂ gas, and the elements of the SiN film may thus be decomposed or desorbed near an edge portion of the wafer 200 at which a film is likely to have be thick, when Ar gas or N₂ gas is used as a modifying gas.

Also, an etching rate of the SiN film, i.e., the quality of the SiN film, in a plane of the wafer 200 may be more improved when H₂ gas is used as a modifying gas than when Ar gas or N₂ gas is used as a modifying gas. This seems to be because an excited species obtained by plasma-exciting H₂ gas has a longer lifespan than excited species obtained by plasma-exciting Ar gas or N₂ gas. Thus, excited species may be more efficiently supplied to a central part of the wafer 200 when H₂ gas is used as a modifying gas. Thus, desorbing of impurities from a silicon-containing layer or the SiN layer at the central part of the wafer 200 may be greatly promoted.

In the film-forming sequence described above, H₂ gas is used as a modifying gas in the first modifying process and Ar gas or N₂ gas is used as a modifying gas in the second modifying process. Reversely, Ar gas or N₂ gas may be used as a modifying gas in the first modifying process, and H₂ gas may be used as a modifying gas in the second modifying process. However, the first and second modifying processes are not limited to a case in which H₂ gas, N₂ gas, or Ar gas is used as a modifying gas, and instead, an arbitrary combination of H₂ gas, N₂ gas, and Ar gas may be used as a modifying gas.

<Third Embodiment of the Present Invention>

In the first embodiment, a process of plasma-exciting and supplying a modifying gas is performed after a source gas is supplied and before a nitrogen-containing gas is supplied, and after a nitrogen-containing gas is supplied and before a source gas is supplied, but the present invention is not limited thereto. For example, the process of plasma-exciting and supplying a modifying gas may be performed only after a source gas is supplied and before a nitrogen-containing gas is supplied. That is, although in the first embodiment, both the first and second modifying processes are performed, the present invention is not limited thereto, and only the first modifying process may be performed and the second modifying process may be skipped.

In the present embodiment, a nitride film is formed on a substrate by performing one cycle a predetermined number of times, the cycle including supplying a source gas to the substrate, supplying a plasma-excited hydrogen-containing gas to the substrate, and supplying a plasma-excited or thermally excited nitriding gas (nitrogen-containing gas) to the substrate.

Specifically, in a film-forming sequence according to the present embodiment, a SiN film is formed on the wafer 200 by performing one cycle a predetermined number of times, the cycle including supplying DCS gas to the wafer 200 in the process chamber 201 (DCS gas supply process), purging the process chamber 201 (first purging process), supplying plasma-excited H₂ gas to the wafer 200 in the process chamber 201 (first modifying process), supplying plasma-excited NH₃ gas to the wafer 200 in the process chamber 201 (NH₃ gas supply process), and purging the process chamber 201 (second purging process). The film-forming sequence according to the present embodiment will now be described in greater detail.

Figure 7:
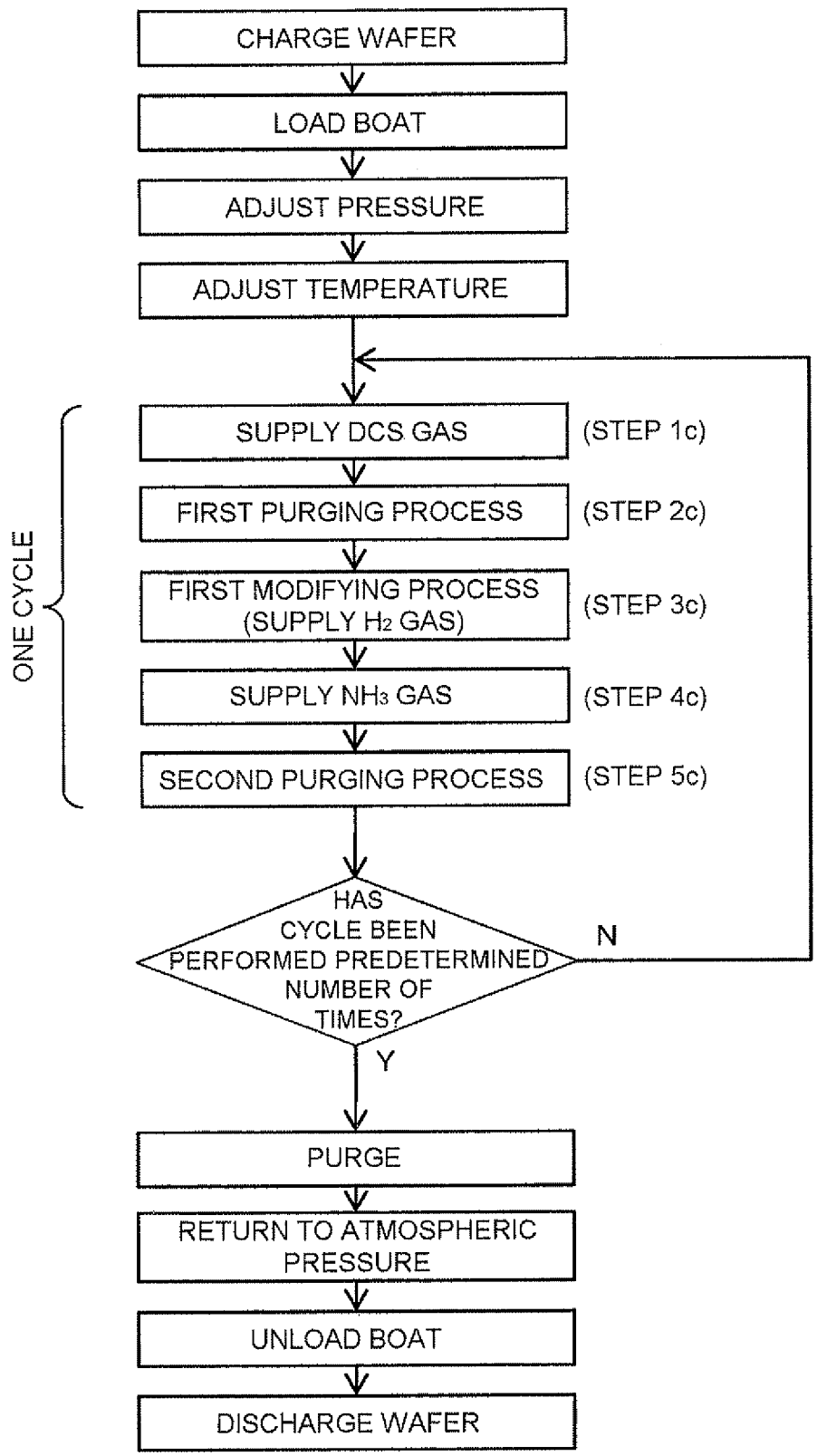
FIG. 7 is a flowchart illustrating a method of forming a film according to a third embodiment of the present invention.
Figure 12:
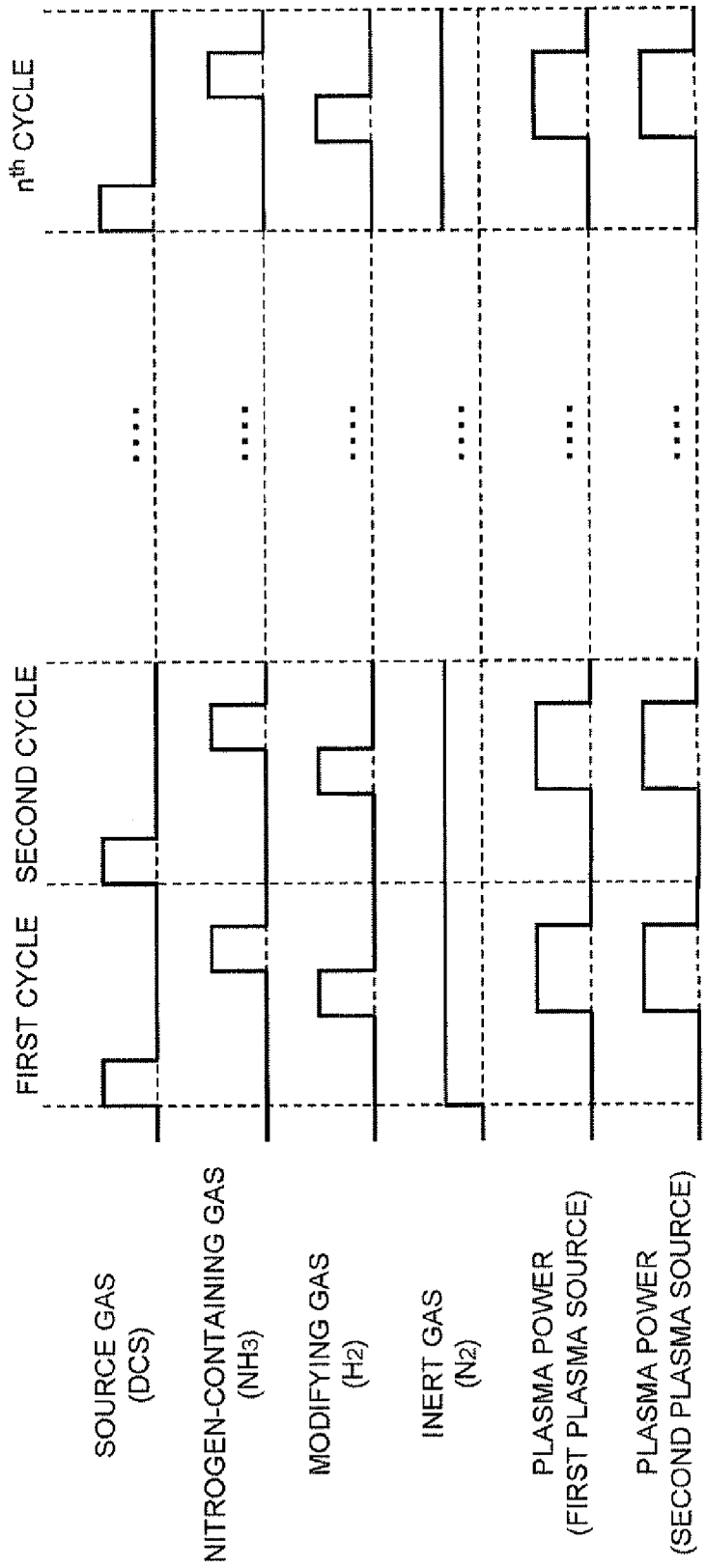
FIG. 12 is a diagram illustrating timing of supplying a gas and plasma power according to the third embodiment of the present invention.

FIG. 7 is a flowchart illustrating a method of forming a film according to the third embodiment of the present invention. FIG. 12 is a diagram illustrating timing of supplying a gas and plasma power according to the third embodiment of the present invention. The present embodiment is substantially the same as the first embodiment, except that a process of plasma-exciting and supplying a modifying gas is performed only after a source gas is supplied and before a nitrogen-containing gas is supplied (that is, the second modifying process is skipped). As illustrated in FIGS. 7 and 12, in the present embodiment, a SiN film may be formed on the wafer 200 to a desired thickness by performing one cycle a predetermined number of times, and preferably, several times, the cycle including Steps 1*c* through 5*c*, similar to Steps 1*a* through 5*a* in the first embodiment.

The same effects as in the first embodiment may also be achieved according to the present embodiment. Also, compared to the first embodiment, a time needed to perform each cycle may be reduced by skipping the second modifying process, thereby increasing a film-forming rate.

<Fourth Embodiment of the Present Invention>

In the first embodiment, a process of plasma-exciting and supplying a modifying gas is performed after a source gas is supplied and before a nitrogen-containing gas is supplied, and after a nitrogen-containing gas and before a source gas is supplied, but the present invention is not limited thereto. For example, the process of plasma-exciting and supplying a modifying gas may be performed only after a nitrogen-containing gas is supplied and before a source gas is supplied. That is, although in the first embodiment, both the first and second modifying processes are performed, the present invention is not limited thereto, and the first modifying process may be skipped and only the second modifying process may be performed.

In the present embodiment, a nitride film is formed on a substrate by performing one cycle a predetermined number of times, the cycle including supplying a source gas to the substrate, supplying a plasma-excited or thermally excited nitriding gas (nitrogen-containing gas) to the substrate, and supplying a plasma-excited hydrogen-containing gas to the substrate.

Specifically, in a film-forming sequence according to the present embodiment, a SiN film is formed on the wafer 200 by performing one cycle a predetermined number of times, the cycle including supplying DCS gas to the wafer 200 in the process chamber 201 (DCS gas supply process), purging the process chamber 201 (first purging process), supplying plasma-excited $NH_3$ gas to the wafer 200 in the process chamber 201 ($NH_3$ gas supply process), purging the process chamber 201 (second purging process), and supplying plasma-excited $H_2$ gas to the wafer 200 in the process chamber 201 (second modifying process). The film-forming sequence according to the present embodiment is described in greater detail below.

Figure 8:
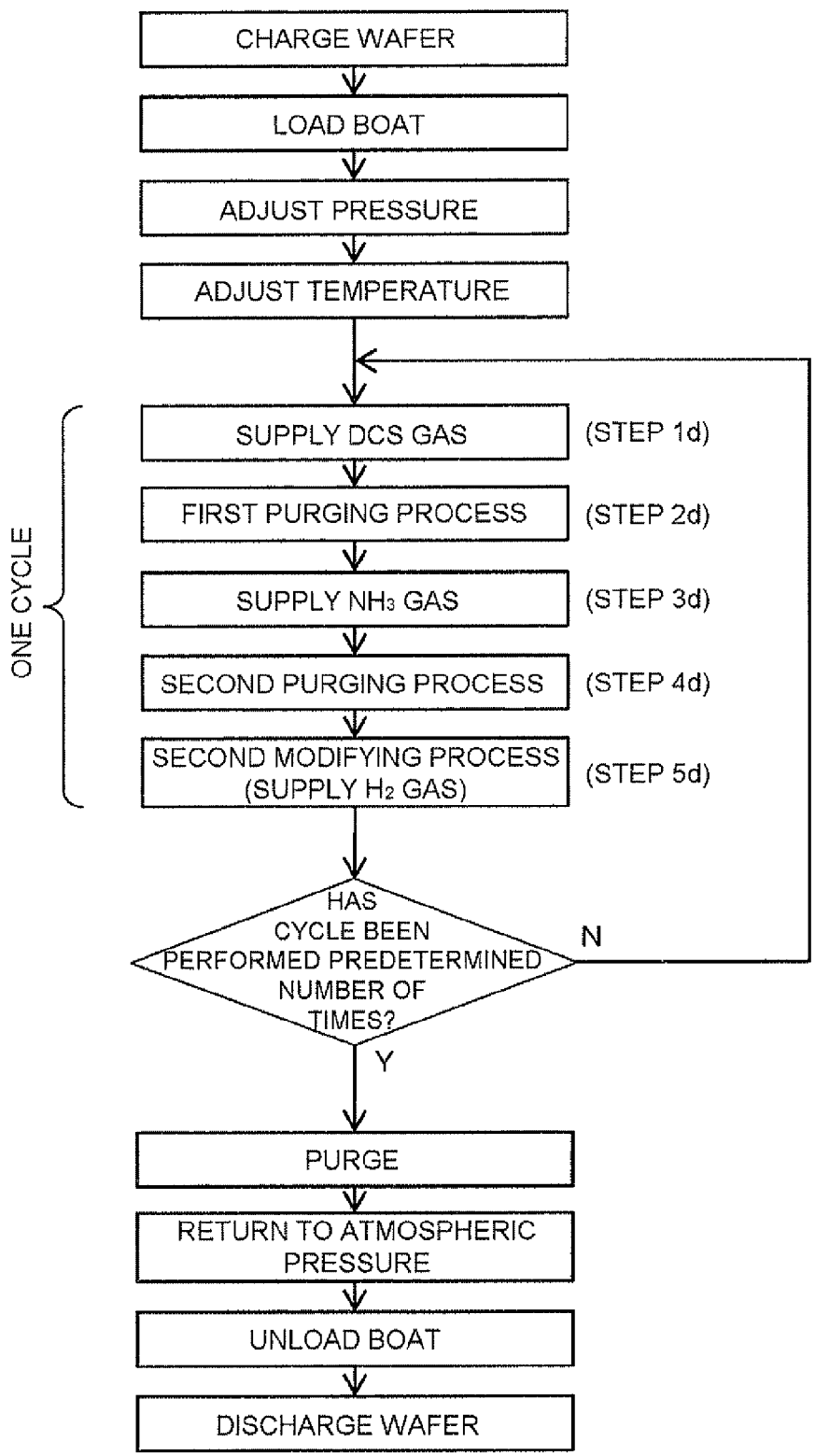
FIG. 8 is a flowchart illustrating a method of forming a film according to a fourth embodiment of the present invention.
Figure 13:
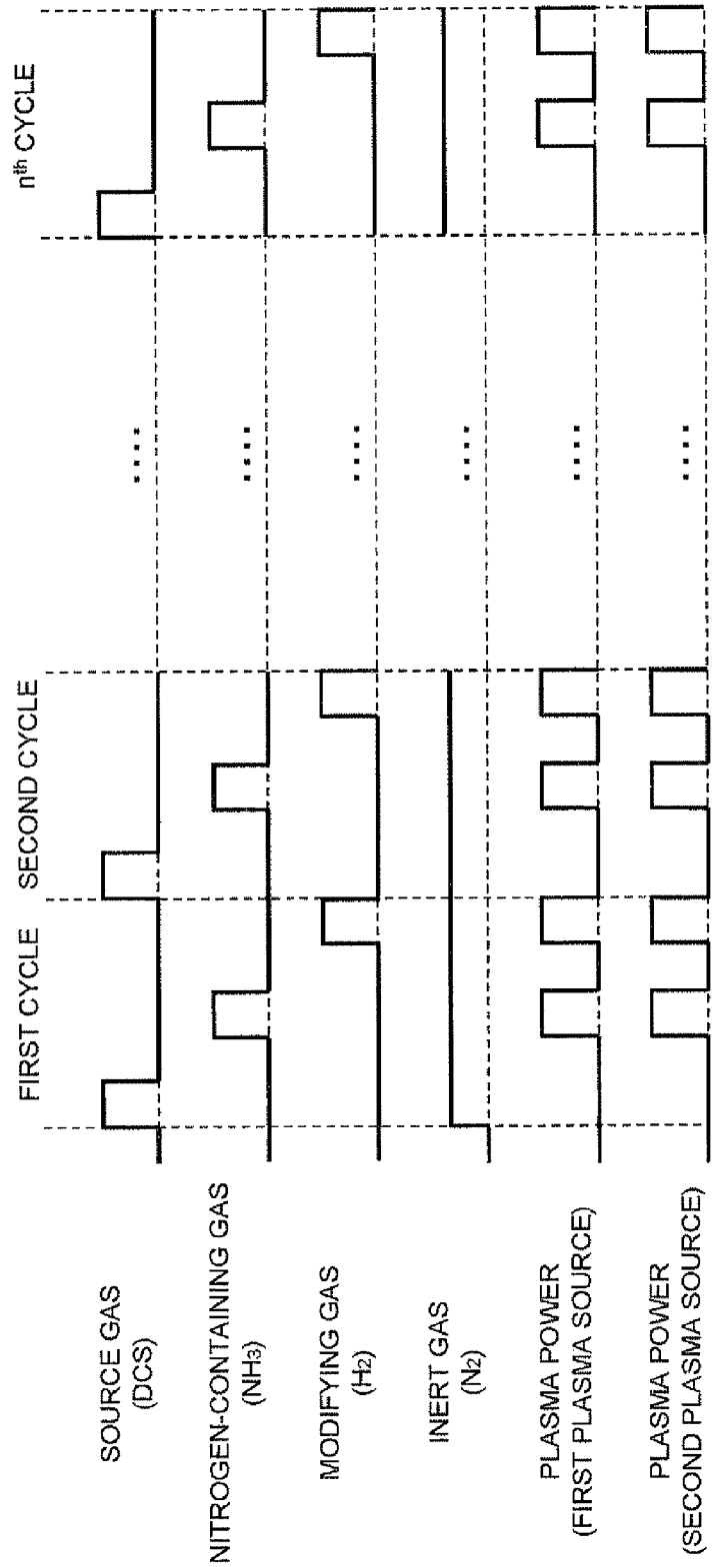
FIG. 13 is a diagram illustrating timing of supplying a gas and plasma power according to the fourth embodiment of the present invention.

FIG. 8 is a flowchart illustrating a method of forming a film according to the fourth embodiment of the present invention. FIG. 13 is a diagram illustrating timing of supplying a gas and plasma power according to the fourth embodiment of the present invention. The present embodiment is substantially the same as the first embodiment, except that a process of plasma-exciting and supplying a modifying gas is performed only after a nitrogen-containing gas is supplied and before a source gas is supplied (that is, the first modifying process is skipped). As illustrated in FIGS. 8 and 13, in the present embodiment, a SiN film may be formed on the wafer 200 to a desired thickness by performing one cycle a predetermined number of times, and preferably, several times, the cycle including Steps 1d through 5d, similar to Steps 1a, 2a, and 4a through 6a in the first embodiment.

The same effects as in the first embodiment may also be achieved according to the present embodiment. Also, compared to the first embodiment, a time needed to perform each cycle may be reduced by skipping the first modifying process, thereby increasing a film-forming rate.

<Fifth Embodiment of the Present Invention>

In the second embodiment, the process of purging the process chamber 201 (second purging process) is provided between the process of supplying a nitrogen-containing gas ($NH_3$ gas supply process) and the process of plasma-exciting and supplying a modifying gas (second modifying process), but the present invention is not limited thereto. For example, the second purging process may be skipped, and the $NH_3$ gas supply process and the second modifying process may be continuously performed.

In the present embodiment, a nitride film is formed on a substrate by performing one cycle a predetermined number of times, the cycle including supplying a source gas to the substrate, supplying a plasma-excited hydrogen-containing gas to the substrate, supplying a plasma-excited or thermally excited nitriding gas (nitrogen-containing gas) to the substrate, and supplying at least one of a plasma-excited nitrogen gas and a plasma-excited rare gas to the substrate.

Specifically, in a film-forming sequence according to the present embodiment, a SiN film is formed on the wafer 200 by performing one cycle a predetermined number of times, the cycle including supplying DCS gas to the wafer 200 in the process chamber 201 (DCS gas supply process), purging the process chamber 201 (first purging process), supplying plasma-excited $H_2$ gas to the wafer 200 in the process chamber 201 (first modifying process), supplying plasma-excited $NH_3$ gas to the wafer 200 in the process chamber 201 ($NH_3$ gas supply process), and a process of supplying at least one of plasma-excited $H_2$ gas and plasma-excited Ar gas to the wafer 200 in the process chamber 201 (second modifying process). The film-forming sequence according to the present embodiment will be described in greater detail below.

Figure 9:
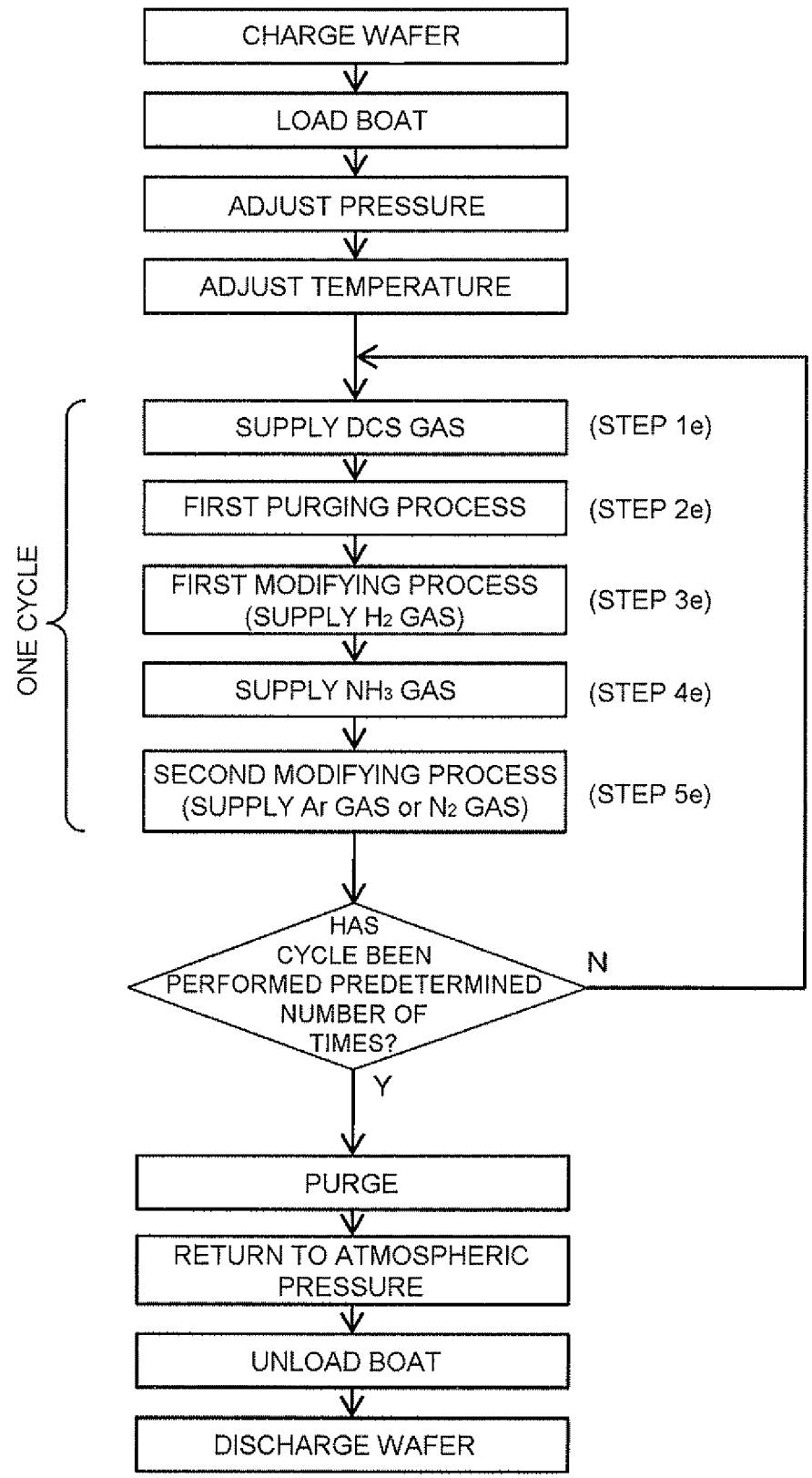
FIG. 9 is a flowchart illustrating a method of forming a film according to a fifth embodiment of the present invention.
Figure 14:
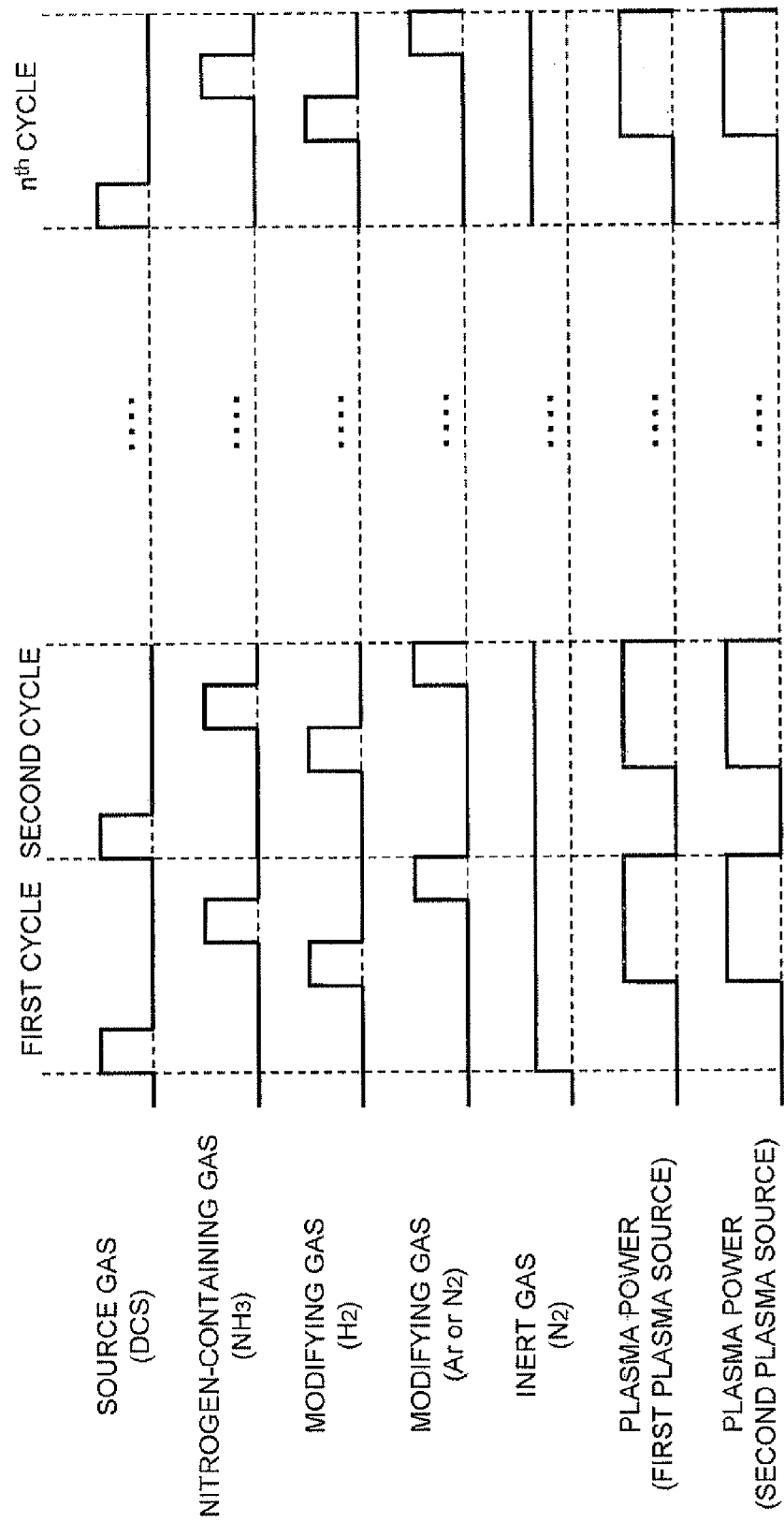
FIG. 14 is a diagram illustrating timing of supplying a gas and plasma power according to the fifth embodiment of the present invention.

FIG. 9 is a flowchart illustrating a method of forming a film according to the fifth embodiment of the present invention. FIG. 14 is a diagram illustrating timing of supplying a gas and plasma power according to the fifth embodiment of the present invention. The present embodiment is substantially the same as the second embodiment, except that the second purging process is skipped, and the $NH_3$ gas supply process and the second modifying process are continuously performed. As illustrated in FIGS. 9 and 14, in the present embodiment, a SiN film may be formed on the wafer 200 to a desired thickness by performing one cycle a predetermined number of times, and preferably, several times, the cycle including Steps 1e through 5e, similar to Steps 1b through 4b and 6b a in the second embodiment.

The same effects as in the second embodiment may also be achieved according to the present embodiment. Also, compared to the second embodiment, a time needed to perform each cycle may be reduced by skipping the second purging process, thereby increasing a film-forming rate.

<Other Embodiments of the Present Invention>

Although various embodiments of the present invention have been described above in detail, the present invention is not limited thereto and various changes may be made with respect to the embodiments without departing from the scope of the invention.

For example, is case in which DCS gas is used as a source gas has been described in the embodiments described above, but the present invention is not limited thereto. For example, the present invention may also be applied to a case in which MCS gas is used as a source gas. An amount of chlorine to be supplied into the process chamber 201 may be reduced using the MCS gas having a lower chlorine (Cl) content and a higher surface adsorption rate than the DCS gas as a source gas. Thus, an amount of chlorine bonded with a silicon-containing layer, i.e., Si—Cl bonds, may be reduced to form a silicon-containing layer having a low concentration of chlorine. As a result, in Step 4a, a SiN layer having a low concentration of chlorine may be formed. Thus, a SiN film having a low concentration of impurities therein, i.e., a SiN film having a high film density, may be formed, and the resistance of the SiN film to hydrogen fluoride may be improved. Also, the insulating properties of the SiN film may be improved.

Si—H bonds included in the silicon-containing layer may be increased by reducing Si—Cl bonds included in the silicon-containing layer using the MCS gas as a source gas. A Si—Cl bond has higher bonding energy than a Si—H bond, and acts to hinder formation of a Si—N bond, i.e., nitriding of the silicon-containing layer, in Step 4a. On the other hand, the Si—H bond has lower bonding energy than the Si—Cl bond, and acts to promote formation of a Si—N bond, i.e., nitriding of the silicon-containing layer, in Step 4a. That is, when the MCS gas is used as a source gas to form a silicon-containing layer having a small number of Si—Cl bonds and a low concentration of chlorine, factors that hinder the nitriding of the silicon-containing layer may be reduced and the nitriding of the silicon-containing layer may be promoted in Step 4a. Also, when a number of Si—H bonds in the silicon-containing layer is increased, factors promoting the nitriding of the silicon-containing layer may increase and the nitriding of the silicon-containing layer may be promoted in Step 4a. As described above, the efficiency of the nitriding of the silicon-containing layer in Step 4a may be increased, and a time needed for the nitriding of the silicon-containing layer may be reduced, thereby reducing a process time. Accordingly, a time needed to form the SiN film may be reduced, thereby increasing the yield.

Also, when MCS gas is used as a source gas, a temperature adjustment mechanism that maintains stored MCS gas at a constant temperature, e.g., of about 30° C., may be installed either in an MCS gas source that supplies MCS gas to the first gas supply pipe 232a or at an upstream side of the first gas supply pipe 232a, i.e., a gas storage place or a cylinder cabinet, etc. MCS gas has a high decomposition rate and is likely to be decomposed at a temperature at which a general special high-pressure gas is stored. When MCS gas is decomposed to generate monosilane ($SiH_4$), thickness uniformity of the SiN film may be degraded or the yield may become worse. Also, when the temperature at which MCS gas is stored is too low, the MCS gas is not easily vaporized and the supply flow rate of the MCS gas into the process chamber 201 may be reduced. The temperature adjustment mechanism may be installed to solve such problems.

Figure 3:
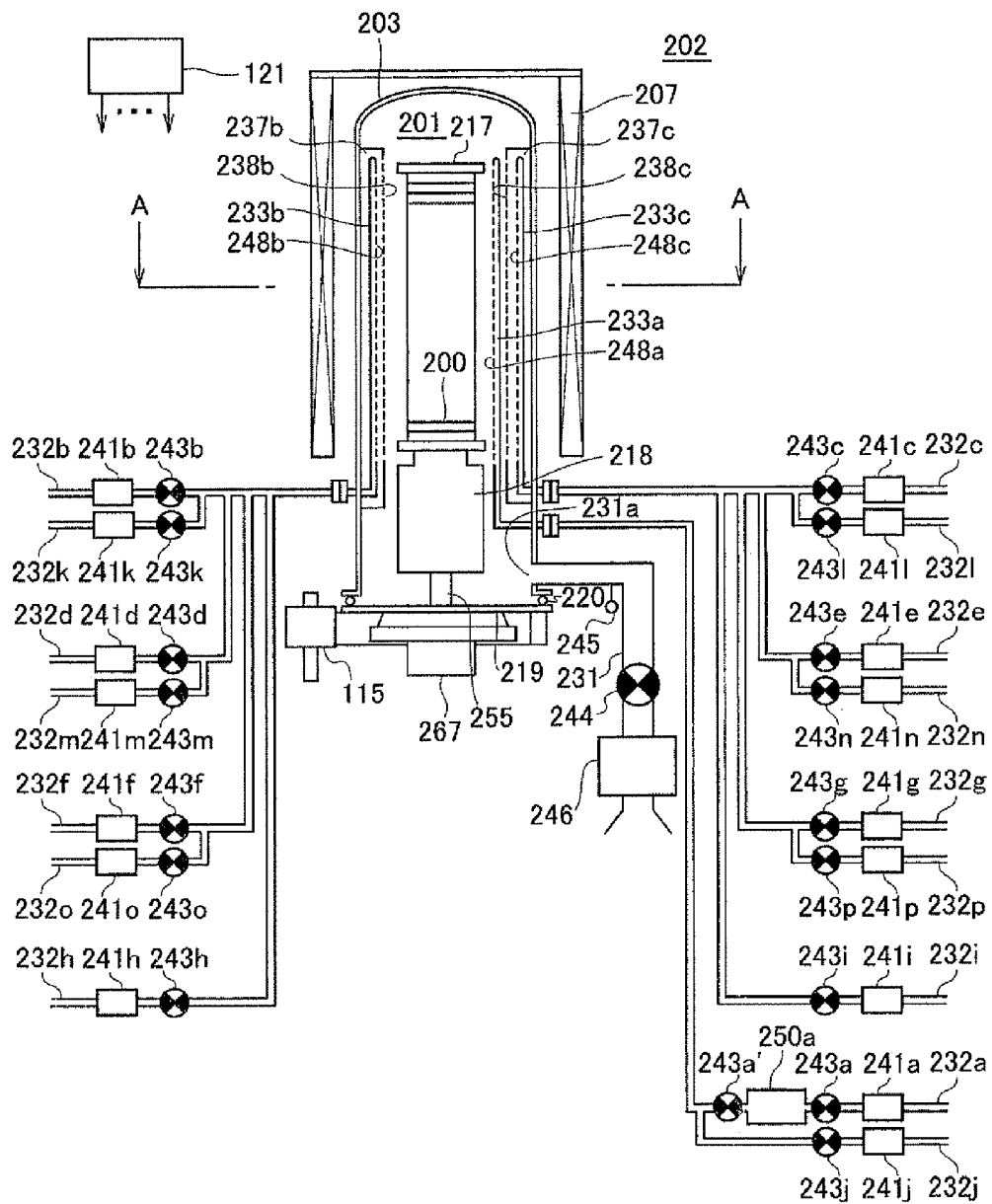
FIG. 3 is a schematic configuration diagram of a vertical process furnace of a substrate processing apparatus according to a modified example of an embodiment of the present invention, in which a vertical cross-sectional view of a portion of the vertical process furnace is provided.

Also, in the embodiments described above, when a source gas is supplied into the process chamber 201 (Step 1a), the source gas is supplied into the process chamber 201 by continuously exhausting the inside of the process chamber 201 while the APC valve 244 is open, but the present invention is not limited thereto. For example, as illustrated in FIG. 3, a gas storage unit (or tank) 250a may be installed at the first gas supply pipe 232a at a downstream side of the valve 243a, a high-pressure source gas collected in the gas storage unit 250a may be supplied at once (to a pulse state) into the reduced-pressure process chamber 201 while the APC valve 244 is closed, and then the inside of the process chamber 201 which is in an increased pressure by the supply of the source gas may be maintained for a predetermined time.

In order to supply the source gas at once using the gas storage unit 250a, first, the source gas is collected in the gas storage unit 250a by closing a valve 243 at installed at the first gas supply pipe 232a at a downstream side of the gas storage unit 250a and opening the valve 243a installed at an upstream side of the gas storage unit 250a. Then, when a desired amount of the source gas having a specific pressure is collected in the gas storage unit 250a, the valve 243a installed at the upstream side of the gas storage unit 250a is closed. In the gas storage unit 250a, the source gas is collected such that pressure in the gas storage unit 250a may be equal to or greater than, e.g., 20,000 Pa. The amount of the source gas collected in the gas storage unit 250a may range, for example, from 100 to 1,000 cc. Also, an apparatus is configured such that a conductance between the gas storage unit 250a and the process chamber 201 may be equal to or greater than $1.5 \times 10^{-3}$ $m^3/s$. When a ratio between the capacity of the process chamber 201 and the capacity of the gas storage unit 250a therefor is considered, if the capacity of the process chamber 201 is, for example, 100 liters, then the capacity of the gas storage unit 250a may be 100 to 300 cc and may be 1/1,000 to 3/1,000 of the capacity of the process chamber 201.

While the inside of the gas storage unit 250a is filled with the source gas, the inside of the process chamber 201 is exhausted using the vacuum pump 246 such that pressure in the process chamber 201 may be less than or equal to 20 Pa. After the filling of the inside of the gas storage unit 250a with the source gas and the exhausting of the process chamber 201 are completed, the APC valve 244 is closed to discontinue the exhausting of the process chamber 201, and then the valve 243a' of the first gas supply pipe 232a is opened. Thus, the high-pressure source gas collected in the gas storage unit 250a is supplied at once (to a pulse state) into the process chamber 201. In this case, since the APC valve 244 of the exhaust pipe 231 is closed, the pressure in the process chamber 201 sharply increases to, for example, 931 Pa (7 Torr). Then, an increased-pressure state in the process chamber 201 is maintained for a predetermined time, e.g., 1 to 10 seconds, and the wafer 200 is exposed to a high-pressure atmosphere of DCS gas so as to form a silicon-containing layer on the wafer 200.

If the source gas is supplied at once using the gas storage unit 250a as described above, then the speed of the source gas ejected from the first nozzle 233a into the process chamber 201 is accelerated, for example, up to the speed of sound (340 msec) due to the difference between pressures in the gas storage unit 250a and the process chamber 201, thereby increasing the speed of the source gas supplied to the wafer 200 to about several tens msec. As a result, the source gas is efficiently supplied to the entire wafer 200 including the central part of the wafer 200. Thus, the thickness and quality of the SiN film in a plane of the wafer 200 may be uniformly improved. Hereinafter, the method of supplying the source gas described above will be referred to as a 'flash flow.'

In the embodiments described above, two plasma generation units (excitation units) are installed, but the present invention is not limited thereto. For example, the present invention may also be applied to a case in which one plasma generation unit (excitation unit) is installed. However, when a plurality of plasma generation units (excitation units) are installed, the performance of a nitriding process or a modifying process in a plane of the wafer 200 may be greatly improved, and the quality and thickness of the SiN film in the plane of the wafer 200 may be more uniformly improved, as described above. In other words, when a plurality of plasma generation units are installed, the effects of the nitriding process, the first modifying process, and the second modifying process may be further improved. Furthermore, the present invention may be applied to a case in which three or more plasma generation units (excitation units) are installed.

In the second and fifth embodiments described above, the process of supplying a plasma-excited hydrogen-containing gas is performed during a specific time period after the process of supplying a source gas, i.e., while supply of a plasma-excited or thermally excited nitriding gas is suspended after the process of supplying the source gas, and the process of supplying at least one of a plasma-excited nitrogen gas and a plasma-excited rare gas is performed during a specific time period after the process of supplying a plasma-excited or thermally excited nitriding gas, i.e., while supply of a source gas is suspended after the process of supplying a plasma-excited or thermally excited nitriding gas, but the present invention is not limited thereto.

For example, the process of supplying at least one of a plasma-excited nitrogen gas and a plasma-excited rare gas may be performed during a specific time period after the process of supplying a source gas, i.e., while supply of a plasma-excited or thermally excited nitriding gas is suspended after the process of supplying a source gas, and the process of supplying a plasma-excited hydrogen-containing gas may performed during a specific time period after the process of supplying a plasma-excited or thermally excited nitriding gas, i.e., while supply of the source gas is suspended after the process of supplying the plasma-excited or thermally excited nitriding gas.

In other words, the process of supplying a plasma-excited hydrogen-containing gas is performed during the specific time period after the process of supplying the source gas or during the specific time period after the process of supplying the plasma-excited or thermally excited nitriding gas. The process of supplying at least one of a plasma-excited nitrogen gas and a plasma-excited rare gas may be performed during the specific time period after the process of supplying the source gas or during the specific time period after the process of supplying the plasma-excited or thermally excited nitriding gas, in which the process of supplying a plasma-excited hydrogen-containing gas is not performed.

Specifically, the process of supplying the plasma-excited hydrogen-containing gas may be performed while the supply of the plasma-excited or thermally excited nitriding gas is suspended after the process of supplying the source gas or while the supply of the source gas is suspended after the process of supplying the plasma-excited or thermally excited nitriding gas. The process of supplying at least one of the plasma-excited nitrogen gas and the plasma-excited rare gas may be performed while the supply of the plasma-excited or thermally excited nitriding gas is suspended after the process of supplying the source gas or while the supply of the source gas is suspended after the process of supplying the plasma-excited or thermally excited nitriding gas, in which the process of supplying the plasma-excited hydrogen-containing gas is not performed.

More specifically, the process of supplying the plasma-excited hydrogen-containing gas is performed after the process of supplying the source gas and before the process of supplying the plasma-excited or thermally excited nitriding gas, and after the process of supplying the plasma-excited or thermally excited nitriding gas and before the process of supplying the source gas. The process of supplying at least one of the plasma-excited nitrogen gas and the plasma-excited rare gas may be performed after the process of supplying the source gas and before the process of supplying the plasma-excited or thermally excited nitriding gas; and after the process of supplying the plasma-excited or thermally excited nitriding gas and before the process of supplying the source gas, in which the process of supplying the plasma-excited hydrogen-containing gas is not performed.

In this case, a layer (silicon-containing layer) is formed on a substrate during the process of supplying the source gas, a first modifying process is performed to the layer during the process of supplying the plasma-excited hydrogen-containing gas, the layer to which the first modifying process is performed is changed into a nitride layer during the process of supplying the plasma-excited or thermally excited nitriding gas, and a second modifying process is performed to the nitride layer during the process of supplying the at least one of the plasma-excited nitrogen gas and the plasma-excited rare gas.

Otherwise, a layer is formed on the substrate during the process of supplying the source gas, a first modifying process is performed to the layer during the process of supplying at least one of the plasma-excited nitrogen gas and the plasma-excited rare gas, the layer to which the first modifying process is performed is changed into a nitride layer during the process of supplying the plasma-excited or thermally excited nitriding gas, and a second modifying process is performed to the nitride layer during the process of supplying the plasma-excited hydrogen-containing gas.

Otherwise, for example, both the process of supplying the plasma-excited hydrogen-containing gas and the process of supplying at least one of the plasma-excited nitrogen gas and the plasma-excited rare gas may be performed during a specific time period after the process of supplying the plasma-excited or thermally excited nitriding gas, i.e., while the supply of the source gas is suspended after the process of supplying the plasma-excited or thermally excited nitriding gas, i.e., after the process of supplying the plasma-excited or thermally excited nitriding gas and before the process of supplying the source gas.

Otherwise, for example, both the process of supplying the plasma-excited hydrogen-containing gas and the process of supplying at least one of the plasma-excited nitrogen gas and the plasma-excited rare gas may be performed during a specific time period after the process of supplying the source gas, i.e., while the supply of the plasma-excited or thermally excited nitriding gas is suspended after the process of supplying the source gas, i.e., after the process of supplying the source and before the process of supplying the plasma-excited or thermally excited nitriding gas.

In this case, a layer (silicon-containing layer) is formed on the substrate during the process of supplying the source gas, the layer is changed into a nitride layer during the process of supplying the plasma-excited or thermally excited nitriding gas, the first modifying process is performed to the nitride layer during the process of supplying the plasma-excited hydrogen-containing gas, and the second modifying process is performed to the nitride layer during the process of supplying at least one of the plasma-excited nitrogen gas and the plasma-excited rare gas.

Otherwise, a layer is formed on the substrate during the process of supplying the source gas, the first modifying process is performed to the layer during the process of supplying the plasma-excited hydrogen-containing gas, the second modifying process is performed to the layer during the process of supplying at least one of the plasma-excited nitrogen gas and the plasma-excited rare gas, and the layer to which the first and second modifying processes are performed is changed into a nitride layer during the process of supplying the plasma-excited or thermally excited nitriding gas.

Also, when a film is formed based on the film-forming sequence according to the second or fifth embodiment among the embodiments described above, the effects of the first and second modifying processes may be maximized.

The SiN films formed according to the embodiments described above have a low concentration of chlorine therein and a high film density, and are highly resistant to hydrogen fluoride. Thus, the SiN films formed according to the embodiments described above may be preferably used as a gate insulating film, a capacitive insulating film, sidewall spacers, an etching stopper layer, or the like. Also, the SiN film may be preferably used as a hard mask during a process of forming a silicon trench isolation (STI) layer.

In the embodiments described above, a method of forming a SiN film containing silicon (a semiconductor element) as a nitride film has been described above, but the present invention is not limited thereto. For example, the present invention may also be applied to a case in which a metal nitride film including a metallic element, such as titanium (Ti), zirconium (Zr), hafnium (Hf), tantalum (Ta), aluminum (Al), or molybdenum (Mo), is formed.

For example, the present invention may also be applied to a case in which a titanium nitride (TiN) film is formed, a zirconium nitride (ZrN) film is formed, a hafnium nitride (HfN) film is formed, a tantalum nitride (TaN) film is formed, an aluminum nitride (AlN) film is formed, or a molybdenum nitride (MoN) film is formed.

In this case, such films may be formed using a material including metal elements as a source gas according to the same film-forming sequence as in the embodiments described above. When a liquid source that is in a liquid state at normal temperature and pressure, the liquid source is vaporized by a vaporizing system, such as a vaporizer or a bubbler, and is then supplied as the source gas. Also, the same nitrogen-containing gas and modifying gas as in the embodiments described above may be used. The same process conditions as in the embodiments described above may also be used.

For example, when a TiN film is formed, titanium tetrachloride ($TiCl_4$), tetrakis(ethylmethylamino)titanium ($Ti[N(C_2H_5)(CH_3)]_4$, abbreviated to TEMAT), tetrakis(dimethylamino)titanium (Ti[N(CH$_3$)$_2$]$_4$, abbreviated to TDMAT), or tetrakis(diethylamino)titanium (Ti[N(C$_2$H$_5$)$_2$]$_4$, abbreviated to TDEAT) may be used as a source element.

For example, when a ZrN film is formed, zirconium tetrachloride (ZrCl$_4$), tetrakis(ethylmethylamino)zirconium (Zr[N(C$_2$H$_5$(CH$_3$)]$_4$, abbreviated to TEMAZ), tetrakis(dimethylamino)zirconium (Zr[N(CH$_3$)$_2$]$_4$, abbreviated to TDMAZ), or tetrakis(diethylamino)zirconium (Zr[N(C$_2$H$_5$)$_2$]$_4$, abbreviated to TDEAZ) may be used as a source element.

For example, when a HfN film is formed, hafnium tetrachloride (HfCl$_4$), tetrakis(ethylmethylamino)hafnium (Hf[N(C$_2$H$_5$(CH$_3$)]$_4$, abbreviated to TEMAH), tetrakis(dimethylamino)hafnium (Hf[N(CH$_3$)$_2$]$_4$, abbreviated to TDMAH), or tetrakis(diethylamino)hafnium (Hf[N(C$_2$H$_5$)$_2$]$_4$, abbreviated to TDEAH) may be used as a source element.

For example, when a TaN film is formed, tantalum pentachloride (TaCl$_5$), tantalum pentafluoride (TaF$_5$), pentaethoxy tantalum (Ta(OC$_2$H$_5$)$_5$, abbreviated to: PET), or tert-butylimino tris(diethylamino) tantalum (Ta(NC(CH$_3$)$_3$)(N(C$_2$H$_5$)$_2$)$_3$, abbreviated to: TBTDET) may be used as a source element.

For example, when an AlN film is formed, aluminum trichloride (AlCl$_3$), aluminum trifluoride (AlF$_3$), or trimethyl aluminum (Al(CH$_3$)$_3$, abbreviated to: TMA) may be used as a source element.

For example, when a MoN film is formed, molybdenum pentachloride (MoCl$_5$), or molybdenum pentafluoride (MoF$_5$) may be used as a source element.

As described above, the present invention may be applied not only a case in which a SiN film is formed but also a case in which a metal nitride film is formed. In this case, the same effects as in the embodiments described above may also be achieved. That is, the present invention may also be applied to formation of a nitride film including a specific element, such as a semiconductor element or a metal element.

A case in which a thin film is formed using a batch-type substrate processing apparatus capable of processing a plurality of substrates at a time has been described in the embodiments described above, but the present invention is not limited thereto, and a thin film may be formed using a single-wafer type substrate processing apparatus capable of processing one or several substrates at a time.

Also, an appropriate combination of the embodiments, modified examples, or application examples described above may be used.

The present invention may also be realized by changing, for example, a program recipe of the existing substrate processing apparatus. To change the program recipe, a program recipe according to the present invention may be installed in the existing substrate processing apparatus via an electric communication line or a recording medium storing the program recipe according to the present invention, or the program recipe of the existing substrate processing apparatus may be replaced with the program recipe according to the present invention by manipulating an input/output device of the existing substrate processing apparatus.

EXAMPLES

Example 1

<Film Quality Influenced By Modifying Process>
In Example 1 of the present invention, Sample 1 was obtained by forming a SiN film on a wafer having a diameter of 300 mm according to the same film-forming sequence as described with respect to the third embodiment (wherein only a first modifying process is performed and a second modifying process is skipped). DCS gas was used as a source gas, NH$_3$ gas was used as a nitrogen-containing gas, and Ar gas was used as a modifying gas during the first modifying process.

Also, in Example 1, Sample 2 was obtained by forming a SiN film on a wafer having a diameter of 300 mm according to a film-forming sequence as described with respect to the fourth embodiment (wherein the first modifying process is skipped and only the second modifying process is performed). DCS gas was used as a source gas, NH$_3$ gas was used as a nitrogen-containing gas, and Ar gas was used as a modifying gas during the second modifying process.

Also, as a Comparative Example, Sample 3 was obtained by forming a SiN film on a wafer having a diameter of 300 mm in a process chamber by performing one cycle a predetermined number of times, according to a general film-forming sequence. The cycle included supplying DCS gas to the wafer, purging the process chamber, supplying plasma-excited NH$_3$ gas to the wafer in the process chamber, and purging the process chamber.

For convenience of explanation, FIG. 15A illustrates only one cycle of a sequence of supplying a gas during the forming of the SiN film to obtain each of Samples 1 to 3. All of Samples 1 to 3 were obtained using a substrate processing apparatus with two plasma generation units, as illustrated in FIG. 3, and the DCS gas was supplied into the process chamber according to the flash flow. The temperature of the wafer was set to 550° C. when the SiN film was formed. The other process conditions were set to be substantially the same as those in the embodiments described above.

Then, wet-etching rates (WERs) of the SiN films (Samples 1 to 3) were measured. When the SiN films were wet-etched, a liquid containing a hydrogen fluoride content of about 1% was used.

Figure 15B:
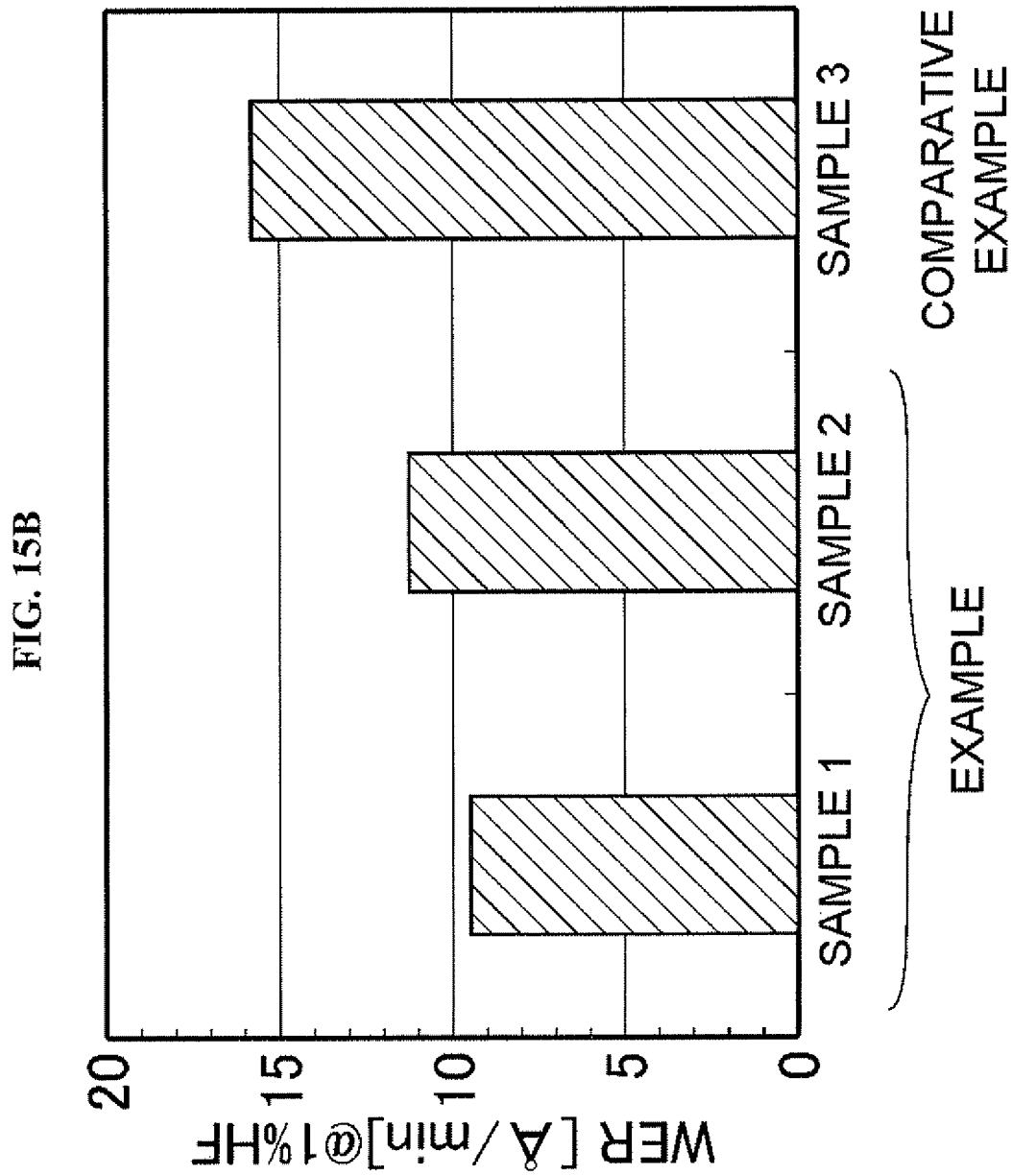
FIG. 15B is a graph illustrating a result of measuring wet-etching rates (WERs) of SiN films according to Example 1 of the present invention and the Comparative Example.

FIG. 15B is a graph illustrating results of measuring the WERs of the SiN films (Samples 1 to 3). In FIG. 15B, a horizontal axis denotes Samples 1 to 3, and a vertical axis denotes the WERs thereof (Å/min). Here, 'WER' means an average of wet-etching rates in a plane of the wafer.

Referring to FIG. 15B, it could be seen that the SiN film had low WERs and was highly resistant to hydrogen fluoride in Samples 1 and 2 (Example 1) to which a modifying process of supplying plasma-excited Ar gas to a silicon-containing layer or a SiN layer was performed, compared to in Sample 3 (Comparative Example) to which the modifying process was not performed. This seems to be because an excited species obtained by plasma-exciting Ar gas through the modifying process allowed impurities, such as hydrogen or chlorine, to be efficiently desorbed from the silicon-containing layer or the SiN layer, thereby improving the quality of the SiN film.

Furthermore, it could be seen that Sample 1 obtained by performing only the first modifying process and skipping the second modifying process had a lower WER and a higher resistance to hydrogen fluoride than Sample 2 obtained by skipping the first modifying process and performing only the second modifying process. This seems to be because impurities, such as hydrogen or chlorine, in the silicon-containing layer are more efficiently desorbed from the silicon-containing layer through the first modifying process performed immediately after the silicon-containing layer is formed than through the second modifying process performed after the silicon-containing layer is modified into a SiN layer, due to desorbing reaction of DCS gas.

<Effects according to Pressure In Modifying Process>
Then, in Example 1, Samples 4 to 7 were obtained by forming a SiN film on a wafer having a diameter of 300 mm according to the same film-forming sequence as described with respect to the third embodiment (wherein only a first modifying process is performed and a second modifying process is skipped). DCS gas was used as a source gas, $NH_3$ gas was used as a nitrogen-containing gas, and Ar gas was used as a modifying gas during the first modifying process. When Samples 4 to 7 were obtained, pressures in the process chamber during the first modifying process were sequentially set to 85 Pa, 44.5 Pa, 21.5 Pa, and 12 Pa.

Figure 16A:
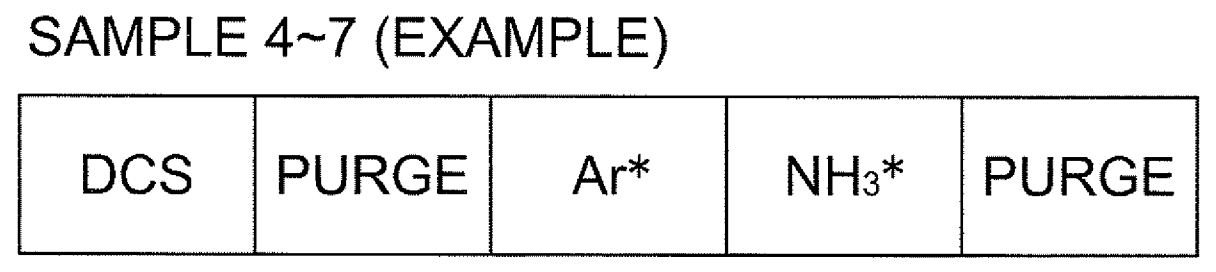

For convenience of explanation, FIG. 16A illustrates only one cycle of a sequence of supplying a gas during the forming of the SiN film to obtain each of Samples 4 to 7. All Samples 4 to 7 were obtained using a substrate processing apparatus with two plasma generation units, as illustrated in FIG. 3, and the DCS gas was supplied into the process chamber according to the flash flow. The temperature of the wafer was set to 550° C. when the SiN film was formed. The other process conditions were set to be substantially the same as those in the embodiments described above.

Then, WERs of the SiN films (Samples 4 to 7), the range of the WERS in a plane of the wafer, and the distribution of the WERs in the plane of the wafer were measured. When the SiN films were wet-etched, a liquid containing a hydrogen fluoride content of about 1% was used.

Figure 16B:
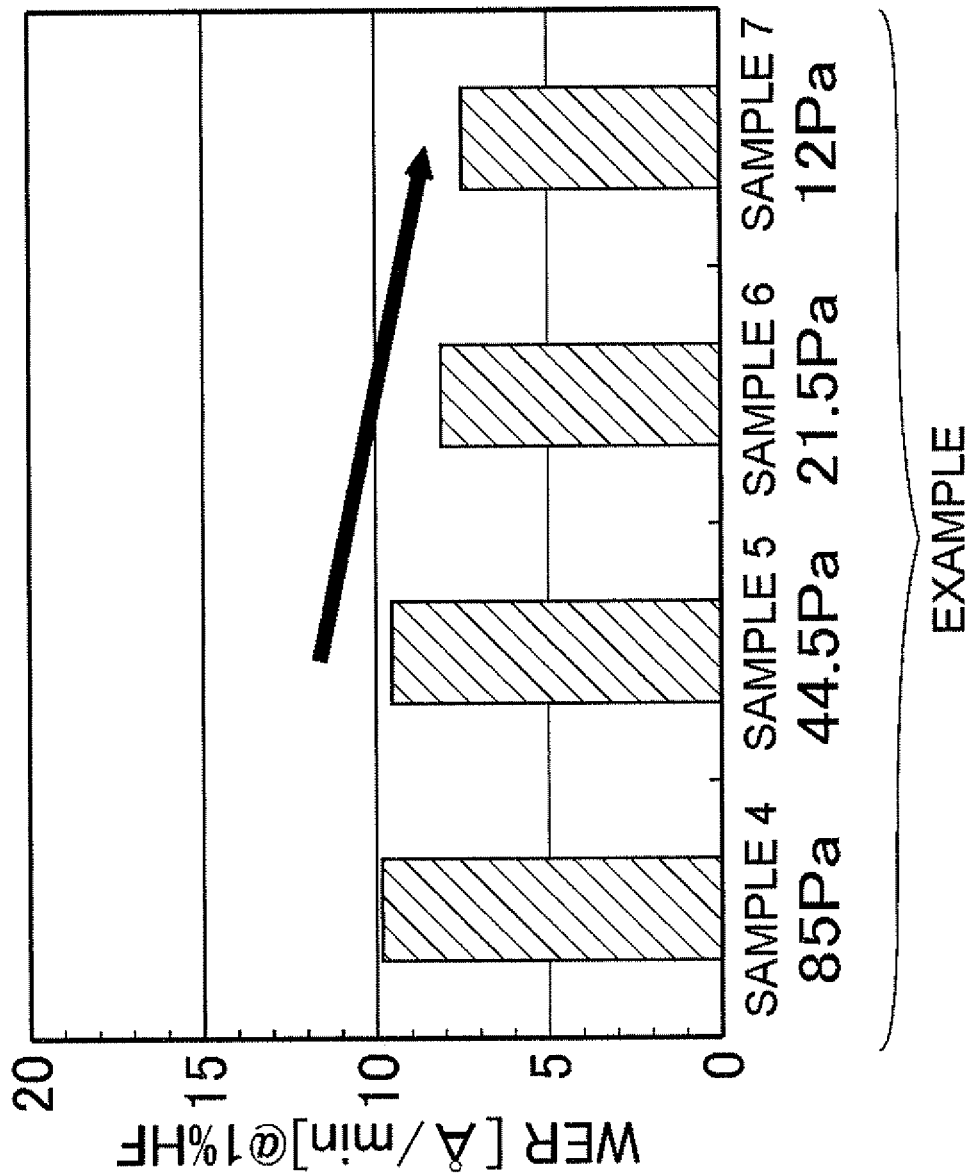
FIG. 16B is a graph illustrating a result of measuring the WERs of the SiN films according to Example 1 of the present invention.

FIG. 16B is a graph illustrating a result of measuring the WERs of the SiN films (Samples 4 to 7). In FIG. 16B, a horizontal axis denotes Samples 4 to 7, and a vertical axis denotes the WERs thereof (Å/min). Here, 'WER' means an average of the wet-etching rates in the plane of the wafer.

FIG. 17A is a graph illustrating a result of measuring a range of the WERs of the SiN films (Samples 4 to 7) in a plane of a wafer according to Example 1 of the present invention. In FIG. 17A, a horizontal axis denotes Samples 4 to 7, and a vertical axis denotes the WERs thereof (Å/min). Here, 'WER' means an average of the wet-etching rates in the plane of the wafer. The range of WERs in the plane of the wafer means the difference between a maximum WER and minimum WER in the plane of the wafer.

FIG. 17B is a graph illustrating a result of measuring a distribution of the WERs of the SiN films (Samples 4 to 7) in a plane of a wafer according to Example 1 of the present invention. In FIG. 17B, a horizontal axis denotes measurement positions in Samples 4 to 7, and a vertical axis denotes WERs thereof (Å/min). The WERs were measured along the diameter of the wafer. In the horizontal axis, '0 mm' means a result of measuring the distribution of WERs at a central portion of the wafer, and '±150 mm' means a result of measuring the distribution of WERs at an edge portion of the wafer.

Referring to FIG. 16B, it could be seen that, during the first modifying process, a lower pressure in the process chamber led to a lower WER of a SiN film, thereby improving the resistance of the SiN film to hydrogen fluoride. This seems to because when the pressure in the process chamber during the first modifying process is lowered, the lifespan of an excited species obtained by plasma-exciting Ar gas may increase and the excited species may be more efficiently supplied to the wafer, thereby improving the quality of the SiN film.

Also, referring to FIGS. 17A and 17B, it could be seen that, during the first modifying process, the lower the pressure in the pressure chamber, the less the range of WERs in the plane of the wafer, thereby equalizing the distribution of WERs in the plane of the wafer. This seems to be because during the first modifying process, when the pressure in the process chamber is lowered, the lifespan of an excited species obtained by plasma-exciting Ar gas may increase and the excited species may thus be more efficiently supplied to the central portion of the wafer, thereby uniformly improving the quality of the SiN film in the plane of the wafer.

Example 2

<Effect according to Gas Species of Modifying Gas>

In Example 2 of the present invention, Sample 1 was obtained by forming a SiN film on a wafer having a diameter of 300 mm according to the same film-forming sequence as described with respect to the third embodiment (wherein only a first modifying process is performed and a second modifying process is skipped). DCS gas was used as a source gas, $NH_3$ gas was used as a nitrogen-containing gas, and Ar gas was used as a modifying gas during the first modifying process.

Also, in Example 2 of the present invention, Samples 2 to 4 were obtained by forming a SiN film on a wafer having a diameter of 300 mm according to the same film-forming sequence as described with respect to the first embodiment (wherein both a first modifying process and a second modifying process are performed using the same modifying gas). Similarly, DCS gas was used as a source gas and $NH_3$ gas was used as a nitrogen-containing gas. Ar gas was used as a modifying gas during the first and second modifying processes to obtain Sample 2. $H_2$ gas was used as a modifying gas during the first and second modifying processes to obtain Sample 3. $N_2$ gas was used as a modifying gas during the first and second modifying processes to obtain Sample 4.

Also, in Example 2 of the present invention, Sample 5 was obtained by forming a SiN film on a wafer having a diameter of 300 mm according to the same film-forming sequence as described with respect to the second embodiment (wherein different kinds of modifying gases are used during a first modifying process and a second modifying process). Similarly, DCS gas was used as a source gas and $NH_3$ gas was used as a nitrogen-containing gas. $H_2$ gas was used as a modifying gas during the first modifying process. $N_2$ gas was used as a modifying gas during the second modifying process.

Also, as a Comparative Example, Sample 6 was obtained by forming a SiN film on a wafer having a diameter of 300 mm in a process chamber by performing one cycle a predetermined number of times, according to a general film-forming sequence. The cycle includes supplying DCS gas, purging the process chamber, supplying plasma-excited $NH_3$ gas to the wafer in the process chamber, and purging the process chamber.

For convenience of explanation, FIG. 18A illustrates only one cycle included in a sequence of supplying a gas during the forming of the SiN film to obtain each of Samples 1 to 6. All of Samples 1 to 6 were obtained using a substrate processing apparatus with two plasma generation units, as illustrated in FIG. 3, and the DCS gas was supplied into the process chamber according to the flash flow. The temperature of the wafer was set to 550° C. when the SiN film was formed. The other process conditions were set to be substantially the same as those in the embodiments described above.

Then, WERs of the SiN films (Samples 1 to 6), a range of the WERs in a plane of the wafer, a distribution of the WERs in the plane of the wafer, and a distribution of thicknesses of the SiN films (Samples 1 to 6) in the plane of the wafer were measured. When the SiN films were wet-etched, a liquid containing a hydrogen fluoride content of about 1% was used.

Figure 18B:
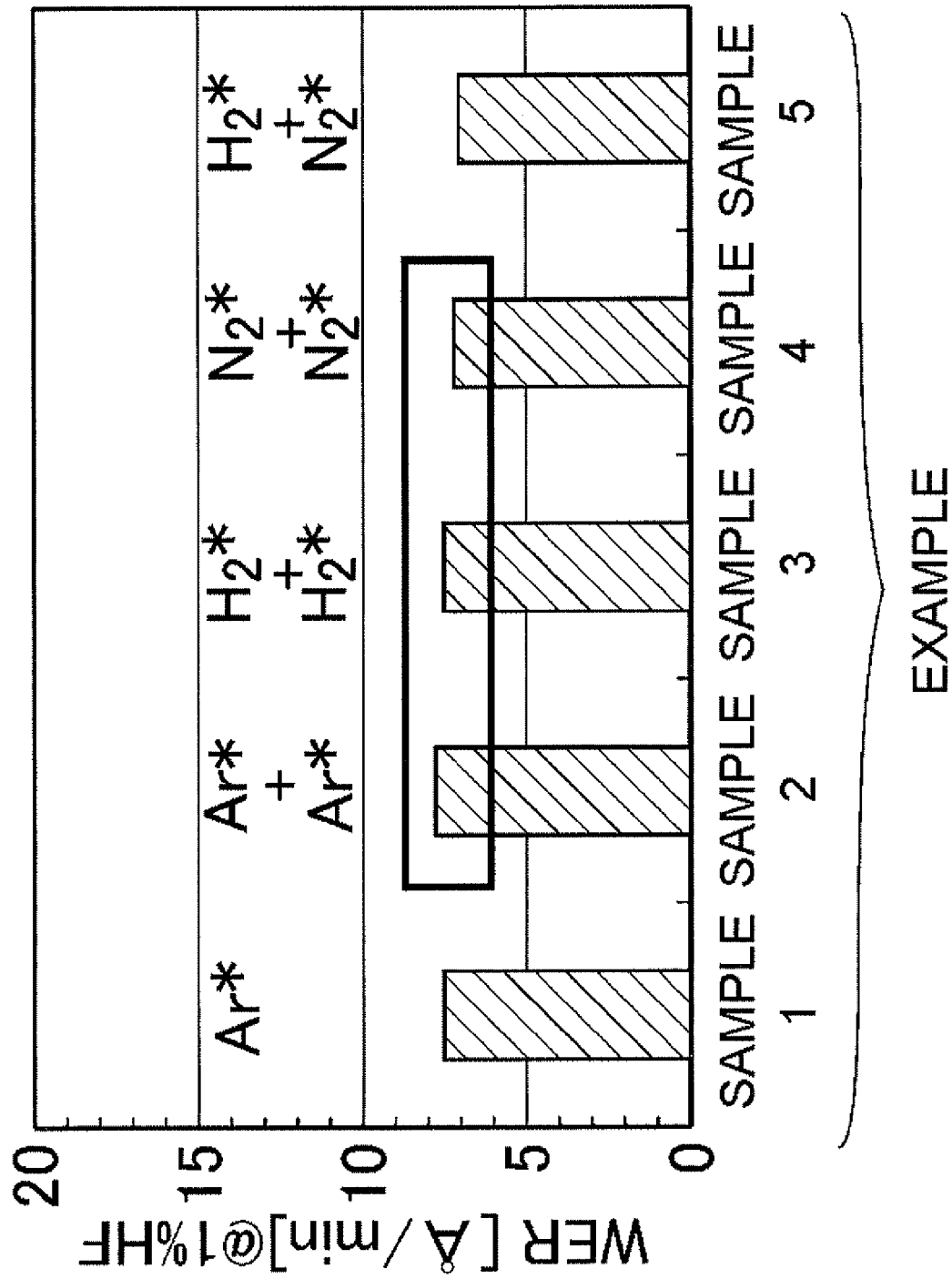
FIG. 18B is a graph illustrating a result of measuring the WERs of the SiN films according to Example 2 of the present invention.

FIG. 18B is a graph illustrating a result of measuring the WERs of the SiN films (Samples 1 to 5). In FIG. 18B, a horizontal axis denotes Samples 1 to 5, and a vertical axis denotes the WERs thereof (Å/min). Here, 'WER' means an average of the WERs in the plane of the wafer. The results of measuring a WER of the SiN film (Sample 6) was the same as that of the SiN film (Sample 3) in Example 1 and is thus not illustrated here.

Figure 19A:
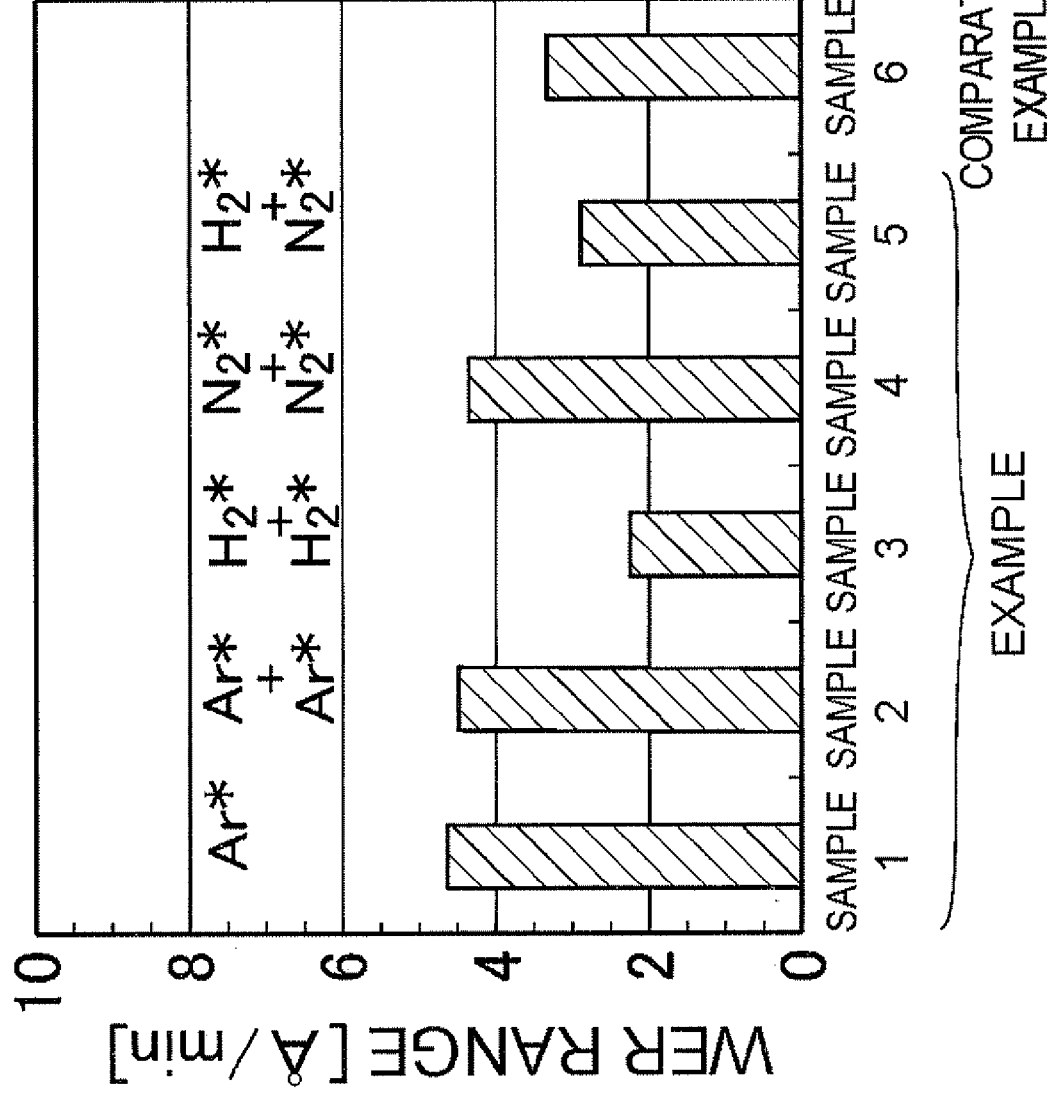
FIG. 19A is a graph illustrating a result of measuring a range of the WERs of the SiN films in the plane of the wafer according to Example 2 of the present invention and the Comparative Example.

FIG. 19A is a graph comparing results of measuring a range of WERs of the SiN films (Samples 1 to 6) in a plane of a wafer according to Example 2 of the present invention and the Comparative Example. In FIG. 19A, a horizontal axis denotes Samples 1 to 6, and a vertical axis denotes the ranges of WERs thereof (Å/min) in the plane of the wafer.

Figure 19B:
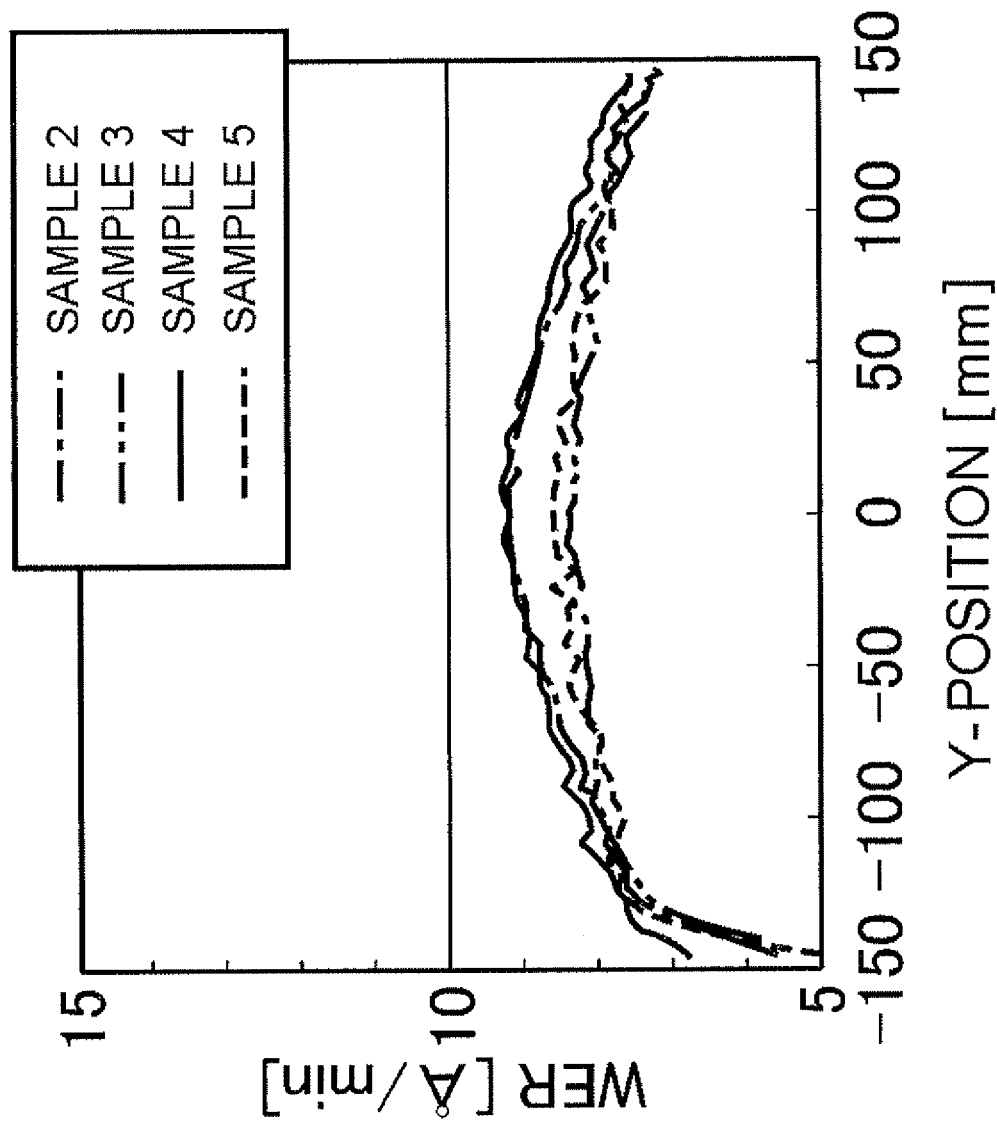
FIG. 19B is a graph illustrating a result of measuring a distribution of the WERs of the SiN films in the plane of the wafer according to Example 2 of the present invention and the Comparative Example.

FIG. 19B is a graph illustrating a result of measuring distributions of WERs of the SiN films (Samples 1 to 5) in a plane of a wafer according to Example 2 of the present invention and the Comparative Example. In FIG. 19B, a horizontal axis denotes measurement positions on Samples 1 to 5, and a horizontal axis denotes the WERs thereof (Å/min). The WERs were measured along the diameter of the wafer. In the horizontal axis, '0 mm' means a result of measuring the distribution of WERs at a central portion of the wafer, and '±150 mm' means a result of measuring the distribution of WERs at an edge portion of the wafer.

Figure 20:
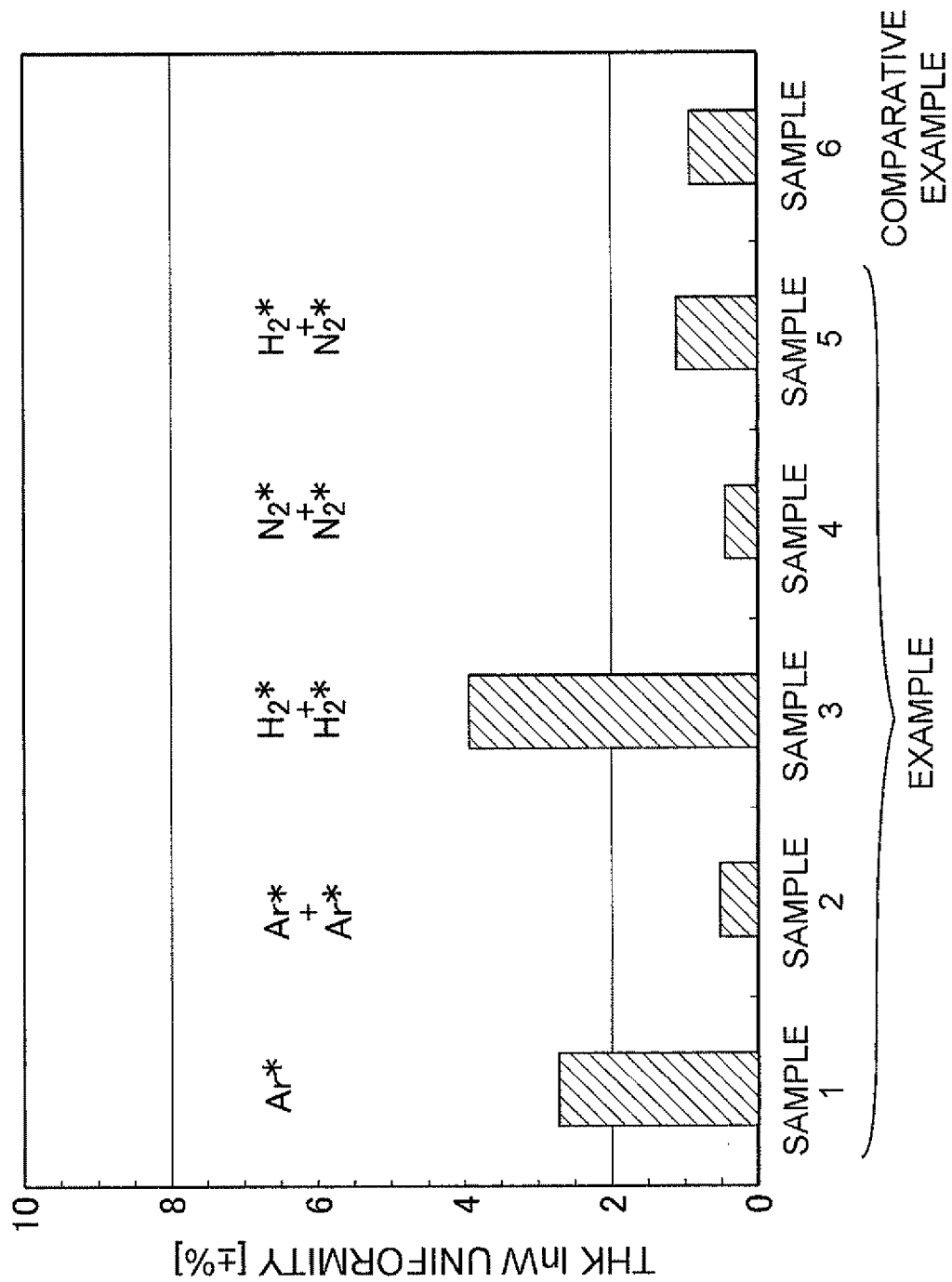
FIG. 20 is a graph illustrating the relationship between the thickness uniformity of the SiN films in a plane of a wafer and gas species used in a modifying process according to Example 2 of the present invention.

FIG. 20 is a graph illustrating results of measuring thickness uniformity of the SiN films (Samples 1 to 6) in a plane of the wafer. In FIG. 20, a horizontal axis denotes Samples 1 to 6, and a vertical axis denotes the thickness uniformity (±%) of the SiN films (Samples 1 to 6) in the plane of the wafer. FIG. 20 shows that the smaller the number on the vertical axis, the higher the thickness uniformity of the SiN film.

Referring to FIG. 18B, it could be seen that, in Samples 1 to 5 to which a modifying process is performed, all the WERs of the SiN films were low and the SiN films thus had improved resistance to hydrogen fluoride, compared to Sample 6 (Comparative Example) in which a modifying process was not performed. In other words, it could be seen that the SiN film had improved quality and high resistance to hydrogen fluoride when Ar gas was used as a modifying gas (Samples 1 and 2), when $H_2$ gas was used as a modifying gas (Sample 3), and when $N_2$ gas was used as a modifying gas (Sample 4). In the case of Sample 5 obtained using different types of modifying gases during the first and second modifying processes, it could be seen that the SiN film also had improved quality and high resistance to hydrogen fluoride. That is, it could be seen that, if any combination of Ar gas, $H_2$ gas, and $N_2$ gas is used as a modifying gas, impurities, such as hydrogen or chlorine, may be efficiently desorbed from the silicon-containing layer or the SiN layer, thereby improving the quality of the SiN film.

Referring to FIGS. 19A and 19B, it could be seen that, in the case of Sample 3 obtained using $H_2$ gas as a modifying gas during the first and second modifying processes, a range of WERs of the SiN film in the plane of the wafer was lowest and the uniformity of the WERs in the plane of the wafer was highest. In the case of Sample 5 obtained using $H_2$ gas as a modifying gas during the first modifying process and using $N_2$ gas as a modifying gas during the second modifying process, it could be seen that a range of WERs of the SiN film in the plane of the wafer was second lowest and the uniformity of the WERs in the plane of the wafer was second highest. This seems to be because an excited species obtained by plasma-exciting $H_2$ gas has a longer lifespan than excited species obtained by plasma-exciting Ar gas or $N_2$ gas. Thus, an excited species may be more efficiently supplied to a central part of the wafer 200 when $H_2$ gas is used as a modifying gas. Thus, desorbing of impurities from the SiN film at the central part of the wafer 200 may be greatly promoted.

Also, referring to FIG. 20, it could be seen that thickness uniformity of the SiN film in the plane of the wafer was high in the case of Sample 2 obtained using Ar gas as a modifying gas during the first and second modifying processes or Sample 4 obtained using $N_2$ gas as a modifying gas during the first and second modifying processes. On the other hand, it could be seen that thickness uniformity of the SiN film in the plane of the wafer was low in the case of Sample 3 obtained using $H_2$ gas as a modifying gas during the first and second modifying processes. This seems to be because excited species obtained by plasma-exciting Ar gas or $N_2$ gas are heavier than those obtained by plasma-exciting $H_2$ gas, and the elements of the SiN film may thus be decomposed or desorbed near an edge portion of the wafer 200 at which a film is likely to be thick, when Ar gas or $N_2$ gas is used as a modifying gas. Also, it seems to be relatively difficult for the elements of the SiN film to decompose or be desorbed near an edge portion of the wafer 200 when a relatively light excited species like an excited species obtained by plasma-exciting $H_2$ gas is used. However, in the case of Sample 5 obtained using $H_2$ gas as a modifying gas during the first modifying process and using $N_2$ gas as a modifying gas during the second modifying process, it could be seen that the thickness uniformity of the SiN film in the plane of the wafer was desirable. From the results, it could be seen that, even if $H_2$ gas was used as a modifying gas during one modifying process, the thickness uniformity of the SiN film in the plane of the wafer was desirable when $N_2$ gas or Ar gas was used as a modifying gas during another modifying process.

From the above results, it may be concluded that, for example, in the case of Sample 5, WERs (i.e., film quality) and thickness of a SiN film in the plane of the wafer were uniformly improved when the SiN film was formed using $H_2$ gas as a modifying gas during the first modifying process and using $N_2$ gas as a modifying gas during the second modifying process, i.e., using $H_2$ gas as a modifying gas during one modifying process and using $N_2$ gas or Ar gas as a modifying gas during another modifying process.

Example 3

<Effects according to Length of Purging Time>

In Example 3 of the present invention, Samples 1 to 4 were obtained by forming a SiN film on a wafer having a diameter of 300 mm according to the same film-forming sequence as described with respect to the second embodiment (wherein different kinds of modifying gases are used during a first modifying process and a second modifying process). Similarly, DCS gas was used as a source gas and $NH_3$ gas was used as a nitrogen-containing gas. $H_2$ gas was used as a modifying gas during the first modifying process. $N_2$ gas was used as a modifying gas during the second modifying process. Samples 1 to 4 were obtained by changing the durations of purging processes per cycle. Specifically, Sample 1 was obtained by setting the durations of a first purging process and a second purging process included in each cycle to four seconds. Sample 2 was obtained by setting the durations of the first purging process and the second purging process included in each cycle to two seconds. Sample 3 was obtained by setting the durations of the first purging process and the second purging process included in each cycle to four seconds and two seconds, respectively. Sample 4 was obtained by setting the durations of the first purging process and the second purging process included in each cycle to two seconds and four seconds, respectively.

Also, in Example 3, Sample 5 was obtained by forming a SiN film on a wafer having a diameter of 300 mm according to the same film-forming sequence as described with respect to the fifth embodiment (wherein a second purging process is skipped, and a process of supplying a nitrogen-containing gas and a second modifying process are continuously performed). Similarly, DCS gas was used as a source gas and NH$_3$ gas was used as a nitrogen-containing gas. H$_2$ gas was used as a modifying gas during a first modifying process. N$_2$ gas was used as a modifying gas during the second modifying process. Also, the duration of a first purging process included in each cycle was set to four seconds.

For convenience of explanation, FIG. 21A illustrates only one cycle of a sequence of supplying a gas during the forming of the SiN film to obtain each of Samples 1 to 5. In FIG. 21A, each halftone part denotes the first or second purging process, in which a number means the duration of the first or second purging process. All Samples 1 to 5 were obtained using a substrate processing apparatus with two plasma generation units, as illustrated in FIG. 3, and the DCS gas was supplied into the process chamber according to the flash flow. The temperature of the wafer was set to 550° C. when the SiN film was formed. The other process conditions were set to be substantially the same as those in the embodiments described above.

Then, a range of WERs and thickness distribution of the SiN films (Samples 1 to 5) in a plane of the wafer were measured. When the SiN films were wet-etched, a liquid containing a hydrogen fluoride content of about 1% was used.

FIG. 21B is a graph illustrating a result of measuring ranges of WERs of the SiN films (Samples 1 to 5) in the plane of the wafer according to Example 3 of the present invention. In FIG. 21B, a horizontal axis denotes Samples 1 to 5, and a vertical axis denotes the ranges of the WERs thereof (Å/min) in the plane of the wafer.

Figure 21C:
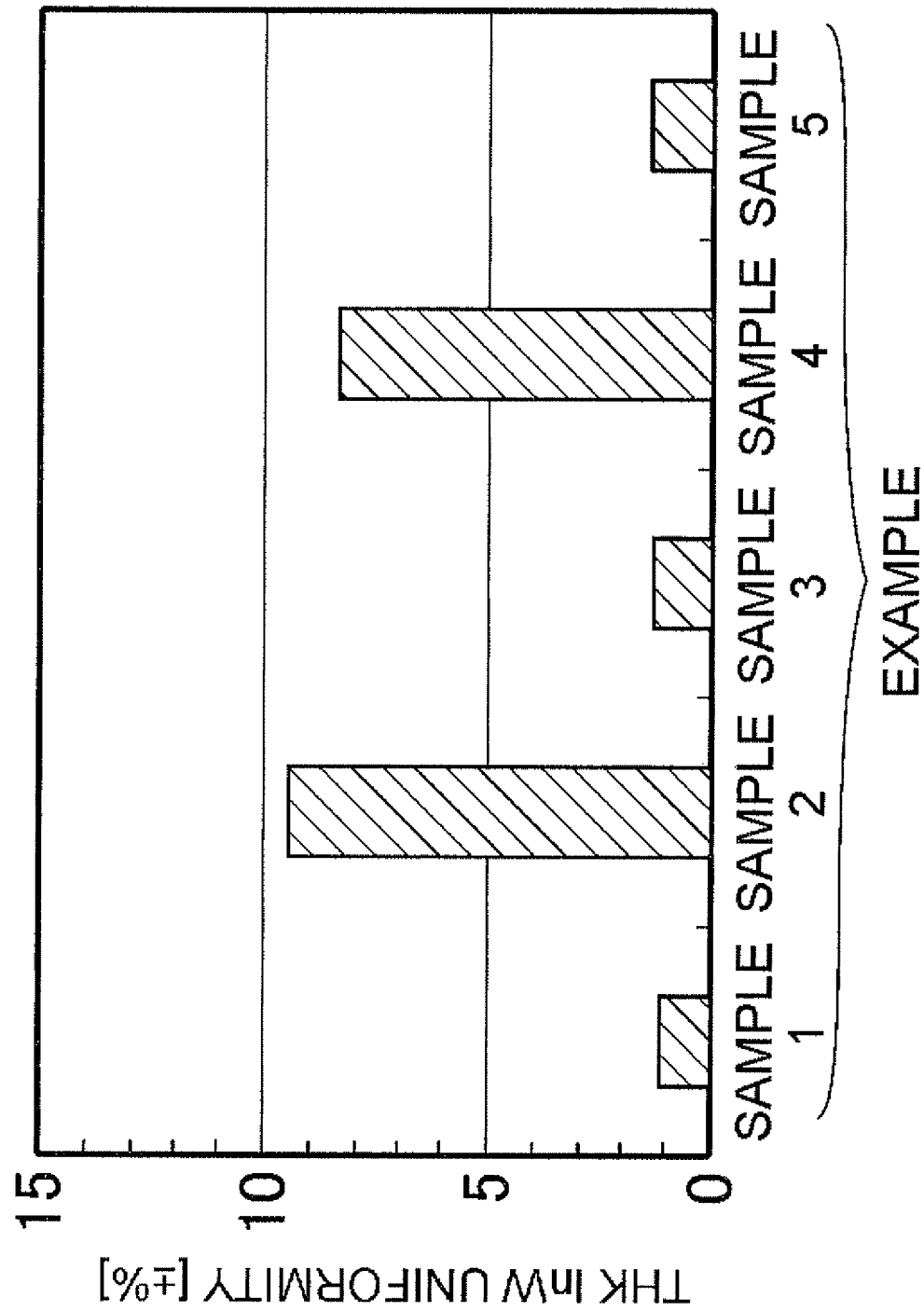
FIG. 21C is a graph illustrating a result of measuring the thickness uniformity of the SiN films in the plane of the wafer according to Example 3 of the present invention.

FIG. 21C is a graph illustrating a result of measuring thickness uniformity of the SiN films (Samples 1 to 5) in the plane of the wafer according to Example 3 of the present invention. In FIG. 21C, a horizontal axis denotes Samples 1 to 5, and a vertical axis denotes thickness uniformity (±%) of the SiN films (Samples 1 to 5) in the plane of the wafer. FIG. 21C reveals that the less a value on the vertical axis, the higher the thickness uniformity of the SiN film.

Referring to FIG. 21B, it could be seen that the differences between the ranges of WERs of the SiN films (Samples 1 to 5) are not large (that is, the differences between the film qualities of the SiN films in the plane of the wafer are not large).

However, referring to FIG. 21C, it could be seen that the differences between the thickness uniformities of the SiN films (Samples 1 to 5) are large. That is, it could be seen that, in the case of Samples 2 and 4 obtained by setting the duration of the first purging process per cycle to be short, e.g., two seconds, the thickness uniformities of the SiN films in the plane of the wafer were greatly lowered, regardless of the duration of the second purging process. On the other hand, it could be seen that, in the case of Samples 1, 3, and 5 obtained by setting the duration of the first purging process per cycle to four seconds, the thickness uniformities of the SiN films in the plane of the wafer were desirable, regardless of the duration of the second purging process or whether the second purging process was performed or not. In other words, it could be seen that, if the duration of the first purging process was insufficient, the thickness uniformities of the SiN films in the plane of the wafer were lowered. However, it could be seen that, even if the duration of the second purging process was insufficient, the thickness uniformities of the SiN films in the plane of the wafer were not greatly lowered.

The reason for which the thickness uniformities of the SiN films in the plane of the wafer were lowered when the duration of the first purging process was insufficient seems to be that when the duration of the first purging process was insufficient, the first modifying process began while the DCS gas remained in the process chamber. That is, during the first modifying process, an excited species obtained by plasma-exciting H$_2$ gas may cause or promote the residual DCS gas remaining in the process chamber to be decomposed or adsorbed on an edge portion of the wafer.

The reason for which the thickness uniformities of the SiN films in the plane of the wafer were not greatly lowered even when the duration of the second purging process was insufficient seems to be that even if the second modifying process begins while NH$_3$ gas remains in the process chamber, the NH$_3$ gas is hardly adsorbed onto the wafer. That is, even if during the second modifying process, an excited species obtained by plasma-exciting N$_2$ gas causes the NH$_3$ gas to be decomposed, the NH$_3$ gas is more likely to be desorbed from the wafer, rather than be adsorbed onto the wafer.

Example 4

In Example 4 of the present invention, Samples 1 to 5 were obtained by forming a SiN film on a wafer having a diameter of 300 mm according to the same film-forming sequence as described with respect to the fifth embodiment (wherein a second purging process is skipped, and a process of supplying a nitrogen-containing gas and a second modifying process are continuously performed). Similarly, DCS gas was used as a source gas and NH$_3$ gas was used as a nitrogen-containing gas. H$_2$ gas was used as a modifying gas during a first modifying process. N$_2$ gas was used as a modifying gas during the second modifying process. To obtain Samples 1 to 5, the temperature of the wafer (film-forming temperature) was sequentially set to 350° C., 400° C., 450° C., 500° C., and 550° C. The duration of a first purging process included in each cycle was set to four seconds.

Also, as a Comparative Example, Samples 6 to 10 were obtained by forming a SiN film on a wafer having a diameter of 300 mm in a process chamber by performing one cycle a predetermined number of times, according to a general film-forming sequence. The cycle included supplying DCS gas to the wafer, purging the process chamber, supplying plasma-excited NH$_3$ gas to the wafer in the process chamber, and purging the process chamber. To obtain Samples 6 to 10, the temperature of the wafer (film-forming temperature) was sequentially set to 350° C., 400° C., 450° C., 500° C., and 550° C.

Also, in Example 4, Samples 11 to 13 were obtained by forming a SiN film on a wafer having a diameter of 300 mm according to the same film-forming sequence as described with respect to the fifth embodiment (wherein a second purging process is skipped, and a process of supplying a nitrogen-containing gas and a second modifying process are continuously performed). Similarly, MCS gas was used as a source gas and NH$_3$ gas was used as a nitrogen-containing gas. H$_2$ gas was used as a modifying gas during a first modifying process. N$_2$ gas was used as a modifying gas during the second modifying process. To obtain Samples 11 to 13, the temperature of the wafer (film-forming temperature) was sequentially set to 400° C., 450° C., and 500° C. The duration of a first purging process included in each cycle was set to four seconds.

Also, as a Reference Example, Samples 14 to 16 were obtained by forming a SiN film on a wafer having a diameter of 300 mm in a process chamber by performing one cycle a predetermined number of times, according to a general film-forming sequence. The cycle includes supplying MCS gas to the wafer, purging the process chamber, supplying plasma-excited NH$_3$ gas to the wafer in the process chamber, and purging the process chamber. To obtain Samples 14 to 16, the temperature of the wafer (film-forming temperature) was sequentially set to 400° C., 450° C., and 500° C.

All of Samples 1 to 16 were obtained using a substrate processing apparatus with two plasma generation units, as illustrated in FIG. 3, and a source gas (DCS gas or MCS gas) was supplied into the process chamber according to the flash flow. The other process conditions were set to be substantially the same as those in the embodiments described above.

Then, WERs of the SiN films (Samples 1 to 16) were measured. When the SiN films were wet-etched, a liquid containing a hydrogen fluoride content of about 1% was used.

Figure 22B:
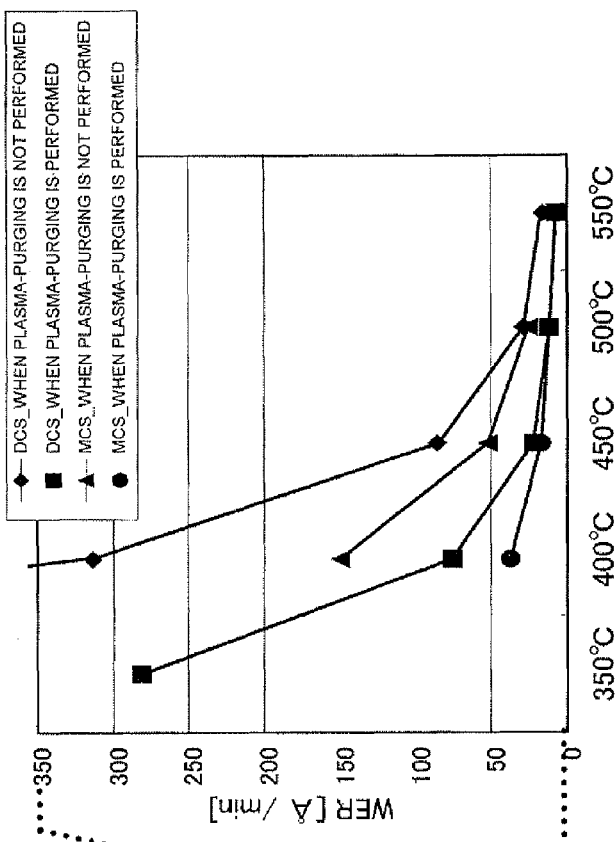
FIG. 22B is a partially enlarged view of the graph of FIG. 22A.
Figure 22A:
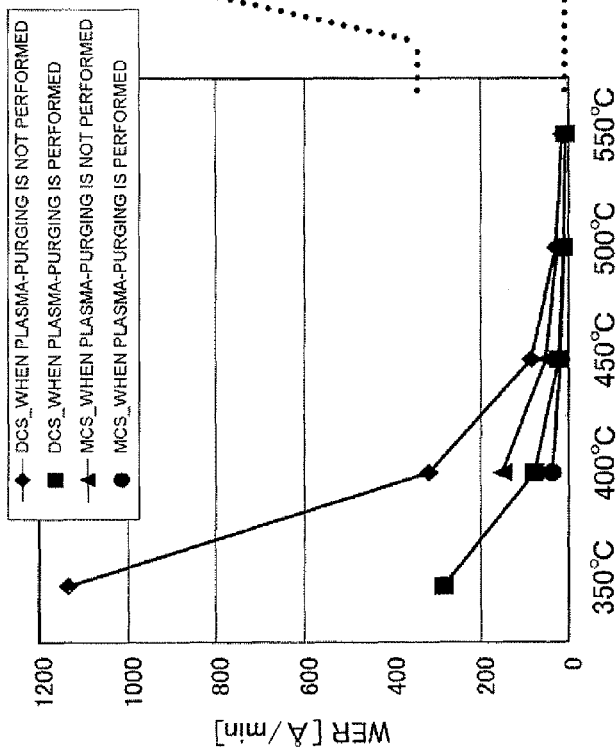
FIG. 22A is a graph illustrating the relationship between the WER of a SiN film and a film-forming temperature according to Example 4 of the present invention.

FIG. 22A is a graph illustrating the relationship between the WER of each SiN film and a film-forming temperature according to Example 4 of the present invention. In FIG. 22A, a horizontal axis denotes the film-forming temperature when each SiN film was formed, and a vertical axis denotes the WER (Å/min) of each SiN film. Here, 'WER' means an average of WERs in a plane of the wafer. In FIG. 22A, '■' sequentially denotes Samples 1 to 5 (Example 4) from the left, '□' sequentially denotes Samples 6 to 10 (Comparative Example) from the left, '●' sequentially denotes Samples 11 to 13 (Example 4) from the left, and '▲' sequentially denotes Samples 14 to 16 (Reference Example) from the left. FIG. 22B is a partially enlarged view of the graph of FIG. 22A, in which only a range of WERs that are less than or equal to 350 (Å/min) is shown.

Referring to FIGS. 22A and 22B, it could be seen that, at a low temperature of no more than 550° C., the SiN films (Samples 1 to 5) (Example 4) had low WERs and improved resistance to hydrogen fluoride, compared to the SiN films (Samples 6 to 10) (Comparative Example). This seems to be because excited species obtained by plasma-exciting $H_2$ gas or $N_2$ gas through the first or second modifying process cause impurities, such as hydrogen or chlorine, to be efficiently desorbed from a silicon-containing layer or a SiN layer, thereby improving the quality of the SiN films. Also, it was confirmed that the WERs, qualities, and thicknesses of the SiN films (Samples 1 to 5) (Example 4) in the plane of the wafer were uniformly improved.

Referring to FIGS. 22A and 22B, it could be seen that, at a low temperature of no more than 550° C., the SiN films (Samples 14 to 16) (Reference Example) had low WERs and improved resistance to hydrogen fluoride, compared to the SiN films (Samples 6 to 10) (Comparative Example). This seems to be because MCS gas having a lower chlorine content than DCS gas was used as a source gas, and thus the concentration of chlorine in the SiN films could be lowered, thereby improving the resistance of the SiN films to hydrogen fluoride.

Also, referring to FIGS. 22A and 22B, it could be seen that, at a low temperature of no more than 550° C., the SiN films (Samples 11 to 13) (Example 4) had lower WERs and more improved resistance to hydrogen fluoride than the SiN films (Samples 1 to 5) (Example 4). This seems to be because MCS gas having a lower chlorine content than DCS gas was used as a source gas, and because, in addition to the use of the MCS gas, active species (excited species) obtained by plasma-exciting $H_2$ gas or $N_2$ gas through the first and second modifying processes cause impurities, such as hydrogen or chlorine, to be efficiently desorbed from a silicon-containing layer or a SiN layer, thereby improving the quality of the SiN films. Also, it was confirmed that the WERs, i.e., qualities, and thicknesses of the SiN Films (Samples 11 to 13) (Example 4) in the plane of the wafer, were uniformly improved.

From the above results, it was concluded that the resistance of the SiN films to hydrogen fluoride (i.e., qualities of the SiN films) may be more improved using MCS gas as a source gas, and performing the modifying processes described above after the process of supplying the MCS gas and before the process of supplying the $NH_3$ gas and/or after the process of supplying $NH_3$ gas and before the process of supplying the MCS gas. Also, it could be seen that even if the durations of the modifying processes are shortened using the MCS gas as a source gas, a SiN film having a desirable quality may be formed, thereby greatly increasing the yield.

According to the present invention, a method of manufacturing a semiconductor device capable of forming a nitride film resistant to hydrogen fluoride at low temperatures, a method of processing a substrate, a substrate processing apparatus, and a non-transitory computer-readable recording medium can be provided.

<Exemplary Embodiments of the Present Invention>

Exemplary embodiments of the present invention are hereinafter added.

(Supplementary Note 1)

According to an embodiment of the present invention, there is provided a method of manufacturing a semiconductor device, the method including forming a nitride film on a substrate by performing a cycle a predetermined number of times, the cycle including:

(a) supplying a source gas to the substrate;

(b) supplying a plasma-excited hydrogen-containing gas to the substrate;

(c) supplying a plasma-excited or thermally excited nitriding gas to the substrate; and (d) supplying at least one of a plasma-excited nitrogen gas and a plasma-excited rare gas to the substrate.

(Supplementary Note 2)

In the method of Supplementary Note 1, the step (b) may be performed during one of a time period after the step (a) and a time period after the step (c), and the step (d) may be performed during one of the time period after the step (a) and the time period after the step (c) other than the time period where the step (b) is performed.

(Supplementary Note 3)

In the method of Supplementary Note 1, the step (b) may be performed during one of a time period after the step (a) where a supply of the plasma-excited or thermally excited nitriding gas is suspended and a time period after the step (c) where a supply of the source gas is suspended, and the step (d) may be performed during one of the time period after the step (a) where the supply of the plasma-excited or thermally excited nitriding gas is suspended and the time period after the step (e) where the supply of the source gas is suspended other than the time period where the step (b) is performed.

(Supplementary Note 4)

In the method of Supplementary Note 1, the step (b) may be performed during one of a time period after the step (a) and before the step (c) and a time period after the step (c) and before the step (a), and the step (d) may be performed during one of the time period after the step (a) and before the step (c) and the time period after the step (c) and before the step (a) other than the time period where the step (b) is performed.

(Supplementary Note 5)

In the method of Supplementary Note 1, the step (b) may be performed during a time period after the step (a), and the step (d) may be performed during a time period after the step (c).

(Supplementary Note 6)

In the method of Supplementary Note 1, wherein the step (a), the step (b), the step (c) and the step (d) in the cycle are performed in order, the step (a) may include forming a layer on the substrate, the step (b) may include performing a first modifying process to the layer, the step (c) may include changing the layer to which the first modifying process is performed into a nitride layer, and the step (d) may include performing a second modifying process to the nitride layer.

(Supplementary Note 7)

In the method of Supplementary Note 1, wherein the step (a), the step (d), the step (c) and the step (b) in the cycle are performed in order, the step (a) may include forming a layer on the substrate, the step (d) may include performing a first modifying process to the layer, the step (c) may include changing the layer to which the first modifying process is performed into a nitride layer, and the step (b) may include performing a second modifying process to the nitride layer.

(Supplementary Note 8)

In the method of Supplementary Note 1, wherein the step (a), the step (c), the step (b) and the step (d) in the cycle are performed in order, the step (a) may include forming a layer on the substrate, the step (c) may include changing the layer into a nitride layer, the step (b) may include performing a first modifying process to the nitride layer, and the step (d) may include performing a second modifying process to the nitride layer.

(Supplementary Note 9)

In the method of any one of Supplementary Notes 1 to 8, the steps (a) through (d) may be performed in a state where the substrate is accommodated in a process chamber, the method further including a first purging process for purging the process chamber after the step (a), and a second purging process for purging the process chamber after the step (c).

(Supplementary Note 10)

In the method of Supplementary Note 9, a duration of the first purging process may be set to be longer than a duration of the second purging process.

(Supplementary Note 11)

In the method of Supplementary Note 9, the second purging process may be skipped.

(Supplementary Note 12)

In the method of any one of Supplementary Notes 1 to 11, the step (b), the step (c) and the step (d) may be performed consecutively.

(Supplementary Note 13)

In the method of any one of Supplementary Notes 1 to 12, the steps (a) through (d) may be performed while the substrate is accommodated in a process chamber, and the step (b), the step (c) and the step (d) may be consecutively performed without purging the process chamber.

(Supplementary Note 14)

In the method of any one of Supplementary Notes 1 to 13, the step (c) may include supplying the plasma-excited nitriding gas to the substrate.

(Supplementary Note 15)

According to another embodiment of the present invention, there is provided a method of manufacturing a semiconductor device, the method including forming a nitride film on a substrate by performing a cycle a predetermined number of times, the cycle including:

(a) supplying a source gas to the substrate;

(b) supplying a plasma-excited hydrogen-containing gas to the substrate;

(c) supplying a plasma-excited nitriding gas to the substrate; and (d) supplying at least one of a plasma-excited nitrogen gas and a plasma-excited rare gas to the substrate.

(Supplementary Note 16)

In the method of any one of Supplementary Notes 1 to 15, the step (b) may include supplying the plasma-excited hydrogen-containing gas excited by a plurality of excitation units to the substrate through each of the plurality of the excitation units.

(Supplementary Note 17)

In the method of any one of Supplementary Notes 1 to 16, the step (d) may include supplying at least one of the plasma-excited nitrogen gas and the plasma-excited rare gas excited by a plurality of excitation units to the substrate through each of the plurality of the excitation units.

(Supplementary Note 18) In the method of any one of Supplementary Notes 1 to 17, the step (c) may include supplying the plasma-excited or thermally excited nitriding gas excited by a plurality of excitation units to the substrate through each of the plurality of the excitation units.

(Supplementary Note 19)

According to another embodiment of the present invention, there is provided a method of manufacturing a semiconductor device, the method including forming a nitride film on a substrate by performing a cycle a predetermined number of times, the cycle including:

(a) supplying a source gas to the substrate;

(b) respectively supplying a hydrogen-containing gas, which is plasma-excited by a plurality of excitation units, to the substrate by the plurality of the excitation units;

(c) respectively supplying a nitriding gas, which is plasma-excited by a plurality of excitation units, to the substrate by the plurality of the excitation units; and (d) respectively supplying at least one of nitrogen gas and a rare gas, which are plasma-excited by a plurality of excitation units, to the substrate by the plurality of the excitation units.

(Supplementary Note 20)

In the method of any one of Supplementary Notes 16 to 19, the plurality of the excitation units may be disposed to be linearly symmetrical with respect to a straight line connecting a center of the substrate and a center of an exhaust port configured to exhaust a gas supplied into the process chamber.

(Supplementary Note 21)

In the method of any one of Supplementary Notes 16 to 19, the plurality of the excitation units may be disposed to face one another via the center of the substrate.

(Supplementary Note 22)

In the method of any one of Supplementary Notes 16 to 19, two excitation units may be disposed such that lines connecting the plurality of the excitation units and an exhaust port configured to exhaust a gas supplied into the process chamber form an isosceles triangle.

(Supplementary Note 23)

In the method of any one of Supplementary Notes 1 to 22, during the forming of the nitride film, the substrate may be rotated.

(Supplementary Note 24)

In the method of any one of Supplementary Notes 1 to 23, during the forming of the nitride film, the temperature of the substrate may be set to fall within a range of 300° C. to 650° C.

(Supplementary Note 25)

In the method of any one of Supplementary Notes 1 to 24, during the forming of the nitride film, the temperature of the substrate may be set to fall within a range of 300° C. to 600° C.

(Supplementary Note 26)

In the method of any one of Supplementary Notes 1 to 25, the nitriding gas may include ammonia gas, the hydrogen-containing gas may include hydrogen gas, and the rare gas may include at least one of argon gas and helium gas.

(Supplementary Note 27)

In the method of any one of Supplementary Notes 1 to 26, the source gas may include a silane-based source gas.

(Supplementary Note 28)

In the method of any one of Supplementary Notes 1 to 21, the source gas may include a chlorosilane-based source gas.

(Supplementary Note 29)

In the method of any one of Supplementary Notes 1 to 22, the source gas may include at least one of dichlorosilane gas and monochlorosilane gas.

(Supplementary Note 30)

According to another embodiment of the present invention, there is provided a method of processing a substrate including forming a nitride film on a substrate by performing a cycle a predetermined number of times, the cycle including:

(a) supplying a source gas to the substrate;

(b) supplying a plasma-excited hydrogen-containing gas to the substrate;

(c) supplying a plasma-excited or thermally excited nitriding gas to the substrate; and (d) supplying at least one of a plasma-excited nitrogen gas and a plasma-excited rare gas to the substrate.

(Supplementary Note 31)

According to another embodiment of the present invention, there is provided a substrate processing apparatus including:

a process chamber configured to accommodate a substrate;

a first gas supply system configured to supply a source gas to the substrate in the process chamber;

a second gas supply system configured to supply a nitriding gas to the substrate in the process chamber;

a third gas supply system configured to supply a hydrogen-containing gas to the substrate in the process chamber;

a fourth gas supply system configured to supply at least one of nitrogen gas and a rare gas to the substrate in the process chamber;

an excitation unit configured to plasma-excite or thermally excite a gas; and a control unit configured to control the first through fourth gas supply systems and the excitation unit so as to form a nitride film on the substrate by performing a cycle a predetermined number of times, the cycle including:

(a) supplying the source gas to the substrate in the process chamber;

(b) supplying the plasma-excited hydrogen-containing gas to the substrate in the process chamber;

(c) supplying the plasma-excited or thermally excited nitriding gas to the substrate in the process chamber; and (d) supplying at least one of the plasma-excited nitrogen gas and the plasma-excited rare gas to the substrate in the process chamber.

(Supplementary Note 32)

According to another embodiment of the present invention, there is provided a program that causes a computer to perform a process of forming a nitride film on a substrate by performing a cycle a predetermined number of times, the cycle including:

(a) supplying a source gas to the substrate in a process chamber;

(b) supplying a plasma-excited hydrogen-containing gas to the substrate in the process chamber;

(c) supplying a plasma-excited or thermally excited nitriding gas to the substrate in the process chamber; and (d) supplying at least one of a plasma-excited nitrogen gas and a plasma-excited rare gas to the substrate in the process chamber.

(Supplementary Note 33)

According to another embodiment of the present invention, there is provided a non-transitory computer-readable recording medium storing a program that causes a computer to perform a process of forming a nitride film on a substrate by performing a cycle a predetermined number of times, the cycle including:

(a) supplying a source gas to the substrate in a process chamber;

(b) supplying a plasma-excited hydrogen-containing gas to the substrate in the process chamber;

(c) supplying a plasma-excited or thermally excited nitriding gas to the substrate in the process chamber; and (d) supplying at least one of a plasma-excited nitrogen gas and a plasma-excited rare gas to the substrate in the process chamber.

What is claimed is:

1. A method of manufacturing a semiconductor device, the method comprising forming a nitride film on a substrate by performing a cycle multiple times, the cycle including:

(a) supplying a source gas to the substrate;

(b) supplying a plasma-excited hydrogen-containing gas to the substrate;

(c) supplying a plasma-excited or thermally excited nitriding gas to the substrate; and (d) supplying at least one of a plasma-excited nitrogen gas and a plasma-excited rare gas to the substrate, wherein the step (b) is performed in one of a time period after the step (a) and a time period after the step (c), and the step (d) is performed in one of the time period after the step (a) and the time period after the step (c) other than the time period where the step (b) is performed.

2. The method of claim 1, wherein the step (b) is performed during one of a time period after the step (a) where a supply of the plasma-excited or thermally excited nitriding gas is suspended and a time period after the step (c) where a supply of the source gas is suspended, and the step (d) is performed during one of the time period after the step (a) where the supply of the plasma-excited or thermally excited nitriding gas is suspended and the time period after the step (c) where the supply of the source gas is suspended other than the time period where the step (b) is performed.

3. The method of claim 1, wherein the step (a), the step (b), the step (c) and the step (d) in each cycle are performed in order.

4. The method of claim 1, wherein the step (a), the step (b), the step (c) and the step (d) in the cycle are performed in order, the step (a) comprises forming a layer on the substrate, the step (b) comprises performing a first modifying process to the layer, the step (c) comprises changing the layer to which the first modifying process is performed into a nitride layer, and the step (d) comprises performing a second modifying process to the nitride layer.

5. The method of claim 1, wherein the steps (a) through (d) are performed in a state where the substrate is accommodated in a process chamber, and the step (b), the step (c) and the step (d) are consecutively performed without performing a vacuum exhaust of a process chamber between the step (b), the step (c) and the step (d) while gas supply is suspended.

6. The method of claim 1, wherein the steps (a) through (d) are performed in a state where the substrate is accommodated in a process chamber, and the step (b), the step (c) and the step (d) are consecutively performed without performing a gas replacement in the process chamber.

7. The method of claim 1, wherein the step (c) comprises supplying the plasma-excited nitriding gas to the substrate.

8. The method of claim 1, wherein the step (b) comprises supplying the plasma-excited hydrogen-containing gas excited by a plurality of excitation units to the substrate through each of the plurality of the excitation units.

9. The method of claim 1, wherein the step (d) comprises supplying at least one of the plasma-excited nitrogen gas and the plasma-excited rare gas excited by a plurality of excitation units to the substrate through each of the plurality of the excitation units.

10. The method of claim 1, wherein the step (c) comprises supplying the plasma-excited or thermally excited nitriding gas excited by a plurality of excitation units to the substrate through each of the plurality of the excitation units.

11. The method of claim 1, further comprising:
(e) purging a process chamber after performing the step (a); and
(f) purging the process chamber after performing the step (c),
wherein each of the steps (a) through (d) is performed while the substrate is accommodated in the process chamber.

12. The method of claim 11, wherein a purging time of the step (e) is longer than that of the step (f).

13. The method of claim 1,
wherein the steps (a) through (d) are performed in a state where the substrate is accommodated in a process chamber, and
the method further comprising:
(e) replacing a gas in a process chamber after the step (a),
wherein at least one of the steps (b) and (d) are performed continuously after performing the step (c) without replacing the gas in the process chamber.

14. The method of claim 1, wherein the plasma-excited rare gas is supplied to the substrate in the step (d).

15. The method of claim 1, wherein the plasma-excited rare gas is selected from a group consisting of plasma-excited Ar gas, plasma-excited He gas, plasma-excited Ne gas and plasma-excited Xe gas.

16. The method of claim 1, wherein the plasma-excited rare gas is selected from a group consisting of plasma-excited Ar gas and plasma-excited He gas.

17. The method of claim 1, wherein the steps (b), (c) and (d) are consecutively performed, and
wherein the step (c) is performed immediately after the step (b) is completed and the step (d) is performed immediately after the step (c) is completed.

18. A method of processing a substrate comprising forming a nitride film on a substrate by performing a cycle multiple times, the cycle including:
(a) supplying a source gas to the substrate;
(b) supplying a plasma-excited hydrogen-containing gas to the substrate;
(c) supplying a plasma-excited or thermally excited nitriding gas to the substrate; and
(d) supplying at least one of a plasma-excited nitrogen gas and a plasma-excited rare gas to the substrate,
wherein the step (b) is performed in one of a time period after the step (a) and a time period after the step (c), and the step (d) is performed in one of the time period after the step (a) and the time period after the step (c) other than the time period where the step (b) is performed.

19. A non-transitory computer-readable recording medium storing a program that causes a computer to perform a process of forming a nitride film on a substrate by performing a cycle multiple times, the cycle comprising:
(a) supplying a source gas to the substrate in a process chamber;
(b) supplying a plasma-excited hydrogen-containing gas to the substrate in the process chamber;
(c) supplying a plasma-excited or thermally excited nitriding gas to the substrate in the process chamber; and
(d) supplying at least one of a plasma-excited nitrogen gas and a plasma-excited rare gas to the substrate in the process chamber,
wherein the sequence (b) is performed in one of a time period after the sequence (a) and a time period after the sequence (c), and the sequence (d) is performed in one of the time period after the sequence (a) and the time period after the sequence (c) other than the time period where the sequence (b) is performed.

* * * * *